United States Patent [19]
Suzuki et al.

[11] Patent Number: 6,144,616
[45] Date of Patent: Nov. 7, 2000

[54] SEMICONDUCTOR MEMORY DEVICE

[75] Inventors: Takaaki Suzuki; Kotoku Sato, both of Kawasaki, Japan

[73] Assignee: Fujitsu Limited, Kawasaki, Japan

[21] Appl. No.: 09/429,472

[22] Filed: Oct. 29, 1999

[30] Foreign Application Priority Data

Oct. 30, 1998 [JP] Japan .................................. 10-311247
Jan. 8, 1999 [JP] Japan .................................. 11-003109

[51] Int. Cl.[7] ................................................. G11C 7/00
[52] U.S. Cl. ............... 365/233; 365/230.06; 365/230.08; 365/189.01; 365/189.05; 365/189.07
[58] Field of Search ........................ 365/189.01, 230.01, 365/230.06, 230.08, 189.05, 189.07

[56] References Cited

U.S. PATENT DOCUMENTS

| | | |
|---|---|---|
| 5,511,024 | 4/1996 | Ware et al. . |
| 5,749,086 | 5/1998 | Ryan ........................................ 711/105 |
| 5,912,847 | 6/1999 | Tamaki ................................ 365/189.05 |
| 5,917,760 | 6/1999 | Millar ........................................ 365/194 |
| 5,917,772 | 6/1999 | Pawlowski .......................... 365/230.06 |
| 5,966,343 | 10/1999 | Thurston ................................. 365/233 |

FOREIGN PATENT DOCUMENTS

| | | |
|---|---|---|
| 404140944A | 5/1992 | Japan . |
| 406309229A | 11/1994 | Japan . |
| 406076566A | 3/1999 | Japan . |

OTHER PUBLICATIONS

"Revolutionary SRAM Architecture and New ZBT (Zero Bus Turnaround) Product Family".
"128K×36 Bit Pipelined BurstRAM Synchronous Fast Static RAM",*Motorola Semiconductor Technical Data*, pp. 1–2.

*Primary Examiner*—Viet Q. Nguyen
*Attorney, Agent, or Firm*—Arent Fox Kintner Plotkin & Kahn, PLLC

[57] ABSTRACT

A semiconductor memory device operating in synchronism with a clock includes an address latch&comparator part latching a first address signal associated with a write command and comparing the first address signal with a second address signal associated with a read command. A write data buffer part holds a data signal associated with the write command. The data signal held in the write data buffer part is read as a data signal requested by the read command when the first and second address signals coincide with each other.

28 Claims, 32 Drawing Sheets

SEMICONDUCTOR MEMORY DEVICE

BACKGROUND OF THE INVENTION

1. Field of the Invention

The present invention generally relates to semiconductor memory devices, and more particularly to a semiconductor memory device which operates in synchronism with a clock supplied from the outside of the device.

2. Description of the Related Art

Nowadays, the CPUs operate at high speeds, and it is thus required that semiconductor devices such as DRAMs (Dynamic Random Access Memories) input and output data signals at increased bit rates in order to increase the data transmission rate. Examples of such memory devices are an SDRAM (Synchronous Dynamic Random Access Memory) and an FCRAM (Fast Cycle Random Access Memory), which memories operate in synchronism with an external clock and achieve high-speed operation.

A description will now be given of an operation of the FCRAM with reference to FIG. 1. It will be noted that the SDRAM has the same circuit configuration as shown in FIG. 1.

FIG. 1 shows a circuit configuration of the periphery of a memory cell of the FCRAM. The circuit shown in FIG. 1 includes a capacitor 501, NMOS (N-channel Metal Oxide Semiconductor) transistors 502–512, a PMOS (P-channel MOS) transistor 513, PMOS transistors 521 and 522, and NMOS transistors 523 and 524. The PMOS transistors 521 and 522 and the NMOS transistors 523 and 524 form a sense amplifier 520.

The capacitor 501 of the memory cell is capable of storing one-bit information. When a sub-word line selecting signal SW is enabled, the NMOS transistor 502 which serves as a cell gate is turned on, and the data stored in the capacitor 501 is read out to a bit line BL. At that time, a bit line transfer signal BLT1 is at a high level, and the NMOS transistors 503 and 504 are thus in the conducting states. On the other hand, a bit line transfer signal BLT0 is at a low level, and the NMOS transistors 505 and 506 are thus in the non-conducting states.

Thus, data on bit lines BL and /BL is read by the sense amplifier 520 via the NMOS transistors 503 and 504. The data sensed and held by the sense amplifier 520 is read out to a pair of data bus lines DB and /DB via the NMOS transistors 510 and 511 which serve as column gates, when a column line select signal CL is enabled.

A data write operation is implemented by the sequence reverse to that of the above-mentioned data read operation, so that data on the pair of data bus lines DB and /DB is stored in the capacitor 501.

FIG. 2 is a timing chart of the data read operation of the FCRAM having the circuit shown in FIG. 1. A description will now be given, with reference to FIGS. 1 and 2, of a data read timing in a case where the burst length of read data is equal to 4 (BL=4).

When an activation command (ACT) is applied to the FCRAM, the FCRAM internally generates a signal RASZ which instructs data stored in the memory cells 201 to be sensed by the sense amplifiers 220. Then, the FCRAM generates, at appropriate timings, word line select signals MW and SW, the bit line transfer signals BLT and sense amplifier drive signals SA1 and SA2. Thus, the data in the memory cells 201 appear on the bit lines BL and are then sensed and amplified by the sense amplifiers 220.

Further, the FCRAM generates an internal precharge signal PRE when a given time elapses after receiving the signal RASZ.

In response to receipt of a read command RD, the column line select signals CL of the columns selected by the column address become high, and the data held in the sense amplifiers 220 are read to the data bus lines DB and /DB. The data thus read are 4-bit parallel data, which are converted into serial data. The serial data is output to the outside of the FCRAM as read data DQ.

When the above data read operation is repeatedly performed with the burst length BL equal to 4, consecutive read data having no discontinuity is obtained as shown in FIG. 2 because the read cycle of the random access is short.

When the read operation or the write operation is repeatedly performed in the conventional FCRAM, data can be read or written efficiently. However, the read operation and the write operation are alternately performed, data cannot be read or written efficiently, as compared to the successive read or write operations.

The above problem will be described with reference to FIG. 3, which is a timing chart of a sequence in which the read and write operations are alternately performed.

When the read operation is performed as shown in part (A) of FIG. 3, it takes a certain time to obtain a read data output (Q) after the read command R is received. Generally, a read data latency is defined as the number of clock cycles which exist in the interval between the read command and the read data output. Similarly, a write data latency is defined as the number of clock cycles which exist in the interval between the write command and an associated write data input.

Conventionally, write data is simultaneously input together with the write command. Hence, the write data latency is equal to "0". Thus, as shown in part (A) of FIG. 3, the write command W subsequent to the preceding read command R is required to be input after the read data output Q resulting from the above preceding read command R is completed. Thus, the case shown in part (A) of FIG. 3 needs an interval equal to 9 clocks from the read command R to the write command W.

Further, as shown in part (A) of FIG. 3, the read command R following the write command W is required to be input after write data associated with the above write command W is completely stored in the memory cells. Thus, the case shown in part (A) of FIG. 3 needs an interval equal to 6 clocks from the write command W to the read command R.

It can be seen from the above description that the case shown in part (A) of FIG. 3 needs a read-write cycle equal to 15 clocks.

Next, a description will be described, with reference to part (B) of FIG. 3, of a case where the read data latency and the write data latency are equal to each other. In the case shown in part (B) of FIG. 3, it is possible to reduce the interval between the read command R and the write command W to the minimum tolerance time (tRC) between the read command R and the write command W defined in the general inter-bank formation. This is because the read data latency and the write data latency are equal to each other, and the inputting of write data associated with the write command W is executed after the outputting of read data associated with the read command R is completed.

However, in order to input the read command R after the write command W is inputted, it is necessary to store write data associated with the above write command are stored in the memory cells. Thus, the case shown in part (B) of FIG. 3 needs an interval of 12 clocks from the write command W to the read command R. Thus, in the case shown in part (B) of FIG. 3, the read-write cycle which is the interval between the read command R and the write command W is equal to 16 clocks.

As described above, the sequence of alternately performing the read operation and the write operation is not as efficient as the sequence of successively performing the read or write operations.

SUMMARY OF THE INVENTION

It is an object of the present invention to provide a semiconductor memory device in which the above disadvantages are eliminated.

A more specific object of the present invention is to provide a semiconductor memory device having a reduced read-write cycle while the read data latency and the write data latency are equal to each other.

The above objects of the present invention are achieved by a semiconductor memory device operating in synchronism with a clock, comprising: an address latch&comparator part latching a first address signal associated with a write command and comparing the first address signal with a second address signal associated with a read command; and a write data buffer part holding a data signal associated with the write command. The data signal held in the write data buffer part is read as a data signal requested by the read command when the first and second address signals coincide with each other.

The above objects of the present invention are also achieved by a semiconductor memory device operating in synchronism with a clock, comprising: an address latch&comparator part latching first address signals associated with write commands and comparing the first address signals with a second address signal associated with a read command; and a write data buffer part holding data signals respectively associated with the write commands. One of the data signals held in the write data buffer part is read as a data signal requested by the read command when the second address signal coincides with one of the first address signals.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of an outline of the present invention with reference to FIG. 4, which is a timing chart of a sequence of alternately executing the read and write operations.

Figure 4:
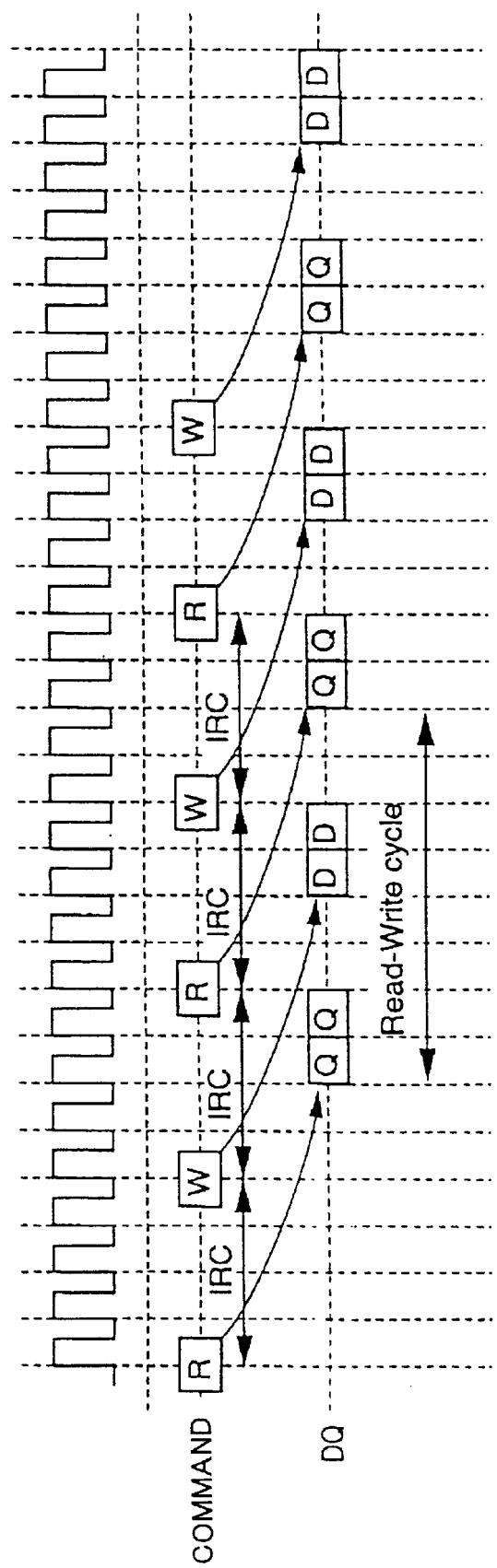
FIG. 4 is a timing chart of a sequence of alternately executing a read command and a write command according to the present invention.

In FIG. 4, the read data latency and the write data latency are equal to each other, and the interval between the read command R and the write command W is reduced to the minimum tolerance time (lRC) between the read command R and the write command W in the inter-bank formation. As has been described previously, the read command R is allowed to be input after the write data associated with the preceding write command W are completely written into the memory cells. The above is defined taking into consideration a case where the write data associated with the write command W is written into a bank and is immediately requested to be read from the above bank by the read command R which follows the write command W.

According to the present invention, a write data buffer is provided which holds write data associated with the write command W until the next write command W is supplied. Further, there is provided an address latch circuit which latches the address signal of the write data held in the write data buffer. The address latch circuit compares the address signal of the write command W with the address signal of the read command R. If both the address signals coincide with each other, the data is not read from the memory cells but from the write data buffer.

With the above configuration, it is possible to reduce the interval between the write command and the read command to the minimum tolerance time (lRC) between the read command R and the write command W in the inter-bank formation.

A description will now be given of a first embodiment of the present invention.

Figure 5:
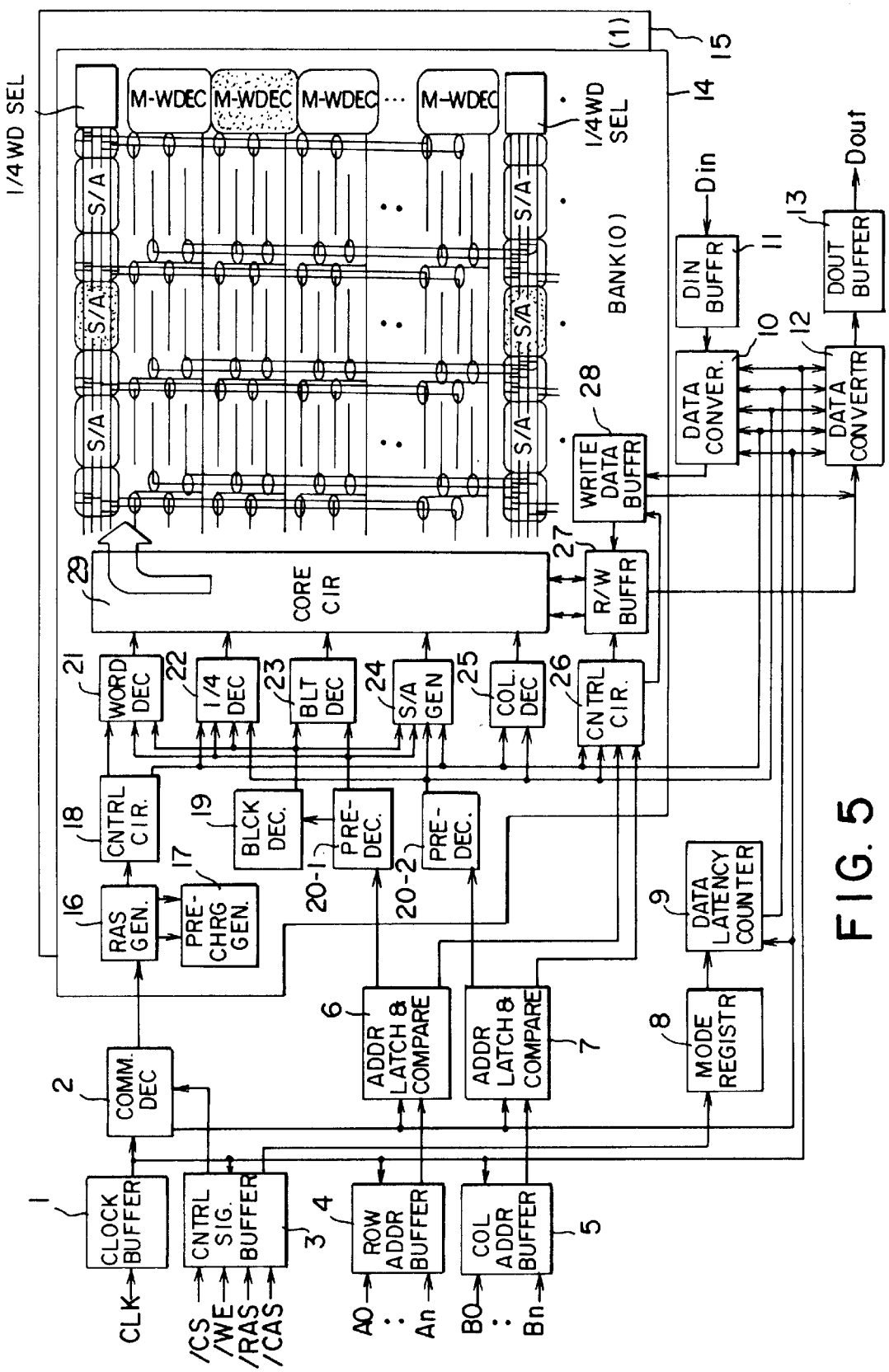
FIG. 5 is a block diagram of a semiconductor memory device according to a first embodiment of the present invention.

FIG. 5 is a block diagram of a semiconductor memory device according to an embodiment of the present invention. It is noted that the FCRAM has the same cell peripheral configuration as that of the SDRAM, and the following description is directed to the FCRAM.

The FCRAM according to the embodiment of the present invention includes a clock buffer 1, a command decoder 2, a control signal buffer 3, a row address buffer 4, a column address buffer 5, an address latch&comparators 6 and 7, a mode register 8, a data latency counter 9, data converters 10 and 12, a data input buffer 11, a data output buffer 13, a bank (0) circuit 14, and a bank (1) circuit 15.

Each of the bank (0) circuit 14 and the bank (1) circuit 15 includes a plurality of memory blocks, a RAS generating unit 16, a precharge signal (PRE) generating unit 17, a control unit 18, a block decoder 19, predecoders 20-1 and 20-2, a word decoder 21, a ¼ decoder 22, a bit line transfer (BLT) decoder 23, a sense amplifier drive signal (S/A) generating unit 24, a column decoder 25, a control circuit 26, a read/write buffer 27, a write data buffer 28 and a core circuit 29.

Figure 1:
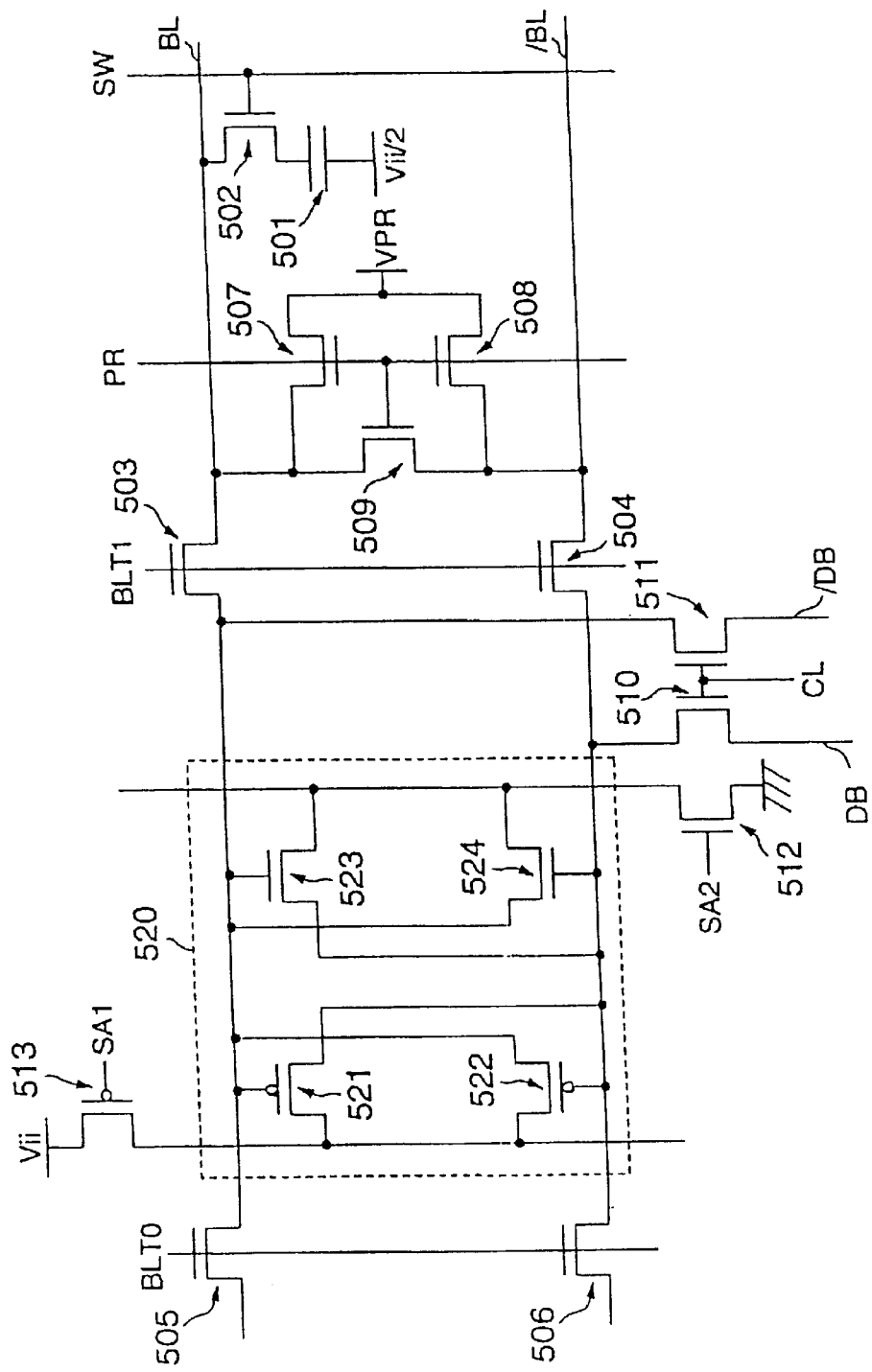
FIG. 1 is a circuit diagram of a memory cell and a peripheral configuration thereof of a conventional FCRAM.

The memory cells of the FCRAM shown in FIG. 5 have the DRAM-type cell structure, and the memory peripheral circuit thereof is the same as shown in FIG. 1. Although the FCRAM shown in FIG. 5 has two banks, it is not limited to two banks but may have an arbitrary number of banks.

The clock buffer 1 is supplied with a clock CLK from the outside of the FCRAM, and supplies the parts of the FCRAM with a synchronizing clock CLK. The control signal buffer 3 buffers a write enable signal /WE, a chip enable signal /CS, a row address strobe signal /RAS, and a column address strobe signal /CAS, these signals being supplied from the outside of the FCRAM. The symbol "/" denotes a active-low signal.

The command decoder 2 decodes the signals from the control signal buffer 3 and informs the bank(0) circuit 14, the bank (1) circuit 15, the address latch&comparators 6 and 7, and the data latency counter 9 of a decoded command. The command can be defined by, for example, the write enable signal, the chip enable signal /CS, the row address strobe signal /RAS, and the column address strobe signal /CAS. The row address buffer 4 and the column address buffer 5 are supplied with address signals A0–An and B0–Bn from the outside of the FCRAM, which address signals being sent to the address latch&comparators 6 and 7.

The address latch&comparators 6 and 7 operate in the different manners when the read and write commands are supplied. When the write command is supplied, the address latch&comparator 6 latches a row address signal supplied from the row address buffer 4, and writes data held in the write data buffer 28 into the core circuit 29 by utilizing the row address signal latched therein when the next write command is supplied.

When the read command is received, the address latch&comparator 6 compares the row address signal from the row address buffer 4 with the row address signal latched when the previous write command is received. When both the row address signals coincide with each other, the data latched in the write data buffer 28 is output as data requested by the read command.

The address latch&comparator 6 compares the row address signal from the row address buffer 4 with the row address signal latched at the time of receiving the previous write command. If both the row address signals do not coincide with each other, the address latch&comparator 6 supplies the row address signal associated with the presently supplied read command to the predecoder 20-1. Thus, data requested by the read command is read from the the core circuit 29.

The address latch&comparator 7 will now be described. When the write command is received, the address latch&comparator 7 latches the column address signal supplied from the column address buffer 5, and writes, when receiving the next write command, data held in the write data buffer 28 into the core circuit 29 by utilizing the column address signal latched.

When the read command is received, the address latch&comparator 7 compares the column address signal supplied from the column address buffer 5 with the column address signal latched when the previous write command is received. When both the command signals coincide with each other, the data latched in the write data buffer 28 is output as data requested by the read command. If both the address signals do not coincide with each other, the address latch&comparator 7 supplies the predecoder 20-2 with the column address signal latched when the previous write command is received. Thus, the data requested by the read command is read from the memory cells.

The mode register 8 outputs burst length information used inside the FCRAM. The data latency counter 9 measures the data latency based on the burst length information supplied from the mode register 8. The data converter 10 is supplied, from the outside of the FCRAM, with a data signal via the data input buffer 11, and converts the data signal in serial formation into a data signal in parallel formation. The serial data signal is then supplied to the write data buffer 28. The data converter 12 is supplied with data in parallel formation from the read/write buffer 27 or the write data buffer 28, and converts the data into data in serial formation. The serial data thus obtained is output to the outside of the FCRAM via the data output buffer 13. The data converters 10 and 12 operate at appropriate timings based on the data latency information output by the data latency counter 9.

The data input buffer 11 and the data output buffer 13 are connected via respective terminal pins to respective buses which are separate from each other (I/O separate formation). As will be described later, the data input buffer 11 and the data output buffer 13 may be connected to a common data bus (I/O common formation).

A description will be given of the banks selected by the address signals buffered by the row address buffer 4 and the column address buffer 5. The following description is directed only to the bank (0) circuit 14 and a description of the bank (1) circuit 15 is omitted.

In the bank (0) circuit 14, the RAS generating unit 16 generates the signal RASZ, which instructs data in the memory cells in the memory blocks to be read out to the sense amplifiers. The PRE generating unit 17 generates a precharge signal PRE when a predetermined time elapses after the signal RASZ functioning as an inner row address strobe signal RAS. The precharge signal PRE resets the RAS generating unit 16 and causes it to perform the precharge operation as in the case where the precharge signal PRE is externally supplied. The precharge operation performed by the precharge signal PRE generated in the PRE generating unit 17 is a self-precharge.

The predecoder 20-1 predecodes the row address signal supplied from the address latch&comparator 6. The result of predecoding is supplied to the block decoder 19, the word decoder 21, the ¼ decoder 22, the BLT decoder 23 and the S/A generating unit 24.

The block decoder 19 selects one of the plurality of memory blocks arranged in the FCRAM. Only in the selected memory block, the word decoder 21, the ¼ decoder 22, the BLT decoder 23 and the S/A generating unit 24 operate. Thus, data is read from the core circuit 29 and is supplied to the sense amplifiers.

The core circuit 29 includes an array of memory cells arranged in rows and columns, each of the memory cells being the same as the memory cell 501 shown in FIG. 1. The sense amplifiers are provided to the respective columns, each of the sense amplifiers being the same as the sense amplifier 520 shown in FIG. 1. By the read operation by the row address signal, data stored in the memory cells connected to the word line selected by the row address signal are stored in the sense amplifiers 520.

The predecoder 20-2 predecodes the column address signal supplied from the address latch&comparator 7. The result of predecoding is supplied to the column decoder 25, the ¼ decoder 22, the S/A generating unit 24 and the control circuit 26. The column decoder 25 supplies the column line select signal CL to the column specified by the column address signal. Data is read from the sense amplifier 520 located in the selected column and is supplied to the read/write buffer 27.

The word decoder 21 generates a word line select signal under the control of the control unit 18. The ¼ decoder 22 selects one of four sub-word decoders which belong to a selected main word decoder in the conventional hierarchical word decode fashion. The BLT decoder 23 generates a bit line transfer signal under the control of the control unit 18. The S/A generating unit 24 generates sense amplifier drive signals SA1 and SA2 under the control of the control unit 18.

The control circuit 26 controls the read/write buffer 27 and the write data buffer 28 on the basis of the signals supplied from the address latch&comparators 6 and 7. When the write command is received, the control unit 26 supplies, via the read/write buffer 27, the core circuit 29 with the data stored in the write data buffer 28 when the previous write command is received. The write data buffer 28 holds the data supplied from the data converter 10 by the write command presently supplied.

When the read command is received, the control unit 26 is supplied, from the address latch&comparators 6 and 7, with a signal indicating whether the row address signal and column address signal supplied at the time of receiving the previous write command coincide with the row address signal and column address signal supplied at the time of receiving the present write command. When the above signal indicates an address coincidence, the control unit 26 reads the data held in the write data buffer 28, and supplies the data to the data converter 12. When the above signal indicates an address discordance, the control unit 26 causes the read/write buffer 27 to be involved in the normal read process. More particularly, the control unit 26 reads the data from the sense amplifier 520 and supplies the read data to the read/write buffer 27. Then, the read data is supplied to the data converter 12.

The above-mentioned address latch&comparators 6 and 7, control unit 26, read/write buffer 27, and write data buffer 28 contribute to reducing the interval between the write command and the read command to the minimum tolerance time (lRC) between the read command and the write command in the inter-bank formation.

Figure 6:
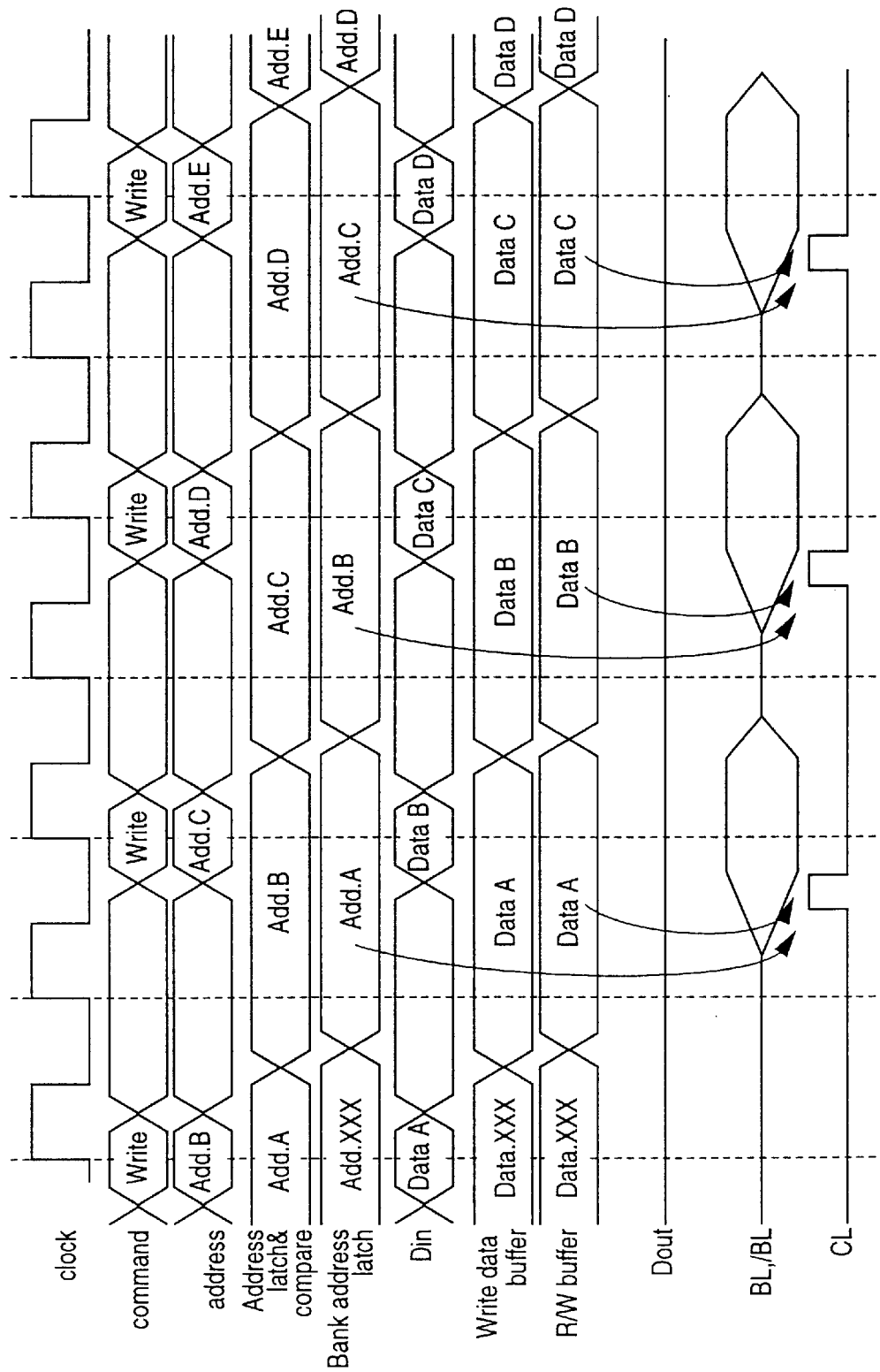
FIG. 6 is a timing chart of successively executing write commands in the semiconductor memory device shown in FIG. 5.

A description will now be given, with reference to FIG. 6, of an operation of the FCRAM according to the first embodiment of the present invention. FIG. 6 is a timing chart of a sequence in which write operations are successively performed. The clock cycle is twice the clock cycle shown in FIG. 4 and the read data latency and the write data latency are equal to each other.

When the write command is applied to the command decoder 2 and the address signal B is applied to the row address buffer 4 and the column address buffer 5, the address latch&comparators 6 and 7 supply the address signal A latched when receiving the previous write command to the predecoders 20-1 and 20-2 included in the bank (0) circuit 14, and further latch the address signal B associated with the present write command.

The predecoders 20-1 and 20-2 respectively supplied from the address signal A from the address latch&comparators 6 and 7 predecode the address signal A, and supplies the predecoded address signal to the block decoder 19, the word decoder 21, the ¼ decoder 22, the BLT decoder 23, the S/A generating unit 24 and the column decoder 25. The data A in the data input buffer 11 associated with the write command is supplied to the write data buffer 28 via the data converter 10, and is then supplied to the read/write buffer 27 from the write data buffer 28.

When the column line select signal CL is enabled based on the predecoded address signal A, the data A held in the read/write buffer 27 is memorized in the capacitor 501 via the bit lines BL and /BL. The write operations can successively be performed by repeating the above-mentioned sequence.

Figure 7:
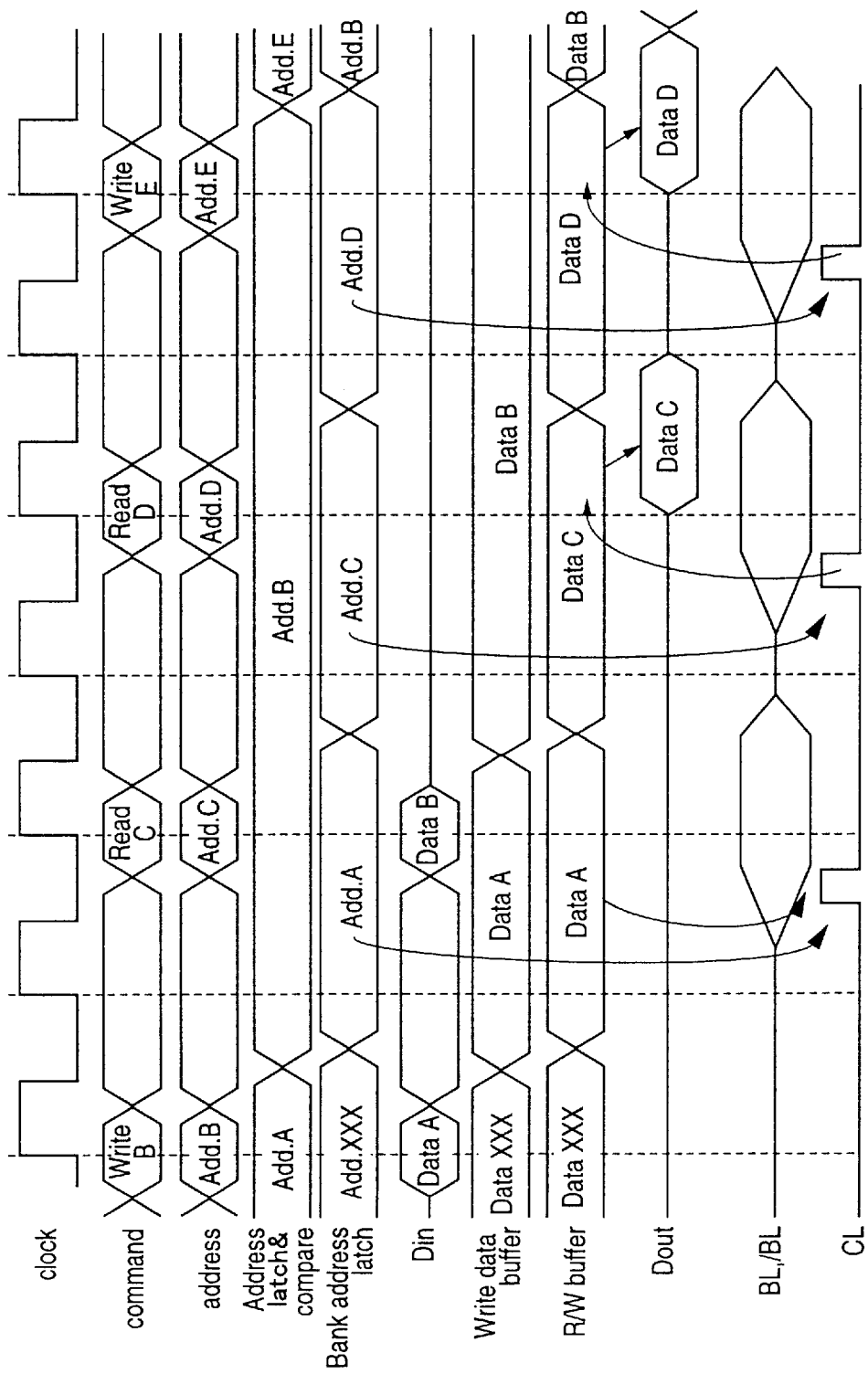
FIG. 7 is a timing chart of a sequence of successively executing write, read, read and write commands in this order in the semiconductor memory device shown in FIG. 5.

FIG. 7 is a timing chart of a sequence in which write, read, read and write operations are successively performed in this order in the FCRAM.

The cycle of the clock CLK is twice that of the clock shown in FIG. 4, and the read data latency and the write data latency are equal to each other. The write and read commands shown in FIG. 7 address the same bank.

When the write command B is applied to the command decoder 2 and the address signal B is applied to the row address buffer 4 and the column address buffer 5, the address latch&comparators 6 and 7 supplies the predecoders 20-1 and 20-2 included in the bank (0) circuit 14 with the address signal A latched when the previous write command is supplied, and latch the address signal B associated with the present write command.

The predecoders 20-1 and 20-2 respectively supplied with the address signal A from the address latch&comparators 6 and 7 predecode the address signal A and supplies the predecoded address signal to the block decoder 19, the word decoder 21, the ¼ decoder 22, the BLT decoder 23, the S/A generating unit 24 and the column decoder 25. The data A input to the data input buffer 11 associated with the write command is supplied to the write data buffer 28 via the data converter 10, and is supplied to the read/write buffer 27 from the write data buffer 28.

When the column line select signal CL is selected based on the predecoded address signal A, the data A held in the read/write buffer 27 is memorized in the capacitor 501 via the bit lines BL and /BL.

After two clocks from the write command B, the read command C is supplied to the command decoder 2, and the address signal C is supplied to the row address buffer 4 and the column address buffer 5. Then, the address latch&comparators 6 and 7 compare the address signal latched associated with the previous write command with those latched associated with the present write command.

The result of the above comparing process shows that the address signal B does not coincide with the address signal C, the address latch&comparators 6 and 7 supply the address signal C associated with the present read command C to the predecoders 20-1 and 20-2. When the read command addressed to the same bank as the previous read command is applied to the command decoder 2, the address latch&comparators 6 and 7 latch the address signal latched when the previous write command is supplied.

The predecoders 20-1 and 20-2 respectively supplied with the address signal C from the address latch&comparators 6 and 7 predecode the address signal C and supply the predecoded address signal to the block decoder 19, the word decoder 21, the ¼ decoder 22, the BTL decoder 23, the S/A generating unit 24 and the column decoder 25. The data input to the data input buffer 11 associated with the write command is supplied to the write data buffer 28 via the data converter 10.

Next, when the column line select signal CL is selected based on the predecoded address signal C, the data stored in the capacitor 501 is read onto the bit lines BL and /BL, and is output to the data bus lines DB and /DB via the NMOS transistors 510 and 511 that function as column gates. The data read onto the data bus lines DB and /DB is output to the data output buffer 13 via the data converter 12. The write data buffer 28 holds the data B supplied by the previous write command without any change.

After two clocks subsequent to the read command C, the read command D is applied to the command decoder 2 and the address signal D is applied to the row address buffer 4 and the column address buffer 5. The address latch&comparators 6 and 7 compare the address signal B latched when the previous write command B is supplied with the address signal D supplied when the present command is supplied.

The comparison result shows that the address signal B and the address signal D do not coincide with each other. Thus, the address signal D supplied when the present read command is applied is supplied to the predecoders 20-1 and 20-2 included in the bank (0) circuit 14. When the command decoder 2 is supplied with the read command directed to the same bank as the previous write command, the address latch&comparators 6 and 7 continue to latch the address signal supplied when the previous write command is supplied.

The predecoders 20-1 and 20-2 supplied with the address signal D from the address latch&comparators 6 and 7 predecode the above address signal D, and supplies the predecoded address signal D to the block decoder 19, the word decoder 21, the ¼ decoder 22, the BLT decoder 23, the S/A generating unit 24 and the column decoder 25.

When the column line select signal CL is enabled based on the predecoded address signal D, the data stored in the capacitor 501 is read to the bit lines BL and /BL, and is then read to the data bus lines DB and /DB via the NMOS transistors 510 and 511, which function as the column gates. Then, the data D read to the data bus lines DB and /DB is supplied to the read/write buffer 27, and is output to the outside of the FCRAM via the data converter 12.

After two clocks subsequent to the read command D, the write command E is applied to the command decoder 2, and the address signal E is supplied to the row address buffer 4 and the column address buffer 5. Then, the address latch&comparators 6 and 7 supply the address signal B latched when the previous write command is supplied to the predecoders 20-1 and 20-2 included in the bank (0) circuit 14, and latch the address signal E associated with the present write command.

The predecoders 20-1 and 20-2 supplied with the address signal B from the address latch&comparators 6 and 7 predecode the address signal B, and supply the predecoded address signal to the block decoder 19, the word decoder 21, the ¼ decoder 22, the BLT decoder 23, the S/A generating unit 24, and the column decoder 25. When the column line select signal CL is enabled based on the predecoded address signal B, the data B held in the read/write buffer 27 is memorized in the capacitor 501 via the bit lines BL and /BL.

The above description given with reference to FIG. 7 is directed to the sequence of successively receiving the write, read, read and write commands in this order, and does not include a case where a write command is supplied and a read command directed to a bank different from the bank addressed by the above write command is supplied.

A description will now be given, with reference to FIG. 8, of a sequence of receiving a write command and then a read command directed to a bank different from that addressed by the write command.

Figure 8:
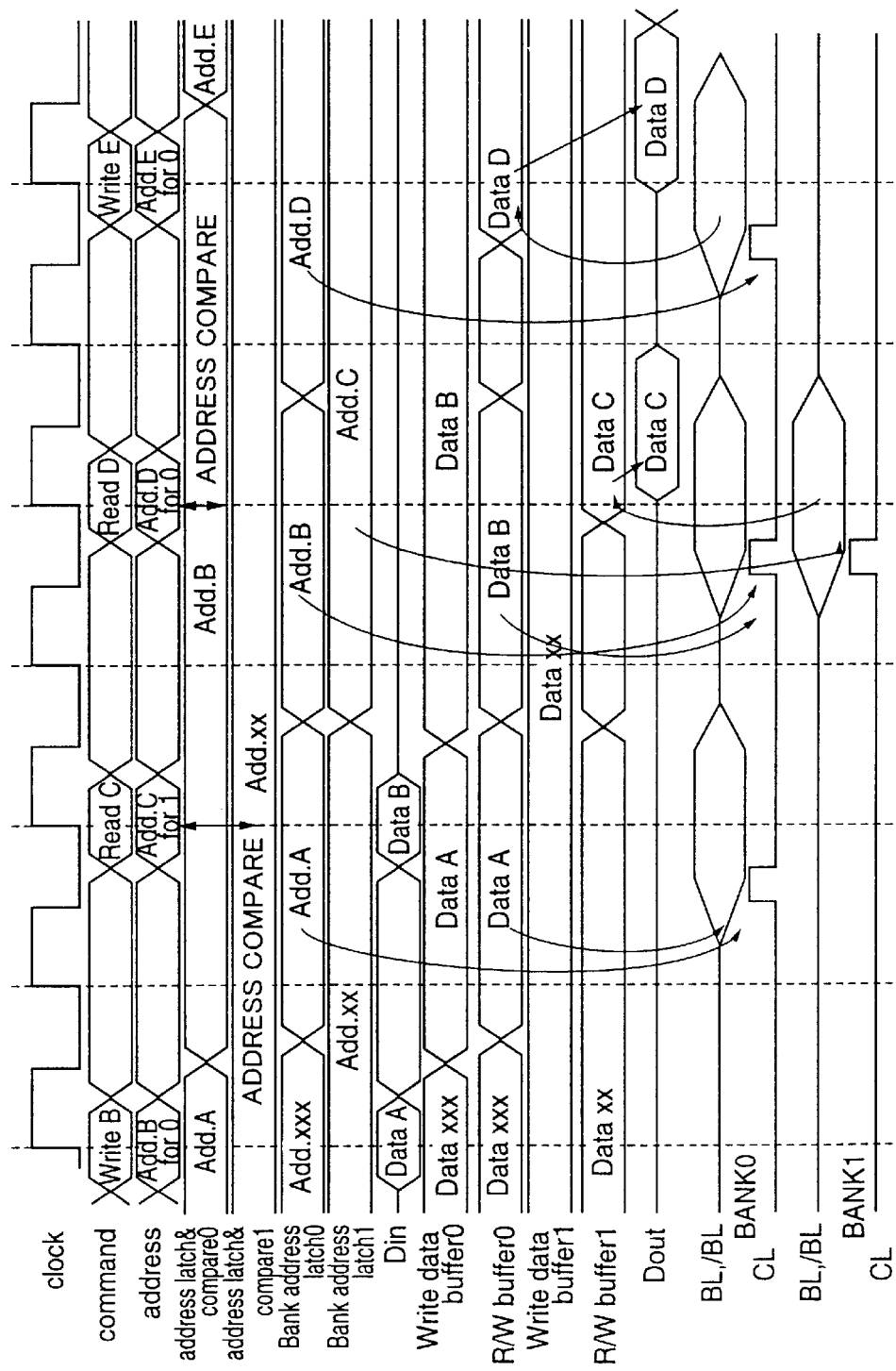
FIG. 8 is a timing chart of another sequence of successively executing write, read, read and write commands in this order in the semiconductor memory device shown in FIG. 5.

FIG. 8 is a timing chart of a sequence of successively receiving write, read, read and write commands in this order. In FIG. 8, the cycle of the clock is twice that of the clock shown in FIG. 4, and the read data latency and the write data latency are the same as each other.

In FIG. 8, a symbol "Add.B for 0" denotes an address signal B directed to the bank(0) circuit 14. Further, the numeral added to the end of the name of each structural part denotes which one of the bank (0) circuit 14 and the bank (1) circuit 15 includes the corresponding structural part. For instance, "R/W buffer0" denotes the read/write buffer included in the bank (0) circuit 14.

When the command decoder 2 is supplied with the write command B and the row address buffer 4 and the column address buffer 5 are supplied with the address signal B directed to the bank (0) circuit 14, the address latch&comparators 6 and 7 supply the address signal A latched when the previous write command is supplied to the predecoders 20-1 and 20-2 included in the bank (0) circuit 14, and latch the address signal B associated with the present write command.

The predecoders 20-1 and 20-2 included in the bank (0) circuit 14 supplied with the address signal A from the address latch&comparators 6 and 7 predecode the address signal A and supply the predecoded address signal A to the block decoder 19, the word decoder 21, the ¼ decoder 22, the BLT decoder 23, the S/A generating unit 24, and the column decoder 25. The data A associated with the write command and supplied to the data input buffer 11 is supplied to the write data buffer 28 included in the bank (0) circuit 14 via the data converter 10, and is then supplied to the read/write buffer 27 from the write data buffer 28.

When the column line select signal CL is enabled based on the predecoded address signal A, the data A held in the read/write buffer 27 is stored in the capacitor 501 via the bit lines BL and /BL. The data B associated with the write command and written into the data input buffer 11 is written into the write data buffer 28 included in the bank (0) circuit 14 via the data converter 10.

After two clocks following the write command B, the read command C is applied to the command decoder 2 and the address signal C addressed to the bank (1) circuit 15 is applied to the row address buffer 4 and the column address buffer 5. Then, the address latch&comparators 6 and 7 involved in the bank (1) circuit 15 compare the address signal xx latched when the previous write command is received with the address signal C supplied together with the present read command C.

The result of the above comparison shows the address signal xx differs from the address signal C. Thus, the address latch&comparators 6 and 7 supply the address signal C supplied when the present read command C is supplied to the predecoders 20-1 and 20-2 included in the bank (1) circuit 15. The address latch&comparators 6 and 7 involved in the bank (0) circuit 14 supply the address signal B latched to the predecoders 20-1 and 20-2 included in the circuit 14.

The predecoders 20-1 and 20-2 included in the bank (0) circuit 14 supplied with the address signal B from the address latch&comparators 6 and 7 predecode the received address signal B, and supply the predecoded address signal B to the block decoder 19, the word decoder 21, the ¼ decoder 22, the BLT decoder 23, S/A generating unit 24, and the column decoder 25. When the column line select signal CL with respect to the bank (0) circuit 14 is enabled based on the predecoded address signal B, the data B held in the read/write buffer 27 included in the band (0) circuit 14 is stored in the capacitor 501 via the bit lines BL and /BL.

The predecoders 20-1 and 20-2 included in the bank (1) circuit 15 and supplied with the address signal C from the address latch&comparators 6 and 7 predecode the address signal C, and supply the predecoded address signal C to the block decoder 19, the word decoder 21, the ¼ decoder 22, the BLT decoder 23, the S/A generating unit 24, and the column decoder 25.

When the column line select signal CL with respect to the bank (1) circuit 15 is enabled based on the predecoded address signal C, the data stored in the capacitor 501 is read to the bit lines BL and /BL, and is then read to the data bus lines DB and /DB vai the NMOS transistors 510 and 511, which function as the column gates. The data C read to the data bus lines DB and /DB is supplied to the read/write buffer 27 included in the band (1) circuit 15, and is then output to the outside of the FCRAM via the data converter 12. The following operation is the same as the operation that has been described, and a description thereof will be omitted.

The operations shown in FIGS. 7 and 8 show the sequences of successively receiving the write, read, read write commands in this order. However, the above operations do not include a sequence in which a write command W directed to a bank is received and data written by the write command W is read by a read command R directed to the same bank.

A description will now be given, with reference to FIG. 9, of the above sequence in which a write command W directed to a bank is received and data written by the write command W is read by a read command R directed to the same bank.

Figure 9:
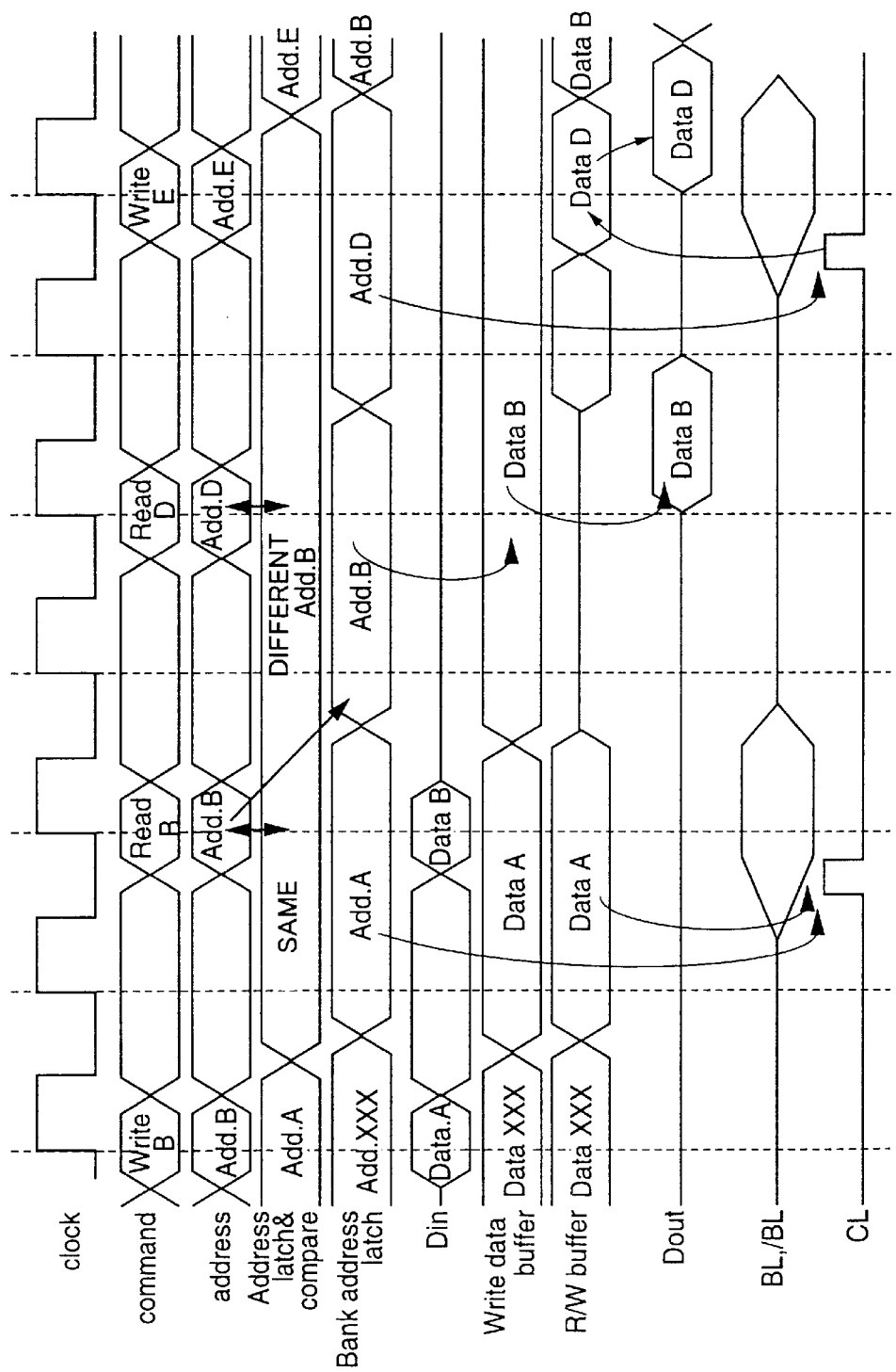
FIG. 9 is a timing chart of yet another sequence of successively executing write, read, read and write commands in this order in the semiconductor memory device shown in FIG. 5.

FIG. 9 shows a case where the write, read, read and write commands are successively supplied in this order. In FIG. 9, the clock cycle is twice the clock cycle shown in FIG. 4, and the read data latency and the write data latency are equal to each other.

The write command B is applied to the command decoder 2 and the address signal B is applied to the row address buffer 4 and the column address buffer 5. Then, the address latch&comparators 6 and 7 supply the predecoders 20-1 and 20-2 included in the bank (0) circuit 14 with the address signal A latched when the previous write command is received, and latch the address signal B associated with the present write command.

The predecoders 20-1 and 20-2 supplied with the address signal A from the address latch&comparators 6 and 7 predecode the address signal A and supply the predecoded address signal A to the block decoder 19, the word decoder 21, the ¼ decoder 22, the BLT decoder 23, the S/A generating unit 24, and the column decoder 25. The data A input to the data input buffer 11 associated with the write command is supplied to the write data buffer 28 via the data converter 10, and is then supplied to the read/write buffer 27 from the write data buffer 28.

When the column line select signal CL is enabled based on the predecoded address signal A, the data A held in the read/write buffer 27 is stored in the capacitor 501 via the bit lines BL and /BL.

After two clocks following the write command B, the read command C is applied to the command decoder 2, and the address signal B is applied to the row address buffer 4 and the column address buffer 5. Then, the address latch&comparators 6 and 7 compare the address signal B latched when the previous write command is received with the address signal B associated with the present read command.

The address signal B latched when the previous write command B is received is the same as the address signal B associated with the present read command C. Thus, a signal indicating that both the addresses are the same is supplied to the control unit 26 included in the ban (0) circuit 14. The control unit 26 outputs the data B held in the write data buffer 28 when the previous write command B is received to the outside of the FCRAM via the data converter 12 and the data output buffer 13. When the command decoder 2 is supplied with the read command addressed to the same bank as that addressed by the previous write command, the address latch&comparators 6 and 7 continue to latch the address signal latched when the previous write command is supplied. The write data buffer 28 continues to hold the data B supplied by the previous write command.

After two clocks subsequent to the read command C, the read command D is applied to the command decoder 2, and the address signal D is supplied to the row address buffer 4 and the column address buffer 5. Then, the address latch&comparators 6 and 7 compare the address signal B latched when the previous write command B is received with the address signal D supplied by the present read command D.

The address latch&comparators 6 and 7 recognizes that the address signal B differs from the address signal D, and thus supply the address signal D supplied when the present read command D is received to the predecoders 20-1 and 20-2 included in the bank (0) circuit 14. When the command decoder 2 is supplied with the read command addressed to the same bank as that addressed by the previous write command, the address latch&comparators 6 and 7 continue to latch the address signal latched when the previous write command is received.

The predecoders 20-1 and 20-2 supplied with the address signal D from the address latch&comparators 6 and 7 predecode the address signal D, and supply the predecoded address signal to the block decoder 19, the word decoder 21, the ¼ decoder 22, the BLT decoder 23, the S/A generating unit 24 and the column decoder 25.

When the column line select signal CL is enabled based on the predecoded address signal D, the data stored in the capacitor 501 is read to the bit lines BL and /BL, and is then read to the data bus lines DB and /DB via the NMOS transistors 510 and 511, which function as the column gates. Then, the data D read to the data bus lines DB and /DB is supplied to the read/write buffer 27 and is then output from the data output buffer 13 to the outside of the FCRAM via the data converter 12.

After two clocks subsequent to the read command D, the write command E is supplied to the command decoder 2 and the address signal E is supplied to the row address buffer 4 and the column address buffer 5. Then, the address latch&comparators 6 and 7 supply the address signal B latched when the previous write command is received to the predecoders 20-1 and 20-2 included in the bank (0) circuit 14, and latch the address signal E associated with the present write command.

The predecoders 20-1 and 20-2 supplied with the address signal B from the address latch&comparators 6 and 7 predecode the address signal B, and supply the predecoded address signal B to the block decoder 19, the word decoder 21, the ¼ decoder 22, the BLT decoder 23, the S/A generating unit 24 and the column decoder 25. When the column line select signal CL is enabled based on the predecoded address signal B, the data B held in the read/write buffer 27 is stored in the capacitor 501 via the bit lines BL and /BL.

The above description is directed to the case where, when the write data written by the write command W is read by the subsequent read command R within the same bank, data is not read from the memory cells of the core circuit 29 but is read from the write data buffer 28. Thus, it is possible to start the read command R before the process of writing data into the memory cells by the write command W is completed and to thus reduce the read-write cycle.

Figure 10:
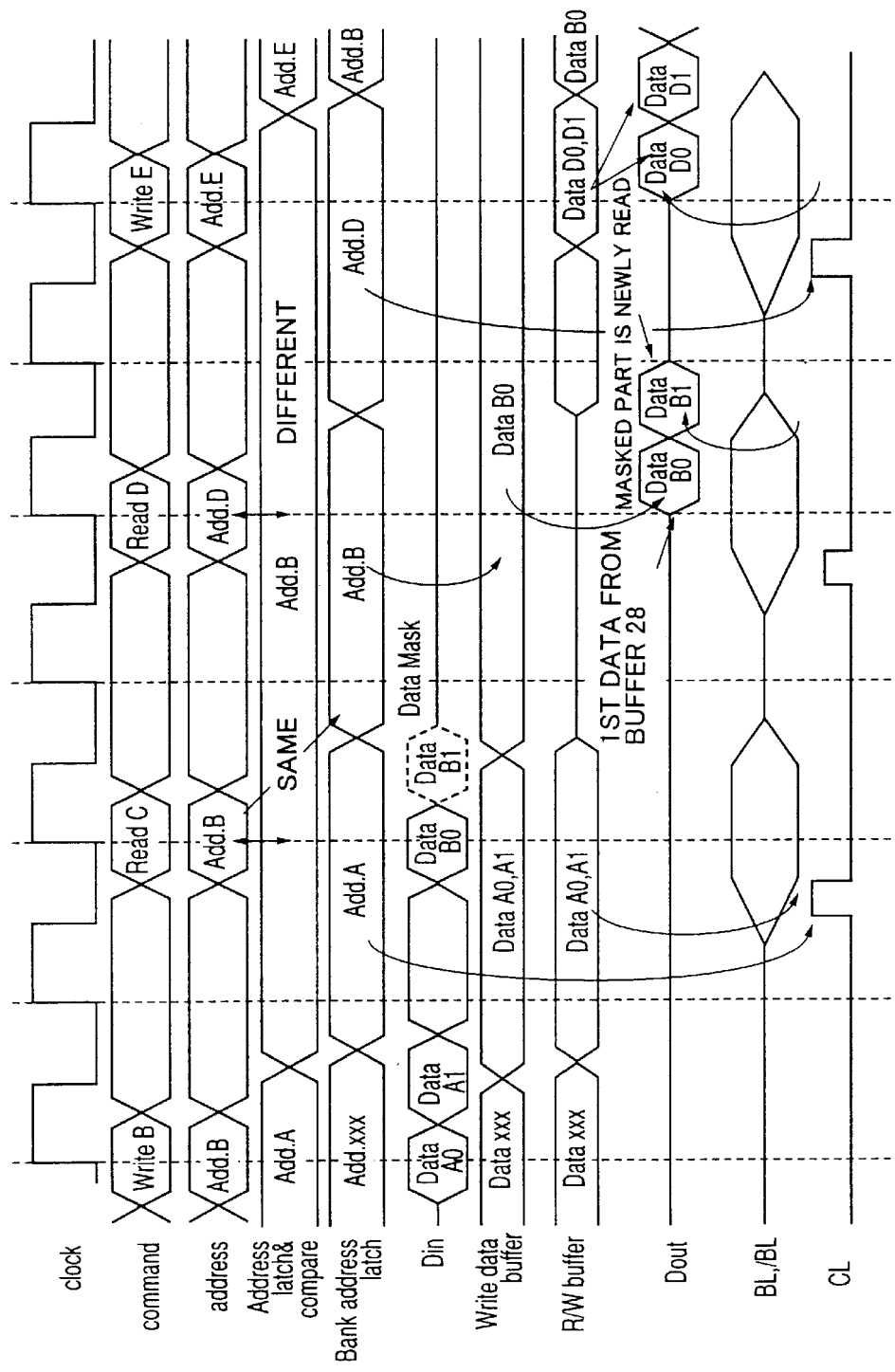
FIG. 10 is a timing chart of a sequence of successively executing write (write mask), read, read, and write commands in this order in the semiconductor memory device shown in FIG. 5.

A description will be given, with reference to FIG. 10, of a sequence in which a write mask function is applied to the write command W. FIG. 10 shows a sequence of successively receiving write (to be masked), read, read and write commands in this sequence. The clock cycle shown in FIG. 10 is twice that shown in FIG. 4, and the read data latency and the write data latency are equal to each other.

The write mask function masks part of write data, so that the masked data part is prevented from being written. In the following description, a read mask function is not included.

The command decoder 2 is supplied with the write command B, and the row address buffer 4 and the column address buffer 5 are supplied with the address signal B. Then, the address latch&comparators 6 and 7 supply the predecoders 20-1 and 20-2 included in the bank (0) circuit 14 with the address signal A latched when the previous write command is received, and latch the address signal B associated with the present write command.

The predecoders 20-1 and 20-2 supplied with the address signal A from the address latch&comparators 6 and 7 predecode the address signal A, and supply the predecoded address signal A to the block decoder 19, the word decoder 21, the ¼ decoder 22, the BLT decoder 23, the S/A generating unit 24, and the column decoder 25. Data A0 and A1 associated with the write command and applied to the data input buffer 11 are supplied to the write data buffer 28 via the data converter 10, and is then supplied to the read/write buffer 27 from the write data buffer 28.

When the column line select signal CL is enabled based on the predecoded address signal A, the data A0 and A1 held in the read/write buffer 27 are stored in the capacitors 501 via the bit lines BL and /BL.

After two clocks subsequent to the write command B, the read command is applied to the command decoder 2 and the address signal B is applied to the row address buffer 4 and the column address buffer 5. Then, the address latch&comparators 6 and 7 compare the address signal latched when the previous write command B is received with the address signal B associated with the present read command C.

The result of the comparison shows that the address signal B latched when the previous write command B is received coincides with the address signal B associated with the present read command C. Thus, the signal which indicates the address coincidence is supplied to the control unit 26 included in the bank (0) circuit 14. The control unit 26 outputs the data B0 supplied by the previous write command B and held in the write data buffer 28 to the output from the data output buffer 13 via the data converter 12.

When the column line select signal CL is enabled based on the predecoded address signal B, the data B1 masked by the write mask function is read from the capacitor 501 to the bit lines BL and /BL, and is then read to the data bus lines DB and /DB via the NMOS transistors 510 and 511 functioning as the column gates. Then, the data B1 on the data bus lines DB and /DB is supplied to the read/write buffer 27, and is then output to the outside of the FCRAM from the data output buffer 13 via the data converter 12.

When the command decoder 2 is supplied with the read command directed to the same bank as the previous write command, the address latch&comparators 6 and 7 continue to latch the address signal latched when the previous write command is received. The write data buffer 28 continues to hold the data B0 supplied by the previous write command.

After two clocks following the read command C, the command decoder 2 is supplied with the read command D and the row address buffer 4 and the column address buffer 5 are supplied with the address signal D. Then, the address latch&comparators 6 and 7 compare the address signal B latched when the previous write command is received with the address signal D associated with the present read command D.

The result of the comparison shows that the address signal B differs from the address signal D. Thus, the address signal D supplied associated with the present read command D is supplied to the predecoders 20-1 and 20-2 included in the bank (0) circuit 14. When the command decoder 2 receives the read command directed to the same bank as the previous write command, the address latch&comparators 6 and 7 continue to latch the address signal latched when the previous write command is received.

The predecoders 20-1 and 20-2 supplied with the address signal D from the address latch&comparators 6 and 7 predecode the address signal D, and supplies the predecoded address signal to the block decoder 19, the word decoder 21, the ¼ decoder 22, the BLT decoder 23, the S/A generating unit 24 and the column decoder 25.

When the column line select signals CL is enabled based on the predecoded address signal D, the data stored in the capacitor 501 is read to the bit lines BL and /BL, and is then read to the data bus lines DB and /DB via the NMOS transistors 510 and 511 functioning as the column gates. The data D0 and D1 read to the data bus lines DB and /DB are supplied to the read/write buffer 27 and are then output to the outside of the FCRAM from the data output buffer 13 via the data converter 12.

After two clocks subsequent to the read command D, the write commend E is input to the command decoder 2 and the address signal E is applied to the row address buffer 4 and the column address buffer 5. Then, the address latch&comparators 6 and 7 supply the predecoders 20-1 and 20-2 included in the bank (0) circuit 14 with the address signal B latched when the previous write command is received, and latch the address signal E associated with the present write command.

The predecoders 20-1 and 20-2 supplied with the address signal B from the address latch&comparators 6 and 7 predecode the address signal B, and supply the predecoded address signal B to the block decoder 19, the word decoder 21, the ¼ decoder 22, the BLT decoder 23, the S/A generating unit 24, and the column decoder 25. When the column line select signal CL is enabled based on the predecoded address signal B, the data B0 held in the read/write buffer 27 is stored in the capacitor 501 via the bit lines BL and /BL. At that time, the data B1 masked by the write mask function is not newly stored in the capacitor 501, which continues to hold the currently stored data.

The above write mask function is utilized when part of data included in the same address is rewritten. The write mask function is controlled by a signal externally supplied. For example, a mask signal is used which switches to a high level with respect to data to be masked. Alternatively, a command signal defined by a plurality of given signals is used to control the write mask function.

A signal which controls the write mask function (hereinafter referred to as a write mask control signal) is applied to the command decoder 2, and is supplied to the control unit 26 via the RAS generating unit 16 and the control unit 18, whereby the read write buffer 27 and the write data buffer 28 are controlled.

Thus, as shown in FIG. 9, the following operation can be performed. In the case where the write data written by the write command W is immediately read by the read command R within the same bank, the data masked by the write mask function is read from the memory cells of the core circuit 29, and the remaining data are read from the write data buffer 28. Thus, even when the write mask function is used, it is possible to start the process of the write command R before the write process by the write command W is completed. Hence, the read-write cycle can be reduced.

Figure 11:
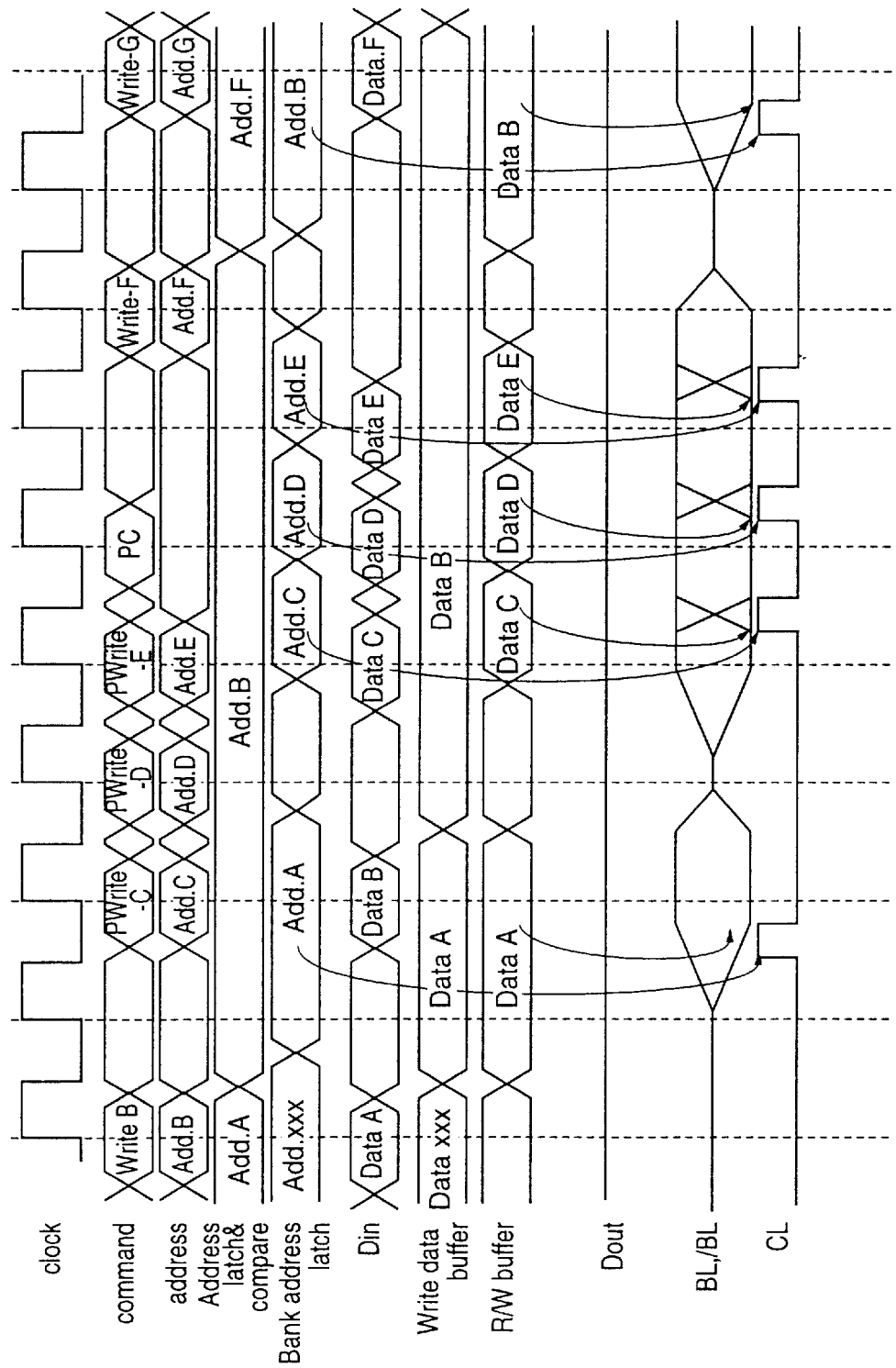
FIG. 11 is a timing chart of a sequence of successively executing write, write (page-mode write), and write commands in this order in the semiconductor memory device shown in FIG. 5.

A description will be given, with reference to FIG. 11, of an operation timing including a mage mode. FIG. 11 is a timing chart of a sequence of successively receiving write, write (page-mode write), and write commands in the FCRAM shown in FIG. 5. The clock cycle shown in FIG. 11 is twice that shown in FIG. 4, and the read data latency and the write data latency are equal to each other. In FIG. 11, a symbol having a capital letter with a hyphen such as "Pwirte-C" denotes a page-mode write command.

The page mode is defined as a read or write operation in which data related to the same word line is read while the column address is changed. In the sequence shown in FIG. 11 in which the page mode is employed, operations can be performed at one-clock intervals.

The write command B is input to the command decoder 2, and the address signal B is input to the row address buffer 4 and the column address buffer 5. Then, the address latch&comparators 6 and 7 supply the predecoders 20-1 and 20-2 included in the bank (0) circuit 14 with the address signal A latched when the previous write command is received, and latch the address signal B associated with the present write command.

The predecoders 20-1 and 20-2 supplied with the address signal A from the address latch&comparators 6 and 7 predecode the address signal A and supply the predecoded address signal A to the block decoder 19, the word decoder 21, the ¼ decoder 22, the BLT decoder 23, the S/A generating unit 24, and the column decoder 25. The data A input to the data input buffer 11 by the write command is supplied to the write data buffer 28 via the data converter 10, and is then supplied to the read write buffer 27 from the write data buffer 28.

When the column line select signal CL is enabled based on the predecoded address signal A, the data A held in the read/write buffer 27 is stored in the capacitor 501 via the bit lines BL and /BL.

After two clocks subsequent to the write command B, the page-mode write command C is applied to the command decoder 2, and the address signal C is supplied to the row address buffer 4 and the column address buffer 5. Then, the address latch&comparators 6 and 7 continue to hold the address signal B latched when the previous write command B is supplied, and supply the predecoders 20-1 and 20-2 included in the bank (0) circuit 14 with the address signal C latched when the previous page-mode write command C is supplied. The data C input to the data input buffer 11 by the page-mode write command D is not held in the write data buffer 28 but is held in the read-write buffer 27.

The predecoders 20-1 and 20-2 supplied with the address signal C from the address latch&comparators 6 and 7 predecode the address signal C, and supply the predecoded address signal C to the block decoder 19, the word decoder 21, the ¼ decoder 22, the BLT decoder 23, the S/A generating unit 24, and the column decoder 25. When the column line select signal CL is selected based on the predecoded address signal C, the data C held in the read/write buffer 27 is stored in the capacitor 501 via the bit lines BL and /BL. Then, the page-mode write commands D and E are executed until a page-mode close command PC is received.

When the page-mode close command PC is supplied, the operation of the FCRAM returns to the successive write operations shown in FIG. 6. The command decoder 2 is supplied with the write command F. The address signal B continuously latched in the address latch&comparators 6 and 7 during the page mode is supplied to the predecoders 20-1 and 20-2 included in the bank (0) circuit 14. By the continuous operation shown in FIG. 6, the data B held in the write data buffer 28 is stored in the capacitor 501 via the bit lines BL and /BL.

Thus, as shown in FIG. 11, at the time of the page mode, the write data and address signal associated with the previous write command W are latched in the write data buffer 28 and the address latch&comparators 6 and 7. Thus, the page-mode write command W can be started before the data writing operation by the write command W is completed.

Figure 12:
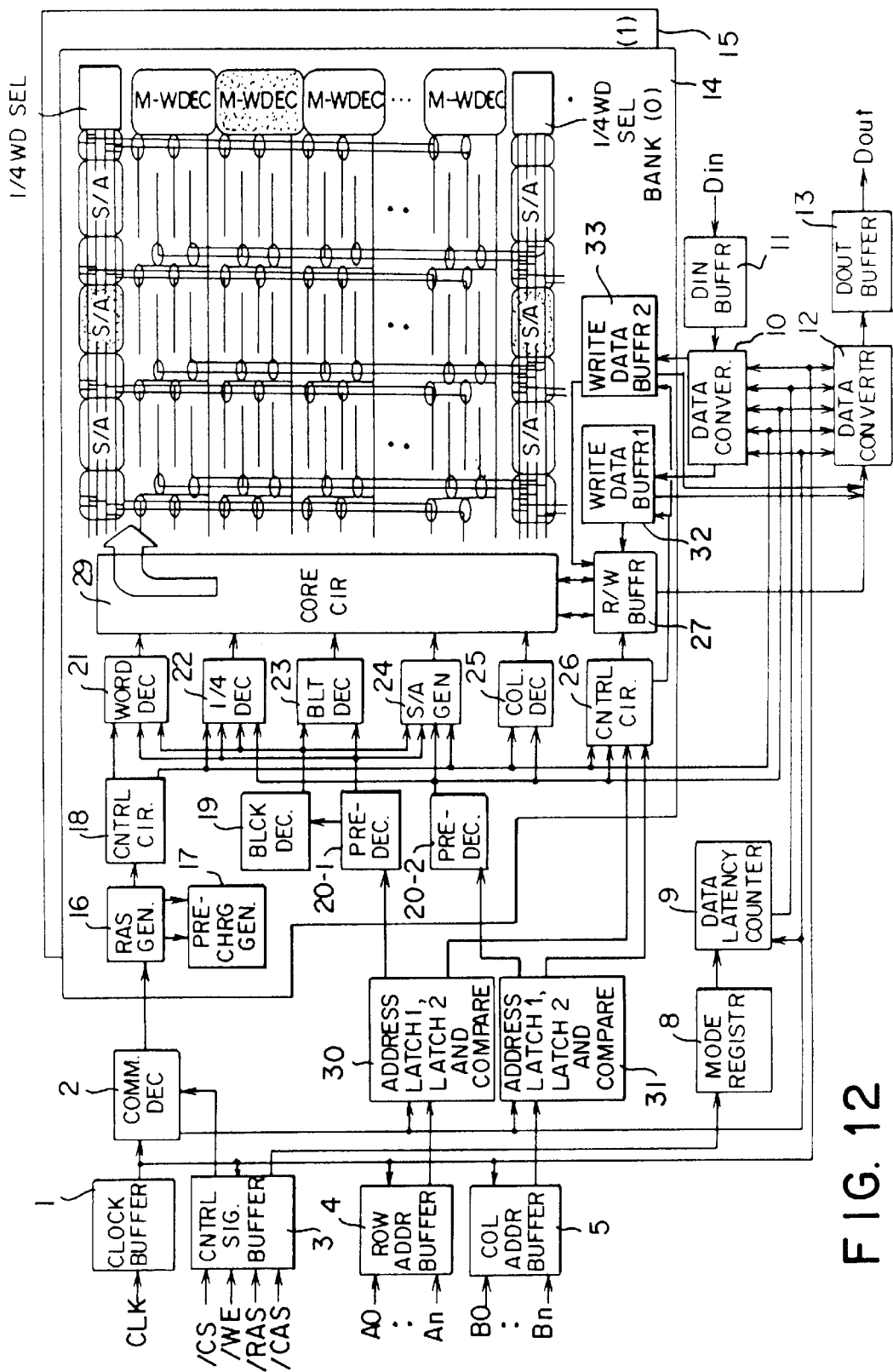
FIG. 12 is a block diagram of a semiconductor memory device according to a second embodiment of the present invention.

A description will now be given, with reference to FIG. 12, of a second embodiment of the present invention. FIG. 12 is a block diagram of a semiconductor memory device according to the second embodiment of the present invention. In FIG. 12, parts that are the same as those shown in FIG. 5 are given the same reference numbers.

The second embodiment of the present invention differs from the first embodiment thereof in that the device shown in FIG. 12 is equipped with two double address latch&comparators 30 and 31, and two write data buffers 32 and 33. With this structure, even if the read latency and the write latency become long in a case where the clock cycle is long, it will be possible to reduce the interval between the read command R and the write command W to the minimum tolerance time (lRC) available in the general inter-bank formation. In the FCRAM, the interval between the read command R and the write command W is defined based on the operation interval of the sense amplifiers.

Each of the double address latch&comparators 30 and 31 is made up of a first address latch&comparator part, and a second address latch&comparator part. A description will be given of operations of the double address latch&comparators 30 and 31 respectively performed at the time of receiving the write and read commands.

At the time of receiving the write command, the double address latch&comparator 30 latches, in the first address latch&comparator part thereof, the row address signal supplied from the row address buffer 4, and latches, in the second address latch&comparator part, the row address signal latched in the first address latch&comparator part. The second address latch&comparator part latches the row address supplied from the first address latch&comparator part, and supplies the row address signal latched in the second address latch&comparator part to the predecoder 20-1.

That is, by utilizing the row address signal latched in the second address latch&comparator part, data held in the write data buffer 32 or 33 is written into the core circuit 29.

At the time of receiving the read command, the double address latch&comparator 30 compares the row address signal supplied from the row address buffer 4 with the row address signal latched in the first address latch&comparator part. When both the address signals coincide with each other, the double address latch&comparator 30 supplies an associated signal to the control unit 26. Then, the control unit 26 causes the data held in the write data buffer 32 or the write data buffer 33 to be output. At that time, a decision as to from which one of the buffers 32 and 33 data should be output depends on a timing which will be described later.

Further, the double address latch&comparator 30 compares the row address signal supplied from the row address buffer 4 when the present read command is received with the row address signal latched in the second address latch&comparator part. If both the address signals do not coincide with each other, the data is read from the core circuit 29 in accordance with the row address signal supplied when the present read command is received.

The operation of the double address latch&comparator 31 is the same as that of the double address latch&comparator 30 expect that the column address signal is supplied from the column address buffer 5 and the column address signal is supplied to the predecoder 20-2.

Figure 13:
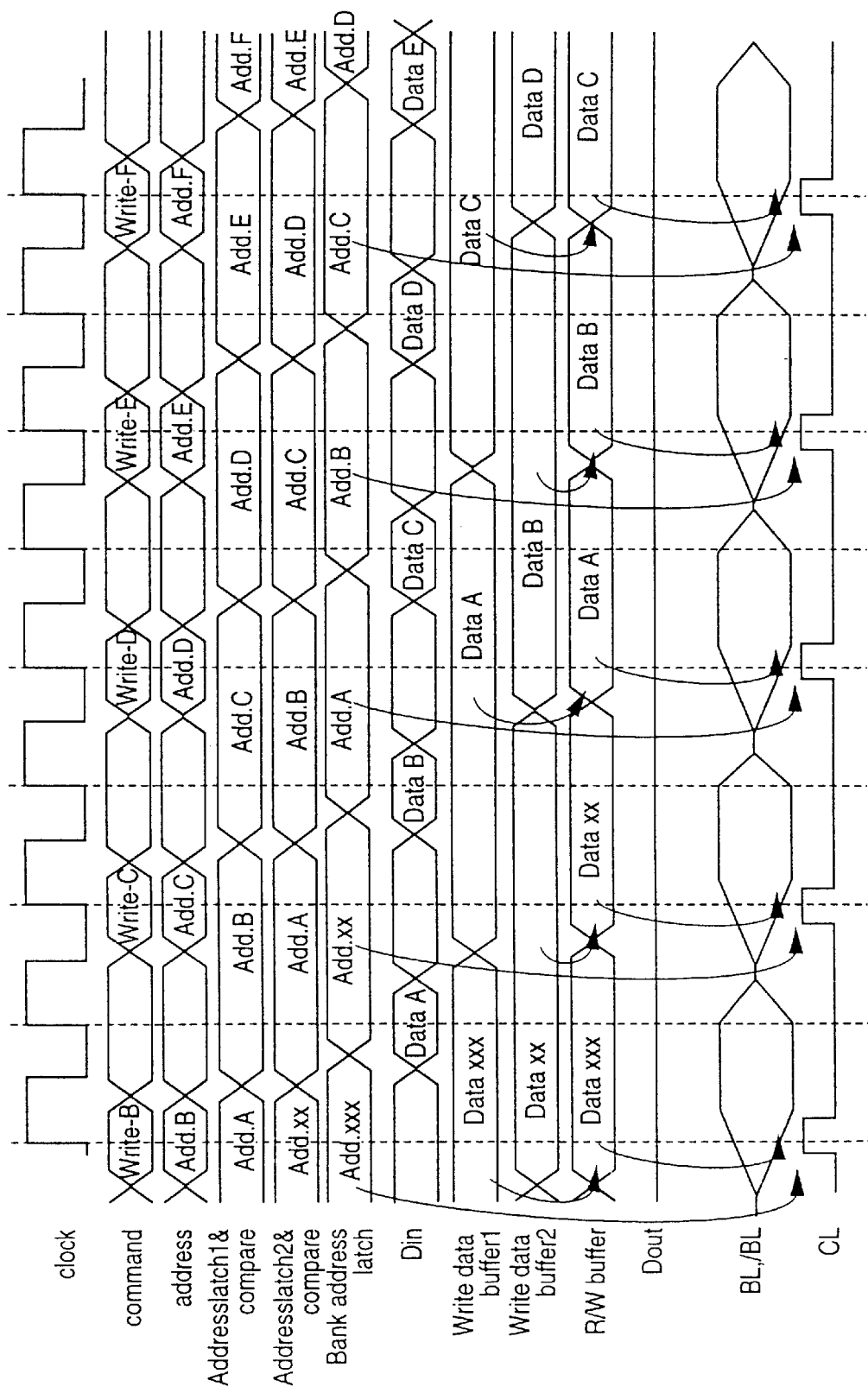
FIG. 13 is a timing chart of a sequence of successively executing write commands in the semiconductor memory device shown in FIG. 12.

A description will now be given, with reference to FIG. 13, of an operation of the FCRAM according to the second embodiment of the present invention. FIG. 13 shows an operation performed when write commands are successively supplied. The clock cycle shown in FIG. 13 is twice that shown in FIG. 4, and the read data latency and the write data latency are equal to each other.

The write command B is applied to the command decoder 2, and the address signal B is applied to the double address latch&comparators 30 and 31. Then, the double address latch&comparators 30 and 31 latch, in the first address latch&comparator parts thereof, the address signal A latched in the first part when the previous write command is received, and latch the address signal B in the first parts thereof. At that time, the address signal xx latched in the second part is supplied to the predecoders 20-1 and 20-2.

The predecoders 20-1 and 20-2 supplied with the address signal xx from the double address latch&comparators 30 and 31 predecode the address signal xx, and supply the predecoded address signal to the block decoder 19, the word decoder 21, the ¼ decoder 22, the BLT decoder 23, the S/A generating unit 24, and the column decoder 25.

When the write command B is supplied to the command decoder 2, the data xx held in the write data buffer 33 is supplied to the read/write buffer 27. At that time, the write data buffer 32 is supplied with the data A input to the data input buffer 11 via the data converter 10.

When the column line select signal CL is selected based on the predecoded address signal xx, the data xx held in the read/write buffer 27 is stored in the capacitor 501 via the bit lines BL and /BL.

After two clocks subsequent to the write command B, the write command C is applied to the command decoder 2, and the address signal C is applied to the row address buffer 4 and the column address buffer 5. Then, the double address latch&comparators 30 and 31 latch, in the second parts, the address signals B latched in the first parts when the previous write command is supplied, and latch the address signals C in the first parts.

At that time, the address signals A latched in the second parts are supplied to the predecoders 20-1 and 20-2 included in the bank (0) circuit 14.

The predecoders 20-1 and 20-2 supplied with the address signals A from the double address latch&comparators 30 and 31 predecode the address signals A, and supply the predecoded address signals A to the block decoder 19, the word decoder 21, the ¼ decoder 22, the BLT decoder 23, the S/A generating unit 24, and the column decoder 25.

The write data buffer 32 continues to hold the data A supplied from the data input buffer 11, and the data A is then held in the read/write buffer 27. At that time, the data B input to the data input buffer 11 is supplied to the write data buffer 33 via the data converter 10. When the column line select signal CL is enabled based on the predecoded address signal A, the data B latched in the read/write buffer 27 is stored in the capacitor 501 via the bit lines BL and /BL.

As described above, according to the second embodiment of the present invention, the write data buffers 32 and 33 are alternately supplied with the data signal corresponding to the write command applied to the command decoder 3. By repeating the above process, the successive write operations can be performed.

Figure 14:
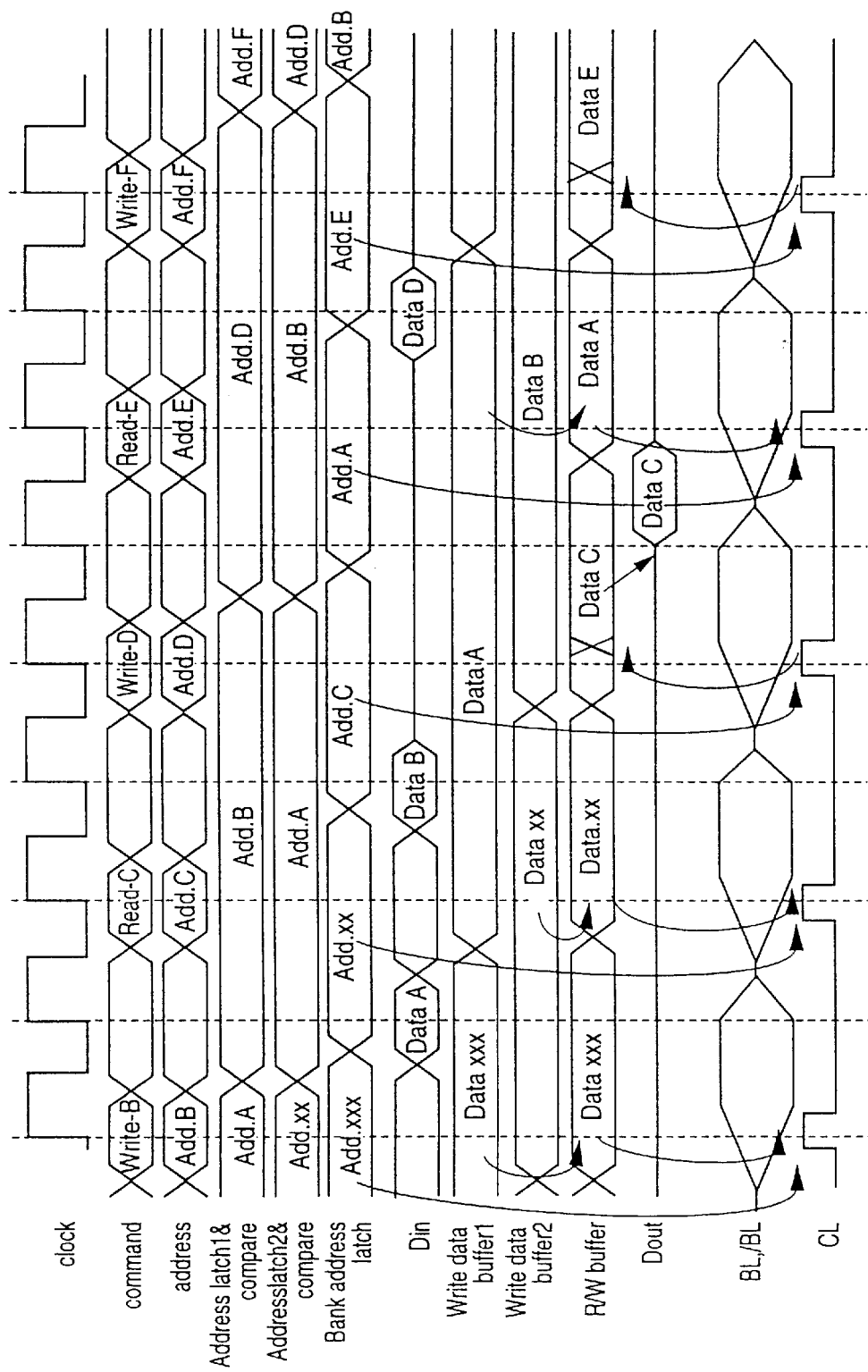
FIG. 14 is a timing chart of a sequence of successively executing write, read, write and read commands in the semiconductor memory device shown in FIG. 12.

FIG. 14 is a timing chart of a sequence of successively executing write, read, write and read commands in this order. In FIG. 14, the clock cycle is twice that shown in FIG. 4, and the read data latency and the write data latency are equal to each other.

The write command B is applied to the command decoder 2, and the address signal B is applied to the double address latch&comparators 30 and 31. Then, the double address latch&comparators 30 and 31 latch, in the first address latch&comparator parts thereof, the address signal A latched in the first part when the previous write command is received, and latch the address signal B in the first parts thereof. At that time, the address signal xx latched in the second part is supplied to the predecoders 20-1 and 20-2.

The predecoders 20-1 and 20-2 supplied with the address signal xx from the double address latch&comparators 30 and 31 predecode the address signal xx, and supply the predecoded address signal to the block decoder 19, the word decoder 21, the ¼ decoder 22, the BLT decoder 23, the S/A generating unit 24, and the column decoder 25. When the command decoder 2 is supplied with the write command B, the data xx latched in the write data buffer 33 is latched in the read/write buffer 27.

When the column line select signal CL is enabled based on the predecoded address signal xx, the data xx held in the read/write buffer 27 is stored in the capacitor 501 via the bit lines BL and /BL. The data A supplied from the data input buffer 11 is applied to the write data buffer 32 via the data converter 10, and is held therein. The write data buffer 33 continuesly to hold the data xx supplied by the previous write command.

After two clocks subsequent to the write command B, the page-mode write command C is applied to the command decoder 2, and the address signal C is supplied to the row address buffer 4 and the column address buffer 5. Then, the double address latch&comparators 30 and 31 compare the address signal B latched in the first part when the previous write command B is received with the address signal C supplied by the present read command C.

Since the address signal B differs from the address signal C, the double address latch&comparators 30 and 31 supply the address signal C supplied when the present read command C is supplied to the predecoders 20-1 and 20-2 included in the bank (0) circuit 14. The double address latch&comparators 30 and 31 continue to latch the address signal latched when the previous write command is latched.

The predecoders 20-1 and 20-2 supplied with the address signal C from the double address latch&comparators 30 and 31 predecode the address signal C, and supply the predecoded address signal C to the block decoder 19, the word decoder 21, the ¼ decoder 22, the BLT decoder 23, the S/A generating unit 24, and the column decoder 25.

When the column line select signal CL is enabled based on the predecoded address signal C, the data stored in the capacitor 501 is read to the bit lines BL and /BL, and is then read to the data bus lines DB and /DB via the NMOS transistors 510 and 511 functioning as the column gates. Then, the data C read to the data bus lines DB and /DB is supplied to the read/write buffer 27, and is then output to the outside of the FCRAM from the data output buffer 13 via the data converter 12. The data B supplied from the data input buffer 11 is input to the write data buffer 33 via the data converter 10, and is held therein. The write data buffer 32 continues to hold the data A supplied by the previous write command.

After two clocks subsequent to the read command C, the write command D is supplied to the command decoder 2, and the address signal D is supplied to the row address buffer 4 and the column address buffer 5. Then, the double address latch&comparators 30 and 31 latch, in the second parts, the address signals latched in the first part when the previous write command is received, and latch the address signal D in the first parts thereof. At that time, the address signals A latched in the second parts are supplied to the predecoders 20-1 and 20-2 included in the band (0) circuit 14.

The predecoders 20-1 and 20-2 supplied with the address signal A from the double address latch&comparators 30 and 31 predecode the address signal A, and supply the predecoded address signal A to the block decoder 19, the word decoder 21, the ¼ decoder 22, the BLT decoder 23, the S/A generating unit 24, and the column decoder 25. When the write command D is supplied to the command decoder 2, the data A held in the write data buffer 32 is held in the lead/write buffer 27.

When the column line select signal CL is enabled based on the predecoded address signal A, the data held in the read/write buffer 27 is stored in the capacitor 501 via the bit lines BL and /BL. By repeating the above operation, the successive write, read, write and read operations can be performed.

The sequence shown in FIG. 14 does not include an operation in which the write command W is applied, and the write data written by the above write command W is immediately read from the same bank by the read command R.

Figure 15:
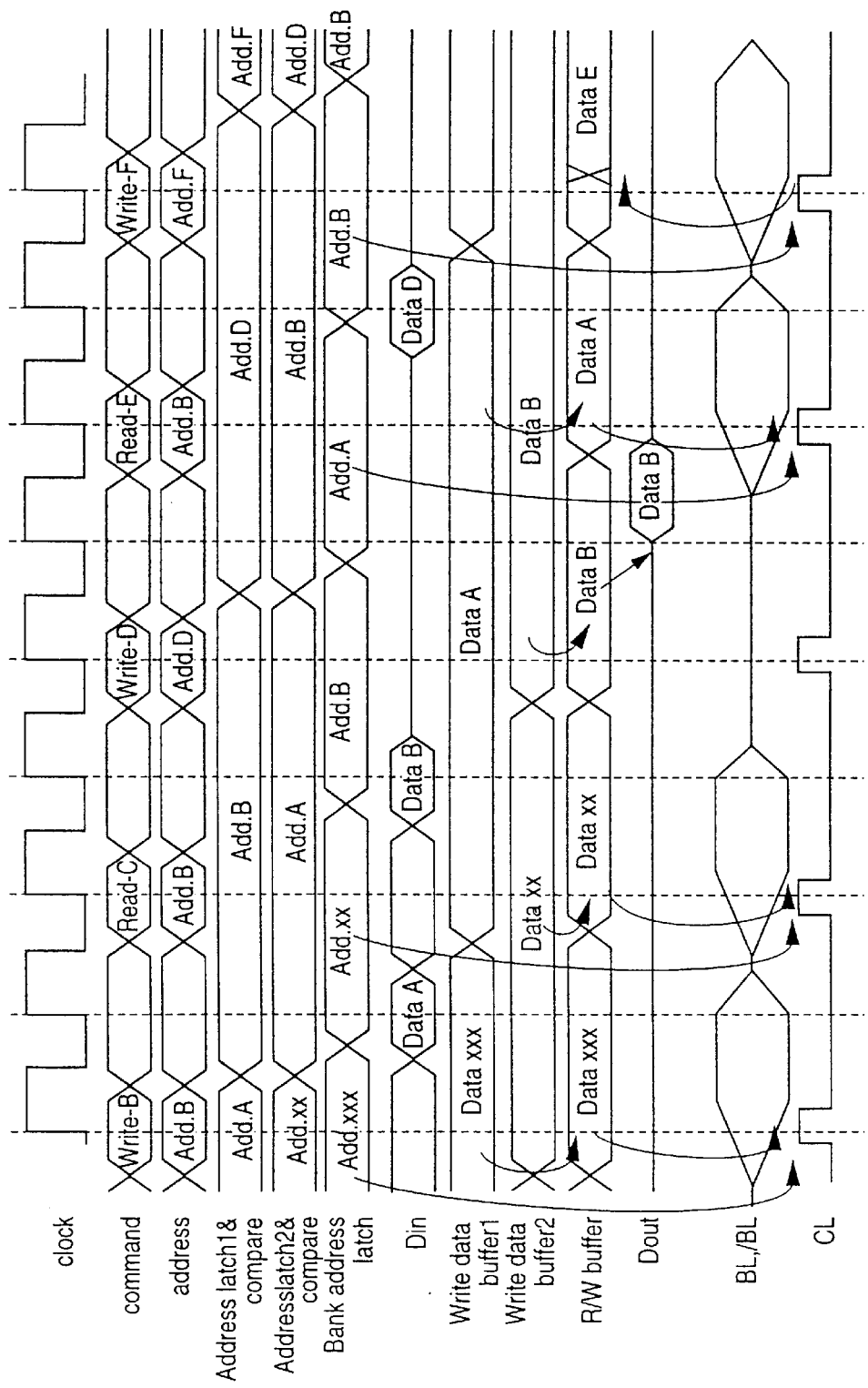
FIG. 15 is a timing chart of another sequence of successively executing write, read, write and read commands in the semiconductor memory device shown in FIG. 12.

FIG. 15 is a timing chart of a sequence in which the write command W is applied, and the write data written by the above write command W is immediately read from the same bank by the read command R. In FIG. 15, the clock cycle is twice that shown in FIG. 4, and the read data latency and the write data latency are equal to each other.

The write command B is supplied to the command decoder 2, and the address signal B is supplied to the row address buffer 4 and the column address buffer 5. Then, the double address latch&comparators 30 and 31 latch, in the second parts, the address signals A latched in the first parts by the previous write command, and latch the address signal B in the first parts. At that time, the address signal xx latched in the second parts is supplied to the predecoders 20-1 and 20-2 included in the bank (0) circuit 14.

The predecoders 20-1 and 20-2 supplied with the address signal xx from the double address latch&comparators 30 and 31 predecode the address signal xx, and supply the predecoded address signal xx to the block decoder 19, the word decoder 21, the ¼ decoder 22, the BLT decoder 23, the S/A generating unit 24, and the column decoder 25. When the command decoder 2 is supplied with the write command B, the data xx held in the write data buffer 33 is held in the read/write buffer 27.

When the column line select signal CL is enabled based on the predecoded address signal xx, the data xx latched in the read/write buffer 27 is stored in the capacitor 501 via the bit lines BL and /BL. The data A supplied from the data input buffer 11, is input to the write data buffer 32 via the data converter 10, and is held therein. The write data buffer 33 continues to hold the data supplied by the previous write command.

After two clocks subsequent to the write command B, the read command C is supplied to the command decoder 2, and the address signal B is supplied to the row address buffer 4 and the column address buffer 5. Then, the double address latch&comparators 30 and 31 compare the address signals B latched in the first parts when the previous write command B is supplied with the address signals B supplied by the present read command C.

Since both the address signals coincide with each other, the double address latch&comparators 30 and 31 output the signal indicative of the address coincidence to the control unit 26 included in the bank (0) circuit 14.

The control unit 26 outputs the data B held in the write data buffer 33 based on the previous write command B to the outside of the FCRAM from the data output buffer 13 via the data converter 12. When the read command is input to the command decoder 2, the double address latch&comparators 30 and 31 continue to latch the address signals latched when the previous write command is supplied.

The data B supplied from the data input buffer 11 is applied to the write data buffer 33 via the data converter 10, and is held therein. The write data buffer 32 continues to hold the data A supplied by the previous write command. The following operation is the same as that shown in FIG. 11, and a description thereof will be omitted.

According to the second embodiment of the present invention, the data is not read from the core circuit 29 but is read from the write data buffer 32 or 33 in the case where the write command W is applied, and the write data written by the above write command W is immediately read from the same bank by the read command R. Hence, the process stemming from the read command R can be started before the write process requested by the write command is completed. Thus, even if the read latency and the write latency become long in a case where the clock cycle is long, it will be possible to reduce the interval between the read command R and the write command W to the minimum tolerance time (tRC) available in the general inter-bank formation.

Figure 16:
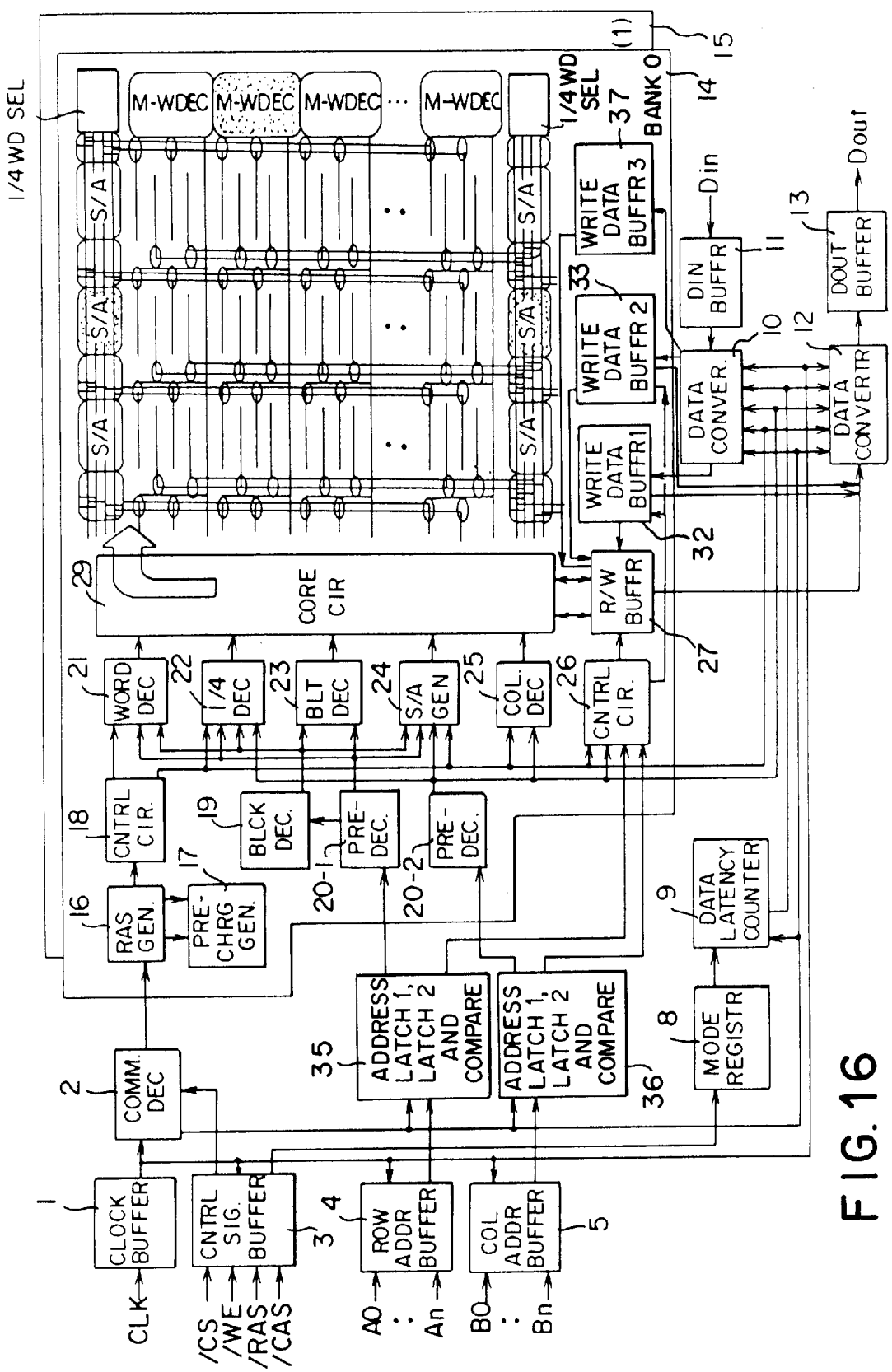
FIG. 16 is a block diagram of a semiconductor memory device according to a third embodiment of the present invention.

A description will now be given, with reference to FIG. 16, of a semiconductor memory device according to a third embodiment of the present invention. In FIG. 16, parts that are the same as those shown in FIG. 12 are given the same reference numbers.

The structure shown in FIG. 16 differs from that shown in FIG. 12 in that there are provided two triple address latch&comparators 35 and 36, and three write data buffers 32, 33 and 37 in FIG. 16.

With the above structure, even if the read latency and the write latency become long in a case where the clock cycle is long, it will be possible to reduce the interval between the read command R and the write command W to the minimum tolerance time (tRC) available in the general inter-bank formation.

Each of the triple address latch&comparators 35 and 36 is made up of a first address latch&comparator part, a second address latch&comparator part, and a third address latch&comparator part. A description will be given of operations of the triple address latch&comparators 35 and 56 respectively performed when the write and read commands are supplied.

When the write command is supplied, the triple address latch&comparator 35 latches in the first part, the row address signal supplied from the row address buffer 4, and latches, in the second part, the row address signal latched in the first part. The second part latches the row address signal from the first part, and the third part latches the row address signal latched in the second part.

The third part latches the row address signal supplied from the second part, and supplies the row address signal latched therein to the predecoder 20-1. By using the row address signal latched in the third part, data stored in the write data buffers 32, 33 and 37 are written into the core circuit 29.

When the read command is supplied, the triple address latch&comparator 35 compares the row address signal supplied from the row address buffer 4 with the row address signal latched in the first part. When both the address signals coincide are the same as each other, the triple address latch&comparator 35 supplies the signal indicative of the address coincidence to the control unit 26. Then, the control unit 26 causes data stored in one of the write buffers 32, 33 and 37 to be output. At that time, a decision as to from which one of the buffers 32, 33 and 37 data should be output depends on a timing which will be described later.

Further, the triple address latch&comparator 35 compares the row address signal supplied from the row address buffer 4 by the present read command with the row address signal latched in the third part. If both the address signals differ from each other, the data is read from the core circuit 29 in accordance with the row address signal supplied when the present read command is supplied.

The operation of the triple address latch&comparator 36 is the same as that of the triple address latch&comparator 35 except that the column address signal is supplied from the column address buffer 5 and the column address signal is supplied to the predecoder 20-2.

Figure 17:
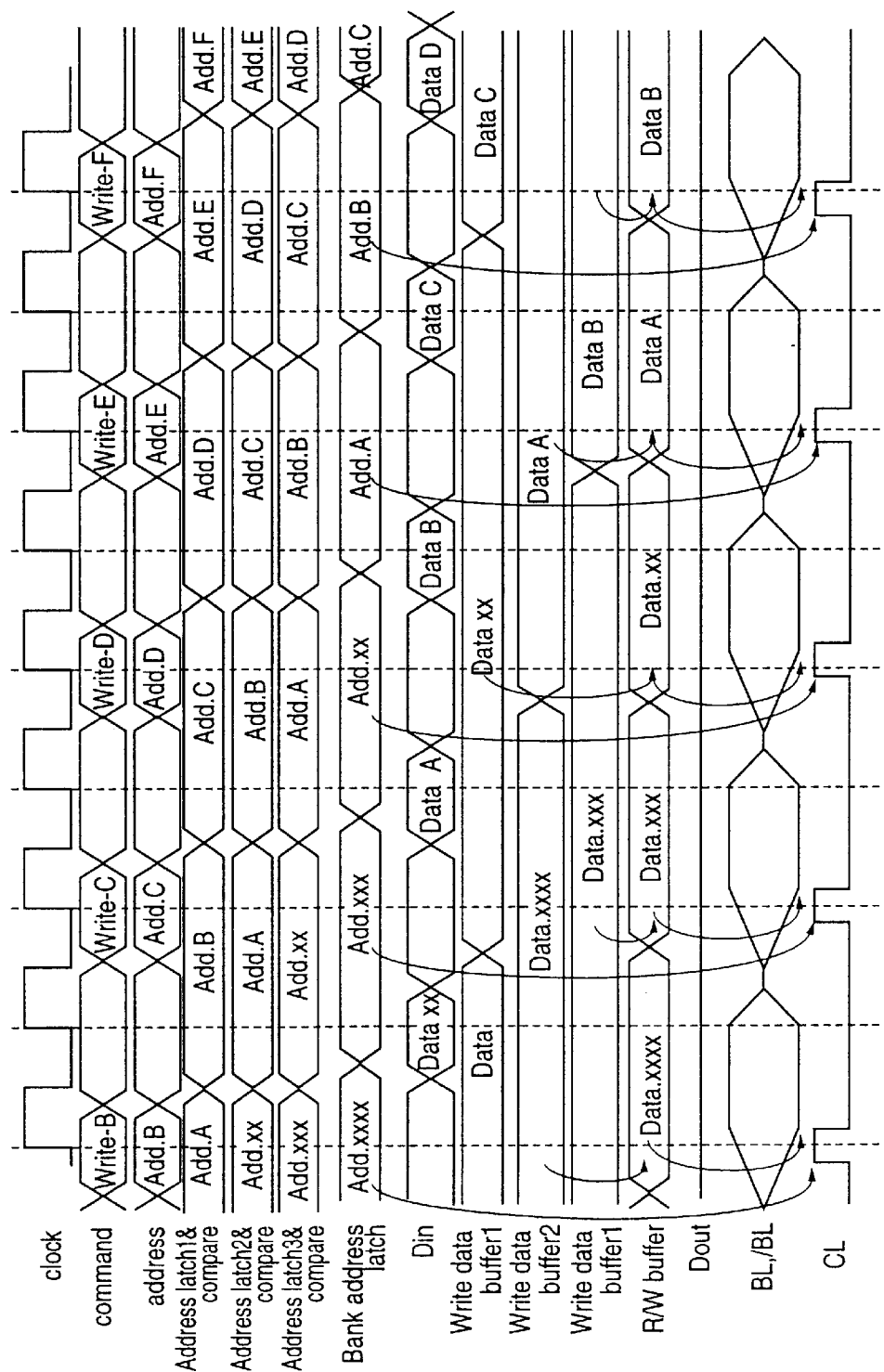
FIG. 17 is a timing chart of a sequence of successively executing write, read, write and read commands in the semiconductor memory device shown in FIG. 16.

FIG. 17 is a timing chart of the successive write operations of the device shown in FIG. 16. In FIG. 17, the clock cycle is twice that shown in FIG. 4, and the read data latency and the write data latency are equal to each other.

The write command B is supplied to the command decoder 2, and the address signal B is supplied to the row address buffer 4 and the column address buffer 5. Then, the triple address latch&comparators 35 and 36 latch, in the second part, the address signal A latched in the first part when the previous write command is supplied, and latches the address signal B in the first part. The address signal xx latched in the second part when the previous write command is supplied is latched in the third part, and the address signal xxx latched in the third part is supplied to the predecoders 20-1 and 20-2 included in the bank (0) circuit 14.

The predecoders 20-1 and 20-2 supplied with the address signal xxx from the triple address latch&comparators 35 and 36 predecode the address signal xxx, and supply the predecoded address signal xxx to the block decoder 19, the word decoder 21, the ¼ decoder 22, the BLT decoder 23, the S/A generating unit 24, and the column decoder 25. When the write command is supplied to the command decoder 2, the data xxx held in the write data buffer 37 is held in the read/write buffer 27.

When the column line select signal CL is enabled based on the predecoded address signal xxx, the data xxx latched in the read/write buffer 27 is stored in the capacitor 501 via the bit lines BL and /BL. The data xx supplied from the data input buffer 11 is written into the write data buffer 32 via the data converter 10, and is held therein. The write data buffer 33 continues to latch data xxxx supplied when the previous write command is supplied.

After two clocks subsequent to the write command B, the write command C is input to the command decoder 2, and the address signal C is input to the row address buffer 4 and the column address buffer 5. Then, the triple address latch&comparators 35 and 36 latch, in the second part, the address signal B latched in the first part when the previous write command is supplied, and latch the address signal C in the first part.

The address signal A latched in the second part when the previous write command is supplied is latched in the third part, and the address signal xx latched in the third part is supplied to the predecoders 20-1 and 20-2 included in the bank (0) circuit 14.

The predecoders 20-1 and 20-2 supplied with the address signal xx from the triple address latch&comparators 35 and 36 predecode the address signal xx, and supply the predecoded address signal to the block decoder 19, the word decoder 21, the ¼ decoder 22, the BLT decoder 23, the S/A generating unit 24, and the column decoder 25. When the write command is supplied to the command decoder 2, the data xx held in the write data buffer 32 is held in the read/write buffer 27.

When the column line select signal CL is enabled based on the predecoded address signal xx, the data xx latched in the read/write buffer 27 is stored in the capacitor 501 via the bit lines BL and /BL. The data supplied from the data input buffer 11 is supplied to the write data buffer 33 via the data converter10, and is held therein. The write data buffer 37 continues to latch the data xxx supplied by the previous write command. By repeating the above operation, the successive write operations can be performed.

According to the third embodiment of the present invention, the data is not read from the core circuit 29 but is read from the write data buffer 32, 33 or 37 in the case where the write command W is applied, and the write data written by the above write command W is immediately read from the same bank by the read command R. Hence, the process resulting from the read command R can be started before the write process requested by the write command is completed.

Thus, even if the read latency and the write latency become long in a case where the clock cycle is long, it will be possible to reduce the interval between the read command R and the write command W to the minimum tolerance time (IRC) available in the general inter-bank formation.

The above description is directed to the FCRAM. The circuit configuration of the periphery of memory cells of the FCRAM is the same as that of the SDRAM. Thus, the present invention includes the SDRAM.

Figure 18:
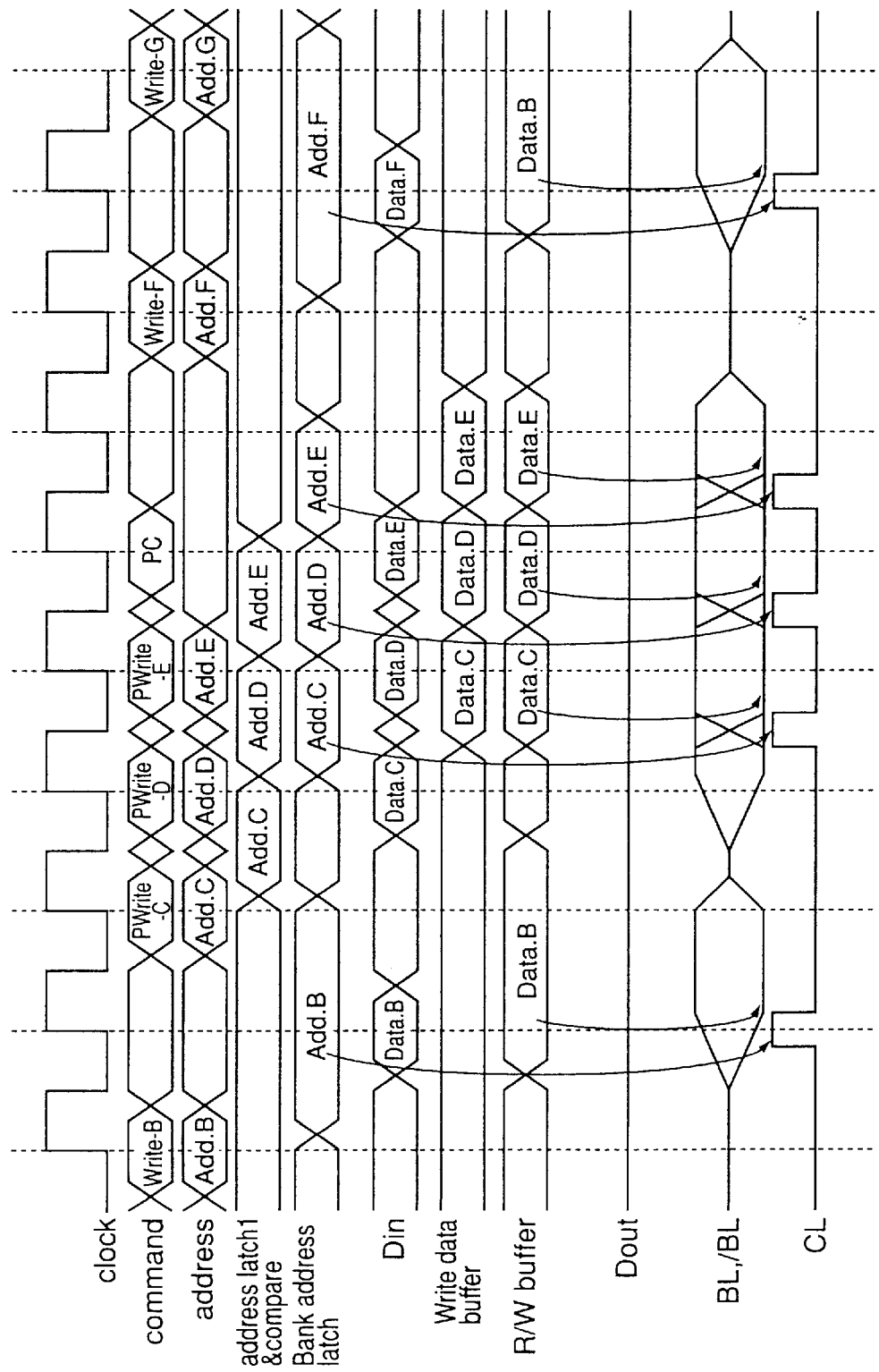
FIG. 18 is a timing chart of a sequence of successively executing page-mode write commands in the semiconductor memory device shown in FIG. 5.

FIG. 18 is a timing chart of a page-mode write successive operation in the semiconductor memory device shown in FIG. 5. The clock cycle shown in FIG. 18 is twice that shown in FIG. 4, and the read data latency and the write data latency are equal to 1.

Referring to FIG. 18, the address command B is applied to the command decoder 2, and the address signal B is applied to the row address buffer 4 and the column address buffer 5. Then, the predecoders 20-1 and 20-2 included in the bank (0) circuit 14 are supplied with the address signal B.

The predecoders 20-1 and 20-2 supplied with the address signal B from the row address buffer 4 and the column address buffer 5 predecode the address signal B, and supply the predecoded address signal to the block decoder 19, the word decoder 21, the ¼ decoder 22, the BLT decoder 23, the S/A generating unit 24, and the column decoder 25. The data B applied to the data input buffer 11 by the write command B is supplied to the read/write buffer 27 via the data converter 10.

When the column line select signal CL is enabled based on the predecoded address signal B, the data B latched in the read/write buffer 27 is stored in the memory 501 via the bit lines BL and /BL.

After two clocks subsequent to the write command B, the page-mode write command C is supplied to the command decoder 2, and the address signal C is supplied to the row address buffer 4 and the column address buffer 5. Then, the address latch&comparators 6 and 7 latch the address signal C supplied together with the present page-mode write command C. The present page-mode write command C is the first command which shifts the mode of the device from the normal mode to the page mode, and continues the corresponding word line in an activated state until the page-mode close command is received. During the above period, columns are selectively enabled one by one.

After one clock following the page-mode write command C, the page-mode write command D is supplied to command decoder 2, and the address signal D is supplied to the row address buffer 4 and the column address buffer 5. Then, the address latch&comparators 6 and 7 supply the predecoders 20-1 and 20-2 in the bank (0) circuit 14 with the address signal latched when the previous page-mode write command C is supplied, and latch the present page-mode write command D.

The predecoders 20-1 and 2-2 supplied from the address signal C from the address latch&comparators 6 and 7 predecode the address signal C, and supply the predecoded address signal C to the block decoder 19, the word decoder 21, the ¼ decoder 22, the BLT decoder 23, the S/A generating unit 24, and the column decoder 25. Further, the data C input to the data input buffer 11 associated with the page-mode write command C is supplied to the write data buffer 28 via the data converter 10, and is then supplied to the read/write buffer 27 from the write data buffer 28.

When the column line select signal CL is enabled based on the predecoded address signal C, the data latched in the read/write buffer 27 is stored in the capacitor 501 via the bit lines BL and /BL.

After one clock following the page-mode write command D, the page-mode write command E is input to the command decoder 2, and the address signal E is supplied to the row address buffer 4 and the column address buffer 5. Then, the address latch&comparators 6 and 7 supply the predecoders 20-1 and 20-2 in the bank (0) circuit 14 with the address signal D latched when the previous page-mode write command D is received, and latch the address signal E associated with the present page-mode write command E.

The predecoders 20-1 and 20-2 supplied with the address signal D from the address latch&comparators 6 and 7 predecode the address signal D, and supply the predecoded address signal D to the block decoder 19, the word decoder 21, the ¼ decoder 22, the BLT decoder 23, the S/A generating unit 24, and the column decoder 25. The data supplied to the data input buffer 11 associated with the page-mode write command D is supplied to the write data buffer 28 via the data converter 10, and is then supplied to the read/write buffer 27 from the write data buffer 28.

When the column line select signal CL is selected based on the predecoded address signal D, the data D latched in the read/write buffer 27 is stored in the capacitor 501 via the bit lines BL and /BL.

After one clock following the page-mode write command E, the page-mode close command PC is applied to the command decoder 2. Then, the address latch&comparators 6 and 7 supply the predecoders 20-1 and 20-2 with the address signal E latched when the previous page-mode write command E is supplied.

The predecoders 20-1 and 20-2 supplied with the address signal E from the address latch&comparators 6 and 7 predecode the address signal E, and supply the predecoded address signal E to the block decoder 19, the word decoder 21, the ¼ decoder 22, the BLT decoder 23, the A/S generating unit 24, and the column decoder 25. The data supplied to the data input buffer 11 associated with the page-mode write command E is supplied to the write data buffer 28 via the data converter 10, and is supplied to the read/write buffer 27 via the write data buffer 28.

When the column line select signal CL is enabled based on the predecoded address E, the data E latched in the read/write buffer 27 is stored in the capacitor 501 via the bit lines BL and /BL. Then, the device shifts to the normal mode from the page mode, and write command G is processed in the same manner as the above-mentioned write command B.

Figure 19:
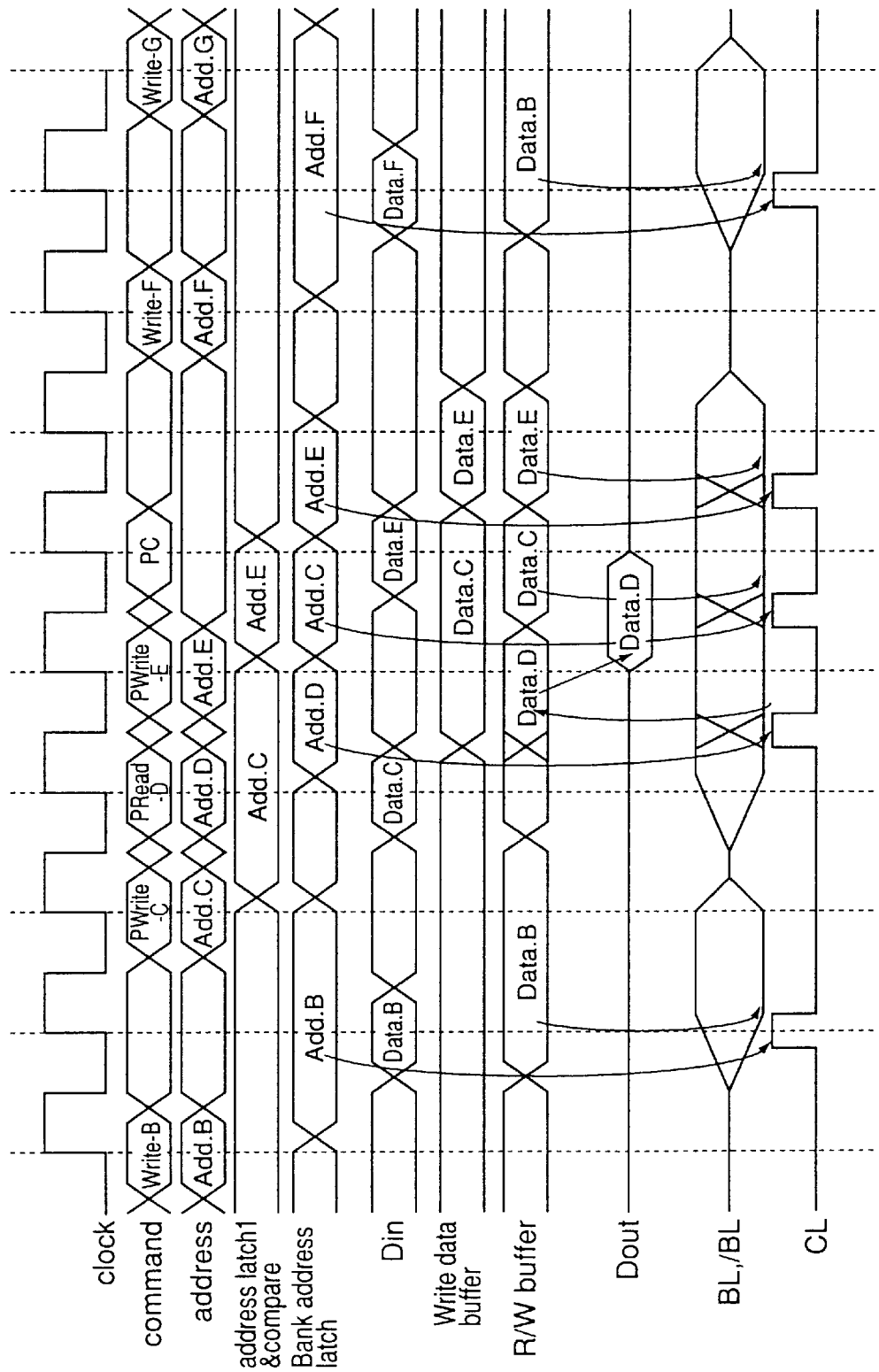
FIG. 19 is a timing chart of a sequence of successively executing a page-mode write command and a page-mode read command in the semiconductor memory device shown in FIG. 5.

FIG. 19 is a timing chart of a sequence in which a page-mode write command and a page-mode read command are successively supplied. In FIG. 19, the clock cycle is twice that shown in FIG. 4, and the read data latency and the write data latency are equal to 1. Further, a symbol "PRead-D" denotes a page-mode read command D.

Referring to FIG. 18, the address command B is applied to the command decoder 2, and the address signal B is applied to the row address buffer 4 and the column address buffer 5. Then, the predecoders 20-1 and 20-2 included in the bank (0) circuit 14 are supplied with the address signal B.

The predecoders 20-1 and 20-2 supplied with the address signal B from the row address buffer 4 and the column address buffer 5 predecode the address signal B, and supply the predecoded address signal to the block decoder 19, the word decoder 21, the ¼ decoder 22, the BLT decoder 23, the S/A generating unit 24, and the column decoder 25. The data B applied to the data input buffer 11 by the write command B is supplied to the read/write buffer 27 via the data converter 10.

When the column line select signal CL is enabled based on the predecoded address signal B, the data B latched in the read/write buffer 27 is stored in the memory 501 via the bit lines BL and /BL.

After two clocks subsequent to the write command B, the page-mode write command C is supplied to the command decoder 2, and the address signal C is supplied to the row address buffer 4 and the column address buffer 5. Then, the address latch&comparators 6 and 7 latch the address signal C supplied together with the present page-mode write command C. The present page-mode write command C is the first command which shifts the mode of the device from the normal mode to the page mode, and continues the corresponding word line in an activated state until the page-mode close command is received.

After one clock following the page-mode write command C, the command decoder 2 is supplied with the page-mode read command D, and the row address buffer 4 and the column address buffer 5 are supplied with the address signal D. Then, the address latch&comparators 6 and 7 compare the address signal C latched when the previous page-mode write command C is supplied with the address signal D latched associated with the present page-mode read command D.

Since the address signals C and D differ from each other, the address signal D received when the present page-mode read command D is supplied is supplied to the predecoders 20-1 and 20-2. The address latch&comparators 6 and 7 continue to latch the address signal C latched when the previous page-mode write command C is supplied.

The predecoders 20-1 and 20-2 supplied with the address signal D from the address latch&comparators 6 and 7 predecode the address signal D, and then supply the predecoded address signal D to the block decoder 19, the word decoder 21, the ¼ decoder 22, the BLT decoder 23, the S/A generating unit 24, and the column decoder 25. The data C input to the data input buffer 11 associated with the page-mode write command C is supplied to the write data buffer 28 via the data converter 10.

When the column line select signal CL is selected based on the predecoded address signal D, the data stored in the capacitor 501 is read to the bit lines BL and /BL, and is then read to the data bus lines DB and /DB. Then, the data on the data bus lines DB and /DB is supplied to the read/write buffer 27, and is then output to the outside of the FCRAM from the data output buffer 13 via the data converter 12. The write data buffer 28 continues to latch the data C received when the previous page-mode write command C is supplied.

After one clock following the page-mode read command D, the page-mode write command E is applied to the command decoder 2, and the address signal E is applied to the row address buffer 4 and the column address buffer 5. Then, the address latch&comparators 6 and 7 supply the predecoders 20-1 and 20-2 in the bank (0) circuit 14 with the address signal C latched when the previous page-mode write command C is supplied, and latch the present page-mode write command E.

The predecoders 20-1 and 20-2 supplied with the address signal C from the address latch&comparators 6 and 7 predecode the address signal C, and supply the predecoded address signal C to the block decoder 19, the word decoder 21, the ¼ decoder 22, the BLT decoder 23, the S/A generating unit 24, and the column decoder 25.

When the column line select signal CL is selected based on the predecoded address signal C, the data latched in the write data buffer 28 is supplied to the read/write buffer 27, and is then stored in the capacitor 501 via the bit lines BL and /BL.

After one clock following the page-mode write command E, the page-mode close command PC is applied to the command decoder 2. Then, the address latch&comparators 6 and 7 supply the predecoders 20-1 and 20-2 in the bank (0) circuit 14 with the address E latched when the previous page-mode write command E is supplied.

The predecoders 20-1 and 20-2 supplied with the address signal E from the address latch&comparators 6 and 7 predecode the address signal E, and supply the predecoded address signal E to the block decoder 19, the word decoder 21, the ¼ decoder 22, the BLT decoder 23, the S/A generating unit 24, and the column decoder 25. The data supplied to the data input buffer 11 associated with the page-mode write command E is supplied to the write data buffer 28 via the data converter 10, and is then supplied to the read/write buffer 27 from the write data buffer 28.

When the column line select signal CL is enabled based on the predecoded address E, the data E latched in the read/write buffer 27 is stored in the capacitor 501 via the bit lines BL and /BL. Then, the device shifts to the normal mode from the page mode, and write commands F and G are processed in the same manner as the above-mentioned write command B.

A description will now be given of a sequence in which the page-mode write command is supplied and immediately write data written by the above page-mode write command is read by the page-mode read command.

Figure 20:
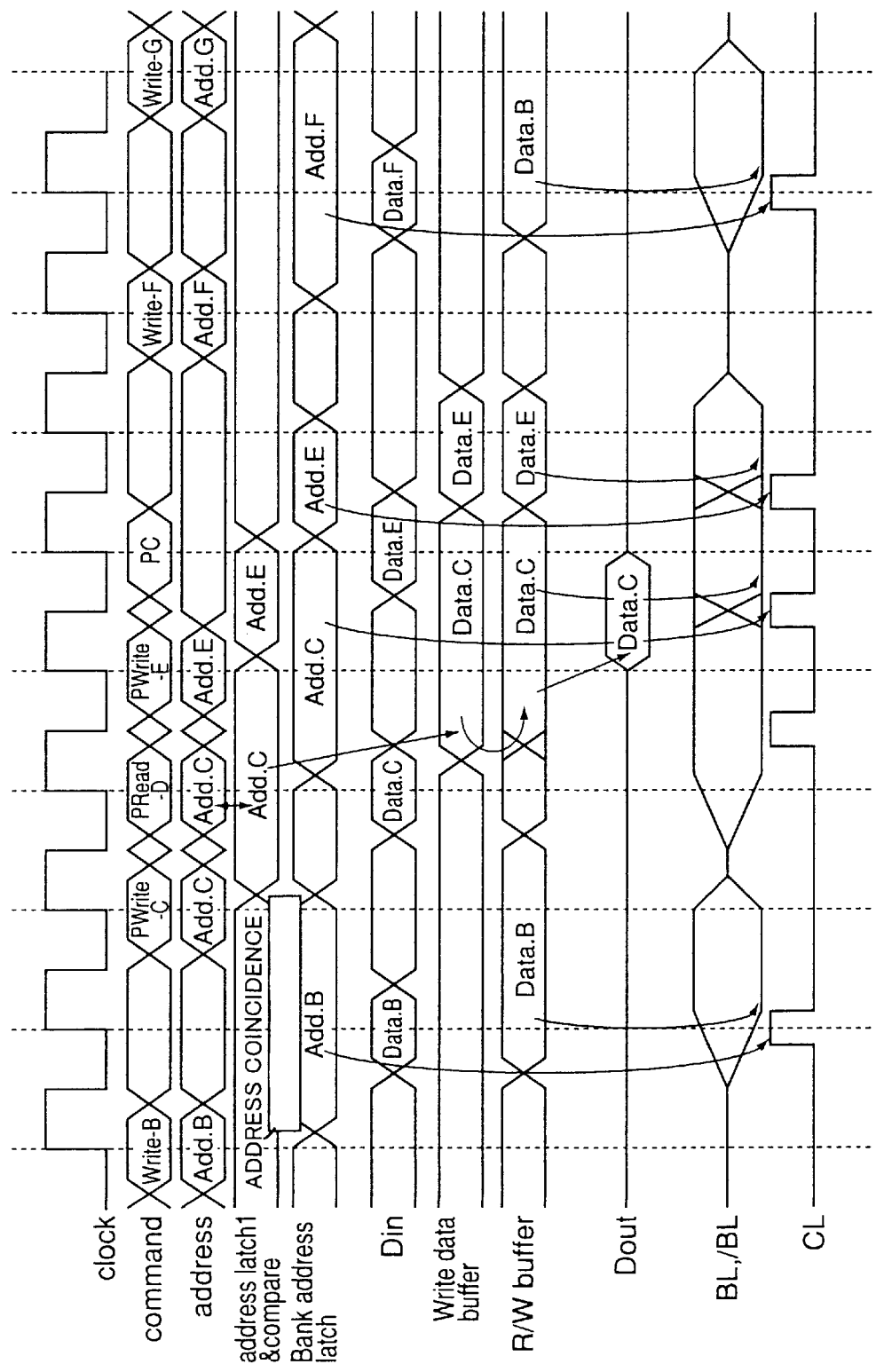
FIG. 20 is a timing chart of another sequence of successively executing a page-mode write command and a page-mode read command in the semiconductor memory device shown in FIG. 5.

FIG. 20 is a timing chart of successively receiving the page-mode write command and the page-mode read command in the FCRAM shown in FIG. 5. The clock cycle shown in FIG. 20 is twice that shown in FIG. 4, and the read data latency and the write data latency are equal to 1.

As has been described with reference to FIG. 18, the write command B is applied to the command decoder 2, and the column line select signal CL is enabled based on the predecoded address signal B. Then, the data B latched in the read/write buffer 27 is stored in the capacitor 501 via the bit lines BL and /BL.

After two clocks subsequent to the write command B, the page-mode write command C is supplied to the command decoder 2, and the address signal C is supplied to the row address buffer 4 and the column address buffer 5. Then, the address latch&comparators 6 and 7 latch the address signal C supplied together with the present page-mode write command C. The present page-mode write command C is the first command which shifts the mode of the device from the normal mode to the page mode, and continues the corresponding word line in an activated state until the page-mode close command is received.

After one clock following the page-mode write command C, the command decoder 2 is supplied with the page-mode read command D, and the row address buffer 4 and the column address buffer 5 are supplied with the address signal C. Then, the address latch&comparators 6 and 7 compare the address signal C latched when the previous page-mode write command C is supplied with the address signal C latched associated with the present page-mode read command D.

Since both the address signals C coincide with each other, the control unit 26 included in the bank (0) circuit 14 is supplied with the signal indicative of the address coincidence. The control unit 26 outputs the data C, which received via the data input buffer together with the previous page-mode write command C and is supplied to the write data buffer 28 via the data converter 10, to the outside of the FCRAM via the read/write buffer 27 and the data converter 12.

When the command decoder 2 receives the page-mode write command and then the page-mode read command, the address latch&comparators 6 and 7 continue to latch the address signal latched at the time of receiving when the page-mode write command until the next page-mode write command is received.

After one clock following the page-mode read command D, the page-mode write command E is applied to the command decoder 2, and the address signal E is applied to the row address buffer 4 and the column address buffer 5. Then, the address latch&comparators 6 and 7 supply the predecoders 20-1 and 20-2 in the bank (0) circuit 14 with the address signal C latched when the previous page-mode write command C is supplied, and latch the present page-mode write command E.

The predecoders 20-1 and 20-2 supplied with the address signal C from the address latch&comparators 6 and 7 predecode the address signal C, and supply the predecoded address signal C to the block decoder 19, the word decoder 21, the ¼ decoder 22, the BLT decoder 23, the S/A generating unit 24, and the column decoder 25.

When the column line select signal CL is enabled based on the predecoded address C, the data C latched in the read/write buffer 27 is stored in the capacitor 501 via the bit lines BL and /BL.

The predecoders 20-1 and 20-2 supplied with the address signal E from the address latch&comparators 6 and 7 predecode the address signal E, and supply the predecoded address signal E to the block decoder 19, the word decoder 21, the ¼ decoder 22, the BLT decoder 23, the S/A generating unit 24, and the column decoder 25. The data supplied to the data input buffer 11 associated with the page-mode write command E is supplied to the write data buffer 28 via the data converter 10, and is then supplied to the read/write buffer 27 from the write data buffer 28.

When the column line select signal CL is enabled based on the predecoded address E, the data E latched in the read/write buffer 27 is stored in the capacitor 501 via the bit lines BL and /BL. Then, the device shifts to the normal mode from the page mode, and write commands F and G are processed in the same manner as the above-mentioned write command B.

The above description is directed to the case where, when the write data written by the page-mode write command is read by the subsequent page-mode read command within the same bank, data is not read from the memory cells of the core circuit 29 but is read from the write data buffer 28. Thus, it is possible to start the page-mode read command before the process of writing data into the memory cells by the page-mode write command is completed and to thus reduce the read-write cycle.

Figure 21:
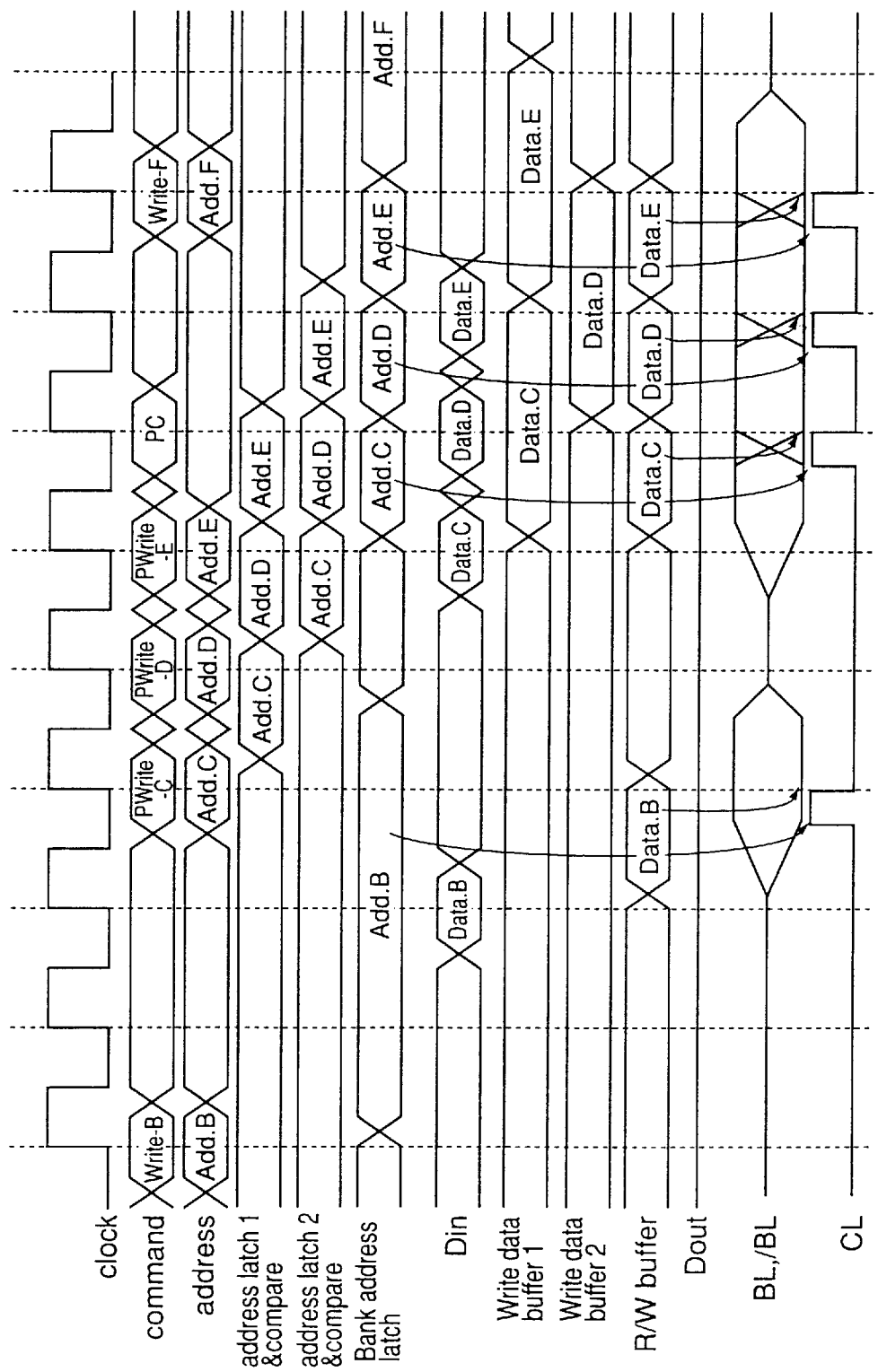
FIG. 21 is a timing chart of a sequence of successively executing page-mode write commands in the semiconductor memory device shown in FIG. 12.

A description will now be given, with reference to FIG. 21, of a page-mode write successive sequence performed in the aforementioned semiconductor memory device shown in FIG. 12 having the two write data buffers 32 and 33. In FIG. 21, the clock cycle is twice that shown in FIG. 4, and the read data latency and the write data latency are both equal to 2.

After three clocks subsequent to the write command B, the page-mode write command C is supplied to the command decoder 2, and the address signal C is supplied to the row address buffer 4 and the column address buffer 5. Then, the address latch&comparators 31 and 32 latch, in the first parts, the address signal C supplied together with the present page-mode write command C. The present page-mode write command C is the first command which shifts the mode of the device from the normal mode to the page mode, and continues the corresponding word line in an activated state until the page-mode close command is received.

After one clock following the page-mode write command C, the page-mode write command D is supplied to command decoder 2, and the address signal D is supplied to the row address buffer 4 and the column address buffer 5. Then, the address latch&comparators 30 and 31 latch, in the second parts, the address signals C latched in the first parts when the previous page-mode write command C is supplied, and latch the address signal D associated with the present page-mode write command D in the first part.

After one clock following the page-mode write command D, the page-mode write command E is applied to the command decoder 2, and the address signal E is supplied to the row address buffer 4 and the column address buffer 5. Then, the double address latch&comparators 30 and 31 latch, in the second parts, the address signal D latched in the first part when the previous page-mode write command D is received, and latch the address signal E in the first parts. At that time, the address signals C latched in the second parts are supplied to the predecoders 20-1 and 20-2 in the bank (0) circuit 14.

The predecoders 20-1 and 20-2 supplied with the address signals C from the double address latch&comparators 30 and 31 predecode the address signals C, and supply the predecoded address signals to the block decoder 19, the word decoder 21, the ¼ decoder 22, the BLT decoder 23, the S/A generating unit 24, and the column decoder 25.

The data C supplied to the data input buffer 11 associated with the page-mode write command C is supplied to the write data buffer 32 ia the data converter 10, and is then supplied to the read/write buffer 27 from the wrtie data buffer 32.

When the column line select signal CL is selected based on the predecoded address signal C, the data C held in the read/write buffer 27 is stored in the capacitor 501 via the bit lines BL and /BL.

After one clock following the page-mode write command E, the page-mode close command PC is applied to the command decoder 2. Then, the address latch&comparators 30 and 31 latch, in the second parts, the address signal E latched in the first parts when the previous page-mode write command E is supplied. At that time, the address signals D latched in the second parts are supplied to the predecoders 20-1 and 20-2 in the bank (0) circuit 14.

The predecoders 20-1 and 20-2 supplied with the address signal D from the double address latch&comparators 30 and 31 predecode the address signal D, and supply the predecoded address signal D to the block decoder 19, the word decoder 21, the ¼ decoder 22, the BLT decoder 23, the S/A generating unit 24, and the column decoder 25.

The data D applied to the data input buffer 11 associated with the page-mode write command D is supplied to the write data buffer 33 via the data converter 10, and is then supplied to the read/write buffer 27 from the write data buffer 33.

When the column line select signal CL is enabled based on the predecoded address signal D, the data D latched in the read/write buffer 27 is stored in the capacitor 501 via the bit lines BL and /BL.

After one clock subsequent to the page-mode close command PC, the double address latch&comparators 30 and 31 supply the address signals E latched in the second parts to the predecoders 20-1 and 20-2 in the bank (0) circuit 14.

The predecoders 20-1 and 20-2 supplied with the address signal E from the double address latch&comparators 30 and 31 predecode the address signal E, and supply the predecoded address signal E to the block decoder 19, the word decoder 21, the ¼ decoder 22, the BLT decoder 23, the S/A generating unit 24, and the column decoder 25.

The data E applied to the data input buffer 11 based on the page-mode write command E is supplied to the write data buffer 32 via the data converter 10, and is then supplied to the read/write buffer 27 from the write data buffer 32.

When the column line select signal CL is enabled based on the predecoded address signal E, the data E latched in the read/write buffer 27 is stored in the capacitor 501 via the bit lines BL and /BL.

Figure 2:
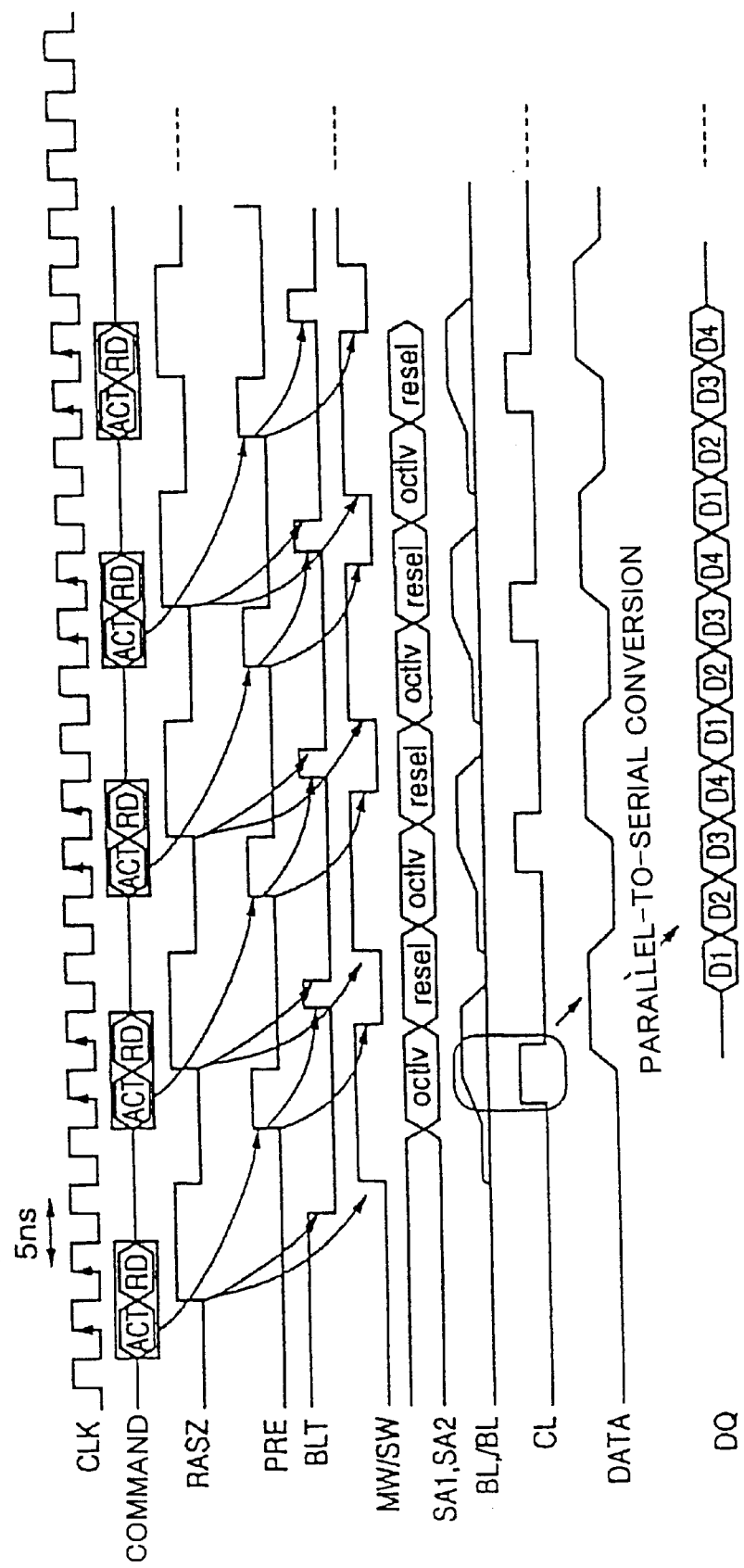
FIG. 2 is a timing chart of a data read operation of the FCRAM having the configuration shown in FIG. 1.
Figure 3:
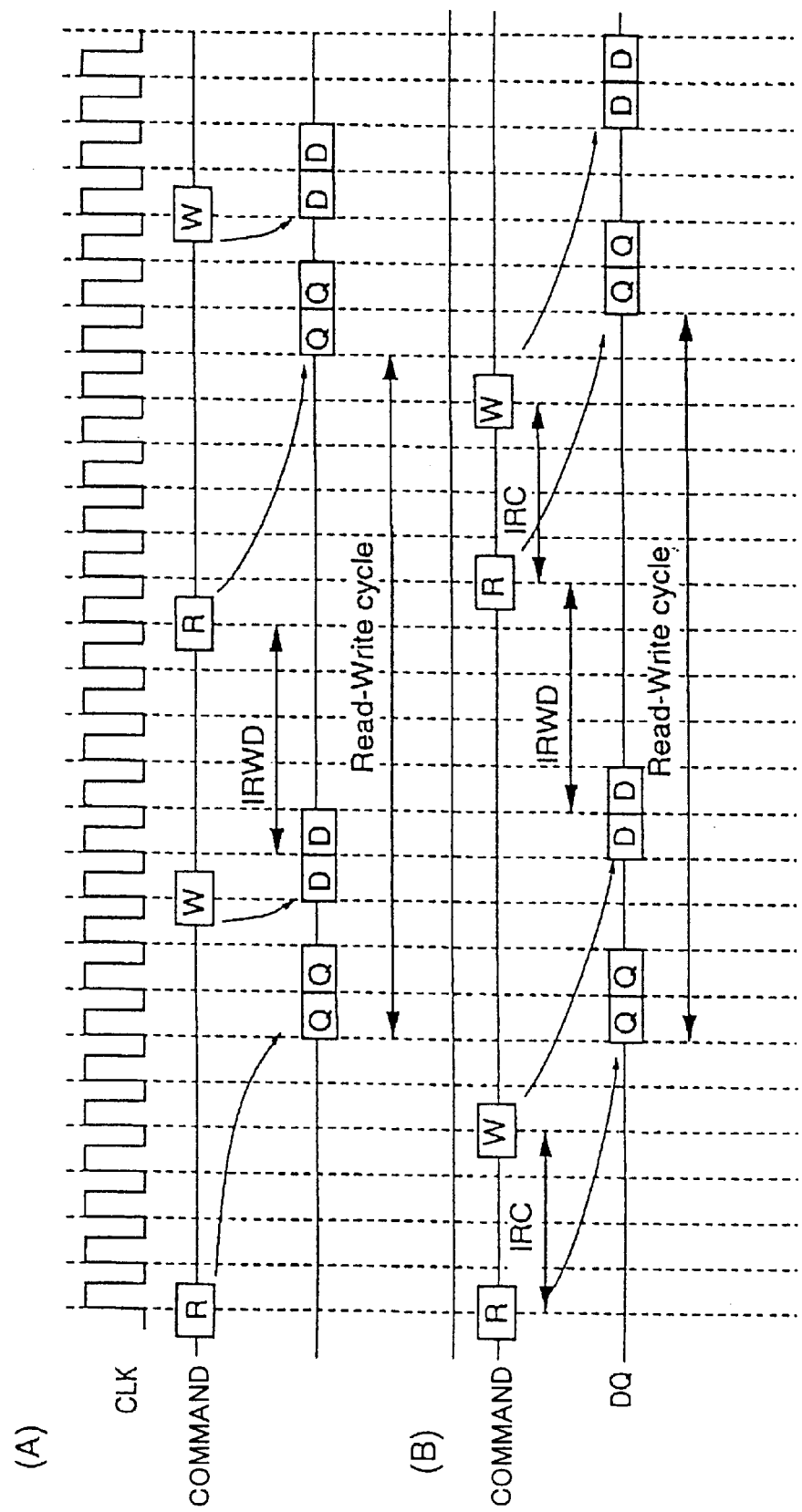
FIG. 3 is a timing chart of a sequence of alternating a read operation and a write operation.
Figure 22:
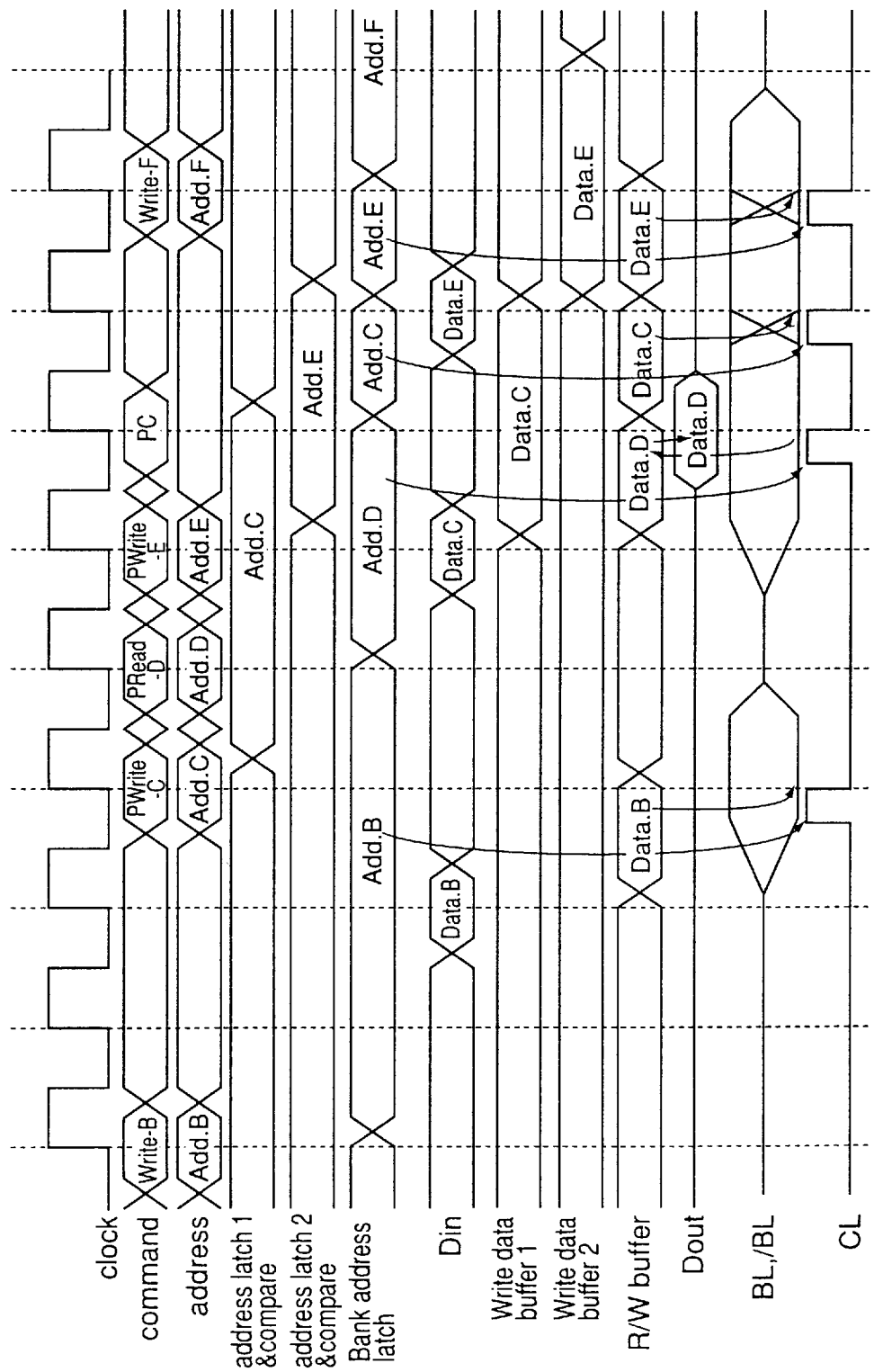
FIG. 22 is a timing chart of a sequence of successively executing a page-mode write command and a page-mode read command in the semiconductor device shown in FIG. 12.

FIG. 22 is a timing chart of a sequence in which the page-mode write command and the page-mode read command are successively supplied to the FCRAM shown in FIG. 12. In FIG. 22, the clock cycle is twice that shown in FIG. 2, and the read data latency and the write data latency are equal to 2.

After three clocks subsequent to the write command B, the page-mode write command C is supplied to the command decoder 2, and the address signal C is supplied to the row address buffer 4 and the column address buffer 5. Then, the address latch&comparators 31 and 32 latch, in the first parts, the address signal C supplied together with the present page-mode write command C. The present page-mode write command C is the first command which shifts the mode of the device from the normal mode to the page mode, and continues the corresponding word line in an activated state until the page-mode close command is received.

After one clock following the page-mode write command C, the page-mode read command D is supplied to command decoder 2, and the address signal D is supplied to the row address buffer 4 and the column address buffer 5. Then, the address latch&comparators 30 and 31 compare the address signals C latched when the previous page-mode write command C is supplied with the address signal D supplied associated with the present page-mode read command D.

Since the address signals C and D differ from each other, the address signal D received when the present page-mode read command D is supplied is applied to the predecoders 20-1 and 20-2. The double address latch&comparators 30 and 31 continue to latch the address signal C acquired when the previous page-mode write command C is supplied.

The predecoders 20-1 and 20-2 supplied with the address signal D predecode the address signal D, and supply the predecoded address signal D to the block decoder 19, the word decoder 21, the ¼ decoder 22, the BLT decoder 23, the S/A generating unit 24, and the column decoder 25.

When the column line select signal CL is enabled based on the predecoded address signal D, the data in the capacitor 501 is read to the bit lines BL and /BL, and is then read to the data bus lines DB and /DB via the NMOS transistors 510 and 511. Then, the data on the data bus lines DB and /DB is supplied to the read/write buffer 27, and is output to the outside of the FCRAM from the data output buffer 13 via the data converter 12.

After one clock subsequent to the page-mode write command D, the page-mode write command E is applied to the command decoder 2, and the address signal E is supplied to the row address buffer 4 and the column address buffer 5. Then, the double address latch&comparators 30 and 31 supply the redecoder 20-1 and 20-2 in the bank (0) circuit 14 with the address signal C latched when the previous page-mode write command C is supplied, and latch the address signal E associated with the present page-mode write command E in the second parts.

The predecoders 20-1 and 20-2 supplied with the address signals C from the double address latch&comparators 30 and 31 predecode the address signal C, and supply the predecoded address signal C to the block decoder 19, the word decoder 21, the ¼ decoder 22, the BLT decoder 23, the S/A generating unit 24, and the column decoder 25.

The data C applied to the data input buffer 11 associated with the page-mode write command C is supplied to the write data buffer 32 via the data converter 10, and is then supplied to the read/write buffer 27 from the write data buffer 32.

When the column line select signal CL is enabled based on the predecoded address signal C, the data latched in the read/write buffer 27 is stored in the capacitor 501 via the bit lines BL and /BL.

After one clock following the page-mode write command e, the page mode close signal PC is applied to the command decoder 2. Then, the double address latch&comparators 30 and 31 supply the predecoders 20-1 and 20-2 in the bank (0) circuit 14 with the address signal latched in the second parts at the time of receiving the previous page-mode write command E.

The predecoders 20-1 and 20-2 supplied with the address signal E from the double address latch&comparators 30 and 31 predecode the address signal E, and supply the predecoded address signal E to the block decoder 19, the word decoder 21, the ¼ decoder 22, the BLT decoder 23, the S/A generating unit 24, and the column decoder 25. The data E applied to the data input buffer 11 associated with the page-mode write command E is supplied to the write data buffer 33 via the data converter 10, and is then supplied to the read/write buffer 27 from the write data buffer 33.

When the column line select signal CL is enabled based on the predecoded address signal E, the data E latched in the read/write buffer 27 is stored in the capacitor 501 via the bit lines BL and /BL. Then, the device shifts to the normal mode from the page made, and the write command F is processed in the same manner as the write command B.

A description will now be given, with reference to FIG. 23, of a sequence in which the page-mode write command is executed and the write data written thereby is immediately read by the subsequent page-mode read command.

Figure 23:
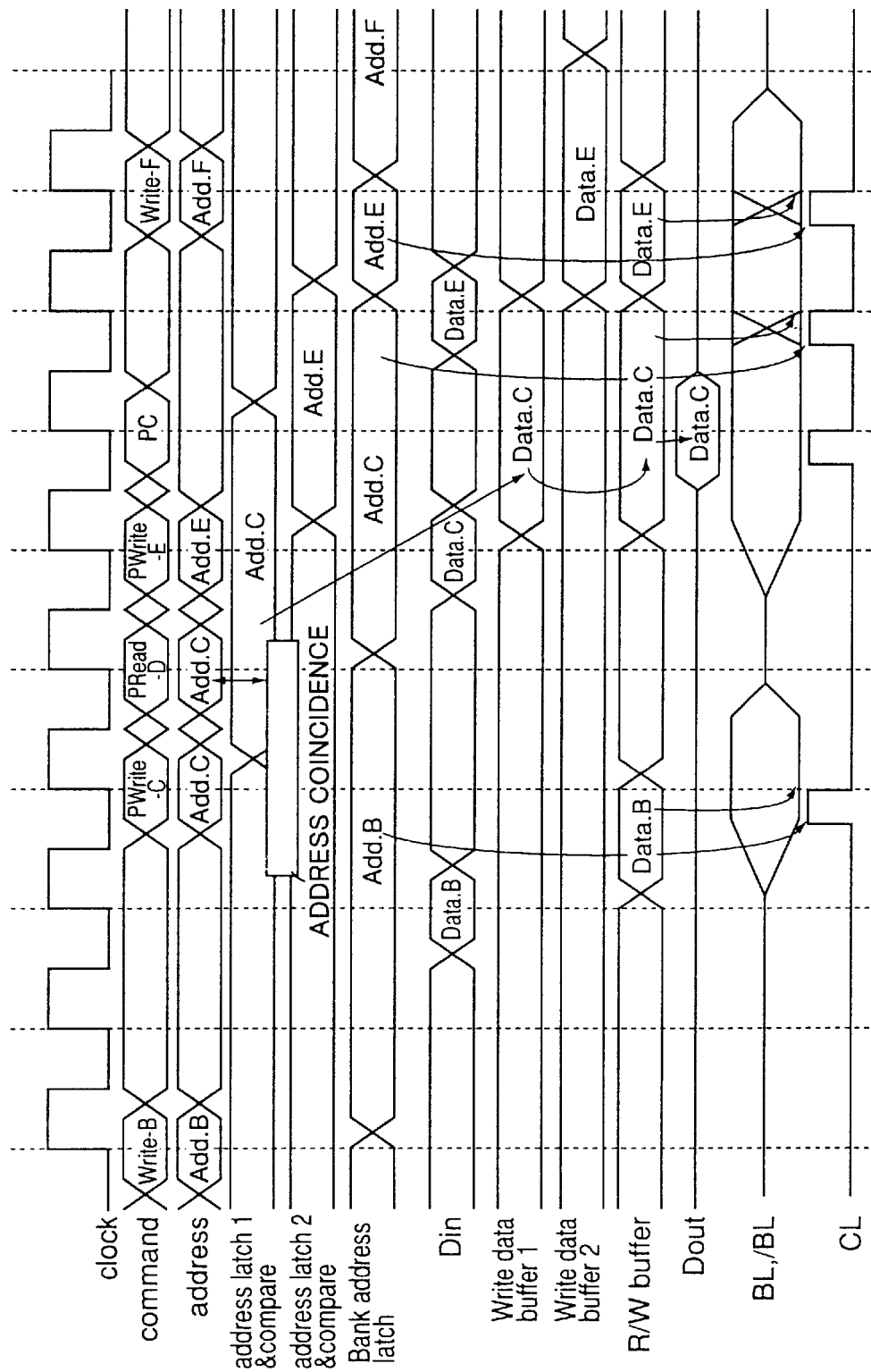
FIG. 23 is a timing chart of another sequence of successively executing a page-mode write command and a page-mode read command in the semiconductor device shown in FIG. 12.

FIG. 23 is a timing chart of a sequence of successively receiving the page-mode write command and the page-mode read command. In FIG. 23, the clock cycle is twice that shown in FIG. 4, and the read data latency and the write data latency are equal to 2.

After three clocks subsequent to the write command B, the page-mode write command C is supplied to the command decoder 2, and the address signal C is supplied to the row address buffer 4 and the column address buffer 5. Then, the address latch&comparators 31 and 32 latch, in the first parts, the address signal C supplied together with the present page-mode write command C. The present page-mode write command C is the first command which shifts the mode of the device from the normal mode to the page mode, and continues the corresponding word line in an activated state until the page-mode close command is received.

After one clock following the page-mode write command C, the page-mode read command D is supplied to command decoder 2, and the address signal C is supplied to the row address buffer 4 and the column address buffer 5. Then, the address latch&comparators 30 and 31 compare the address signals C latched when the previous page-mode write command C is supplied with the address signal C supplied associated with the present page-mode read command D.

Since both the address signals C coincide with each other, the control unit 26 included in the bank (0) circuit 14 is supplied with the signal indicative of the address coincidence. The control unit 26 outputs the data C, which received via the data input buffer together with the previous page-mode write command C and is supplied to the write data buffer 28 via the data converter 10, to the outside of the FCRAM via the read/write buffer 27 and the data converter 12.

When the command decoder 2 receives the page-mode write command and then the page-mode read command, the address latch&comparators 30 and 31 continue to latch the address signal latched at the time of receiving when the page-mode write command until the next page-mode write command is received.

Then, the page-mode write command E and the page-mode close command PC are received and executed in the same manner as has been described with reference to FIG. 22.

As described above with reference to FIGS. 21–23, when the write data written by the page-mode write command is read by the subsequent page-mode read command within the same bank, data is not read from the memory cells of the core circuit 29 but is read from the write data buffer 28. Thus, it is possible to start the page-mode read command before the process of writing data into the memory cells by the page-mode write command is completed and to thus reduce the read-write cycle.

Thus, even if the read latency and the write latency become long in a case where the clock cycle is long, it will be possible to reduce the read-write cycle with the plurality of write buffers 32 and 33.

Figure 24:
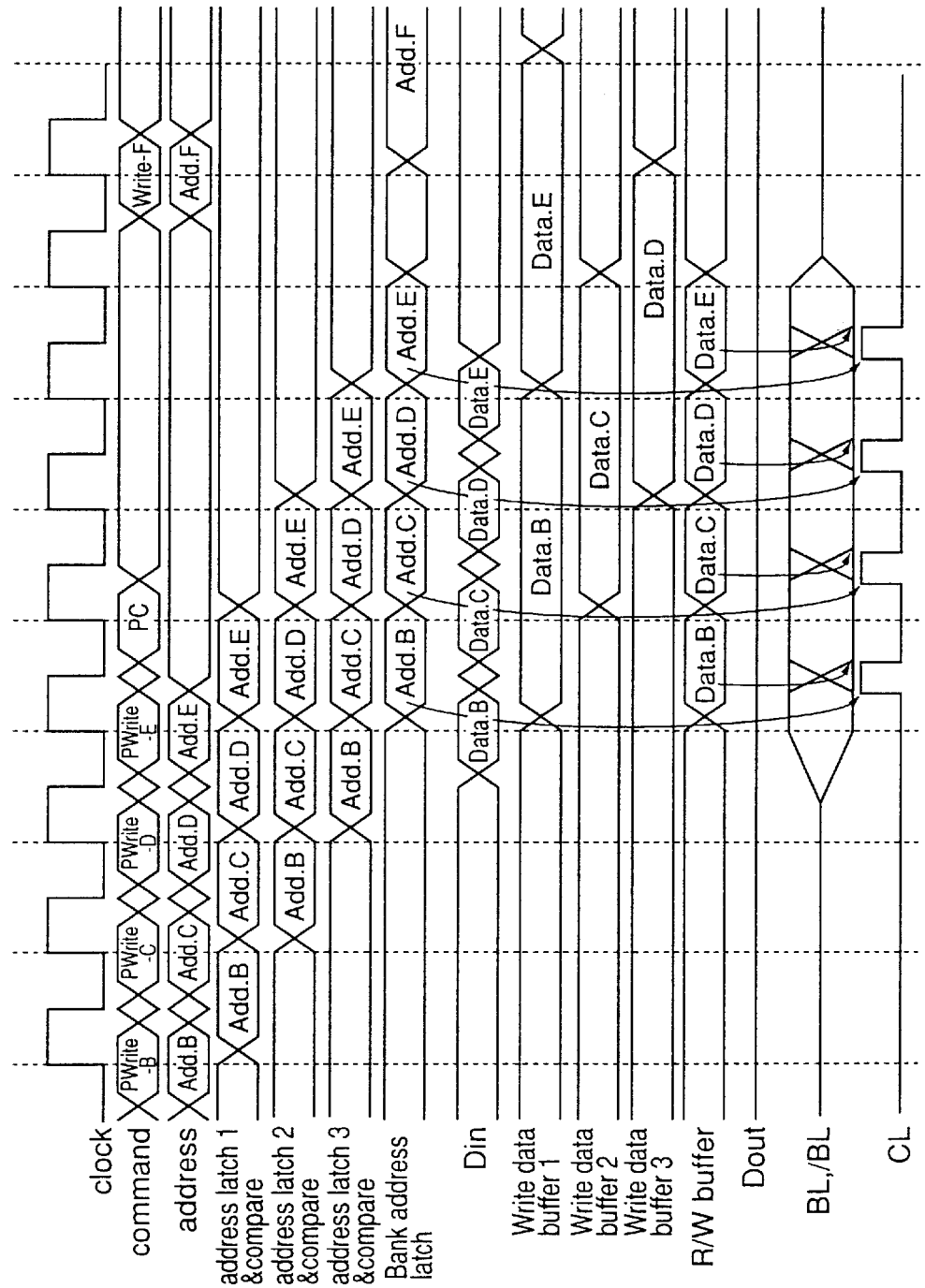
FIG. 24 is a timing chart of a sequence of successively executing page-mode write commands in the semiconductor memory device shown in FIG. 16.

FIG. 24 is a timing chart of a page-mode write successive sequence performed in the semiconductor memory device shown in FIG. 16 having the three write data buffers 32, 33 and 37. In FIG. 24, the clock cycle is twice that shown in FIG. 4, and the read data latency and the write data latency are equal to 3.

The page-mode write command B is applied to the command decoder 2, and the associated address signal B is applied to the row address buffer 4 and the column address buffer 5. Then, the triple address latch&comparators 35 and 36 latch the address signal B in the first parts thereof. The present page-mode write command B is the first page-mode command which shifts the device from the normal mode to the page mode, and continues the corresponding word line in an activated state until the page-mode close command is received.

After one clock subsequent to the page-mode write command B, the command decoder 2 is supplied with the page-mode write command C, and the address signal C is applied to the row address buffer 4 and the column address buffer 5. Then, the triple address latch&comparators 35 and 36 latch, in the second parts, the address signal B latched in the first parts when the previous page-mode write command B is received, and latch the address signal C in the first parts.

After one clock following the page-mode write command C, the page-mode write command D is applied to the command decoder 2, and the address signal D is applied to the row address buffer 4 and the column address buffer 5. Then, the triple address latch&comparators 35 and 36 latch, in the second parts, the address signal C latched in the first parts when the previous page-mode write command C is supplied, and latch the address signal D in the first parts. Further, the address signal B latched in the second part when the previous page-mode write command C is received is latched in the third parts of the triple address latch&comparators 35 and 36.

After one clock following the page-mode write command D, the page-mode write command E is applied to the command decoder 2, and the address signal E is applied to the row address buffer 4 and the column address buffer 5.

Then, the triple address latch&comparators 35 and 36 latch, in the second parts, the address signal D latched in the first parts when the previous page-mode write command D is received, and latch the address signal E in the first parts. Further, the address signal C latched in the second parts when the previous page-mode write command D is received is latched in the third parts, and the address signals B latched in the third parts are supplied to the predecoders 20-1 and 20-2.

The predecoders 20-1 and 20-2 supplied with the address signal B from the triple address latch&comparators 35 and 36 predecode the address signal B, and supply the predecoded address signal B to the block decoder 19, the word decoder 21, the ¼ decoder 22, the BLT decoder 23, the S/A generating unit 24, and the column decoder 25.

The data B applied to the data input buffer 11 associated with the page-mode write command B is supplied to the write data buffer 32 via the data converter 10, and is then supplied to the read/write buffer 27 from the write data buffer 32.

When the column line select signal C is enabled based on the predecoded address signal B, the data B latched in the read/write buffer 27 is stored in the capacitor 501 via the bit lines BL and /BL.

After one clock following the page-mode write command E, the page-mode close command PC is applied to the command decoder 2. Then, the triple address latch&comparators 35 and 36 latch, in the second parts, the address signal E latched in the first parts when the previous page-mode write command E is received. The address signal D latched in the second parts when the previous page-mode write command E is latched in the third parts. Further, the address signal C latched in the third parts is supplied to the predecoders 20-1 and 20-2 included in the bank (0) circuit 14.

The predecoders 20-1 and 20-2 supplied with the address signal C from the triple address latch&comparators 35 and 36 predecode the address signal C, and supply the predecoded address signal C to the block decoder 19, the word decoder 21, the ¼ decoder 22, the BLT decoder 23, the S/A generating unit 24, and the column decoder 25.

The data applied to the data input buffer 11 associated with the page-mode write command C is supplied to the write data buffer 33 via the data converter 10, and is then supplied to the read/write buffer 27 from the write data buffer 33.

When the column line select signal CL is enabled based on the predecoded address signal C, the data latched in the read/write buffer 27 is stored in the capacitor 501 via the bit lines BL and /BL.

The above-mentioned sequence is repeated until there are no address signals latched in the triple address latch&comparators 35 and 36. Thus, the page-mode write successive sequence can be achieved.

Figure 25:
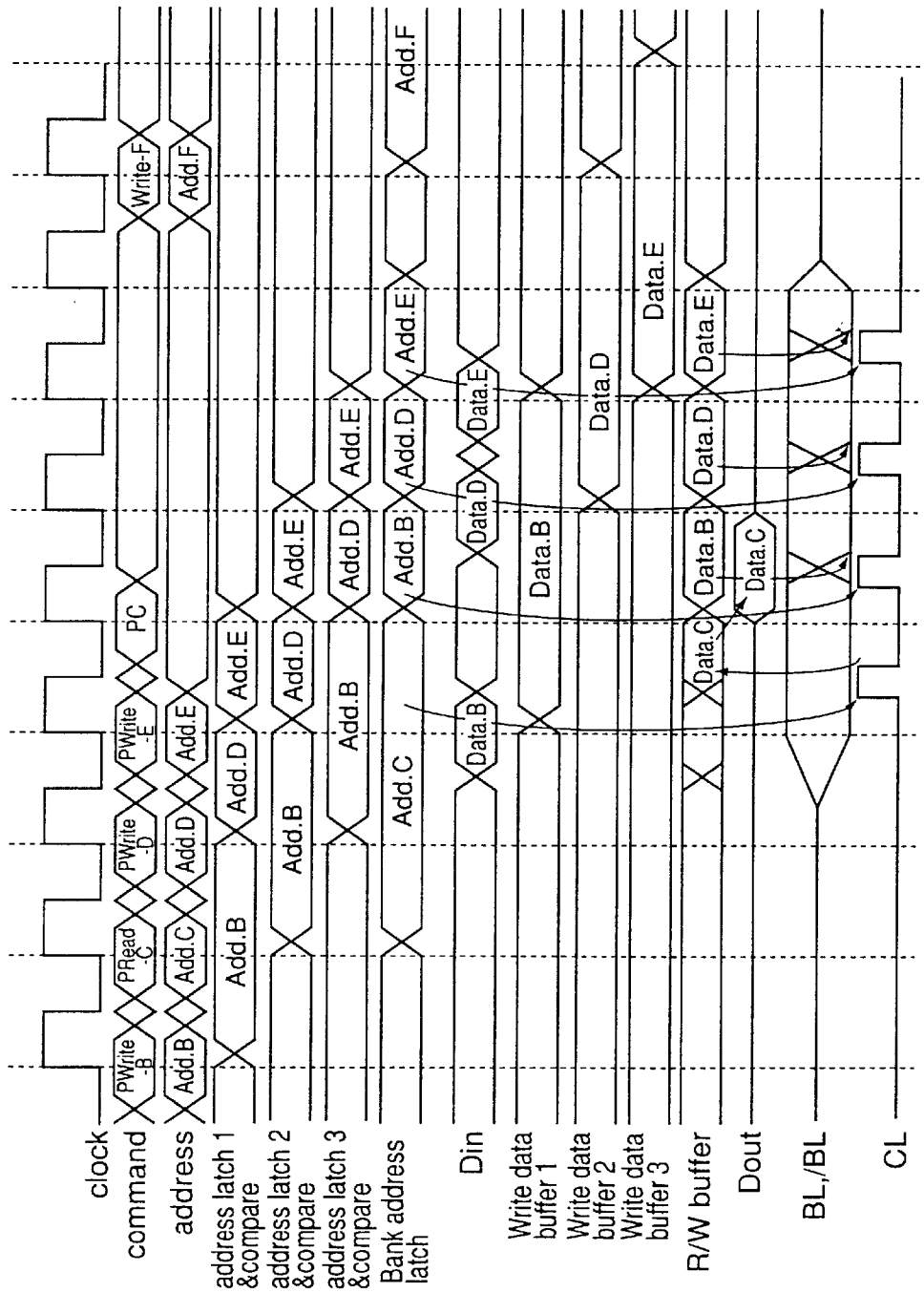
FIG. 25 is a timing chart of a sequence of successively executing a page-mode write command and a page-mode read command in the semiconductor device shown in FIG. 16.

FIG. 25 is a timing chart of a sequence in which the page-mode write command and the page-mode read command are successively supplied. In FIG. 25, the clock cycle is twice that shown in FIG. 4, and the read data latency and the write data latency are equal to 3.

The page-mode write command B is applied to the command decoder 2, and the associated address signal B is applied to the row address buffer 4 and the column address buffer 5. Then, the triple address latch&comparators 35 and 36 latch the address signal B in the first parts thereof. The present page-mode write command B is the first page-mode command which shifts the device from the normal mode to the page mode, and continues the corresponding word line in an activated state until the page-mode close command is received.

After one clock subsequent to the page-mode write command B, the command decoder 2 is supplied with the page-mode write command C, and the address signal C is applied to the row address buffer 4 and the column address buffer 5. Then, the triple address latch&comparators 35 and 36 compare the address signal B latched in the first parts when the previous page-mode write command B is received with the address signal C associated with the present page-mode read command C.

Since the address signals B and C differ from each other, the address signal C received when the present page-mode read command C is supplied is applied to the predecoders 20-1 and 20-2. The double address latch&comparators 35 and 36 continue to latch the address signal B acquired when the previous page-mode write command B is supplied.

The predecoders 20-1 and 20-2 supplied with the address signal C predecode the address signal C, and supply the predecoded address signal C to the block decoder 19, the word decoder 21, the ¼ decoder 22, the BLT decoder 23, the S/A generating unit 24, and the column decoder 25.

When the column line select signal CL is enabled based on the predecoded address signal C, the data in the capacitor 501 is read to the bit lines BL and /BL, and is then read to the data bus lines DB and /DB via the NMOS transistors 510 and 511. Then, the data on the data bus lines DB and /DB is supplied to the read/write buffer 27, and is output to the outside of the FCRAM from the data output buffer 13 via the data converter 12.

After one clock subsequent to the page-mode read command C, the page-mode write command D is applied to the command decoder 2, and the address signal D is supplied to the row address buffer 4 and the column address buffer 5. Then, the double address latch&comparators 35 and 36 latch, in the second parts, the address signal B latched when the previous page-mode write command B is supplied, and latch the address signal D in the first parts.

The following sequence is the same as that shown in FIG. 24, and a description thereof will be omitted.

A description will now be given, with reference to FIG. 26, of a sequence in which the page-mode write command is received and the write data written thereby is immediately read by the following page-mode read command.

Figure 26:
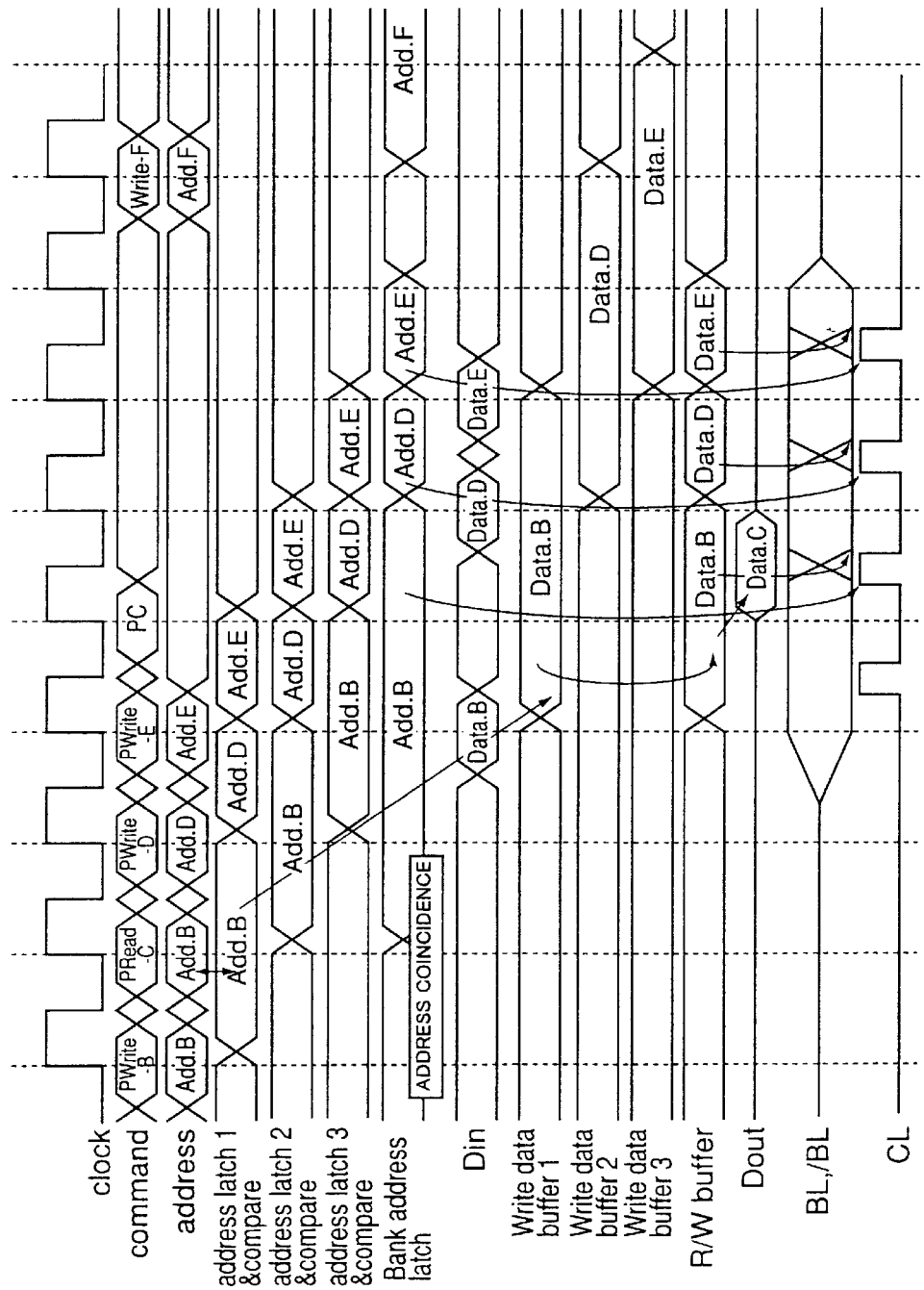
FIG. 26 is a timing chart of another sequence of successively executing a page-mode write command and a page-mode read command in the semiconductor device shown in FIG. 16.

FIG. 26 is a timing chart of a sequence of successively receiving the page-mode write command and the page-mode read command in this order. The clock cycle shown in FIG. 26 is twice that shown in FIG. 4, and the read data latency and the write data latency are equal to 3.

The page-mode write command B is applied to the command decoder 2, and the associated address signal B is applied to the row address buffer 4 and the column address buffer 5. Then, the triple address latch&comparators 35 and 36 latch the address signal B in the first parts thereof. The present page-mode write command B is the first page-mode command which shifts the device from the normal mode to the page mode, and continues the corresponding word line in an activated state until the page-mode close command is received.

After one clock subsequent to the page-mode write command B, the command decoder 2 is supplied with the page-mode write command C, and the address signal B is applied to the row address buffer 4 and the column address buffer 5. Then, the triple address latch&comparators 35 and 36 compare the address signal B latched in the first parts when the previous page-mode write command B is received with the address signal B associated with the present page-mode read command C.

Since both the addresses coincide with each other, the control unit 26 included in the bank (0) circuit 14 is supplied with the signal indicative of the address coincidence. The control unit 26 outputs the data B, which is received via the data input buffer together with the previous page-mode write command B and is supplied to the write data buffer 28 via the data converter 10, to the outside of the FCRAM from the read/write buffer 27 and the data converter 12.

When the command decoder 2 is supplied with the page-made read command following the page-mode write command, the triple address latch&comparators 35 and 36 continue to hold the address signal latched at the time of the page-mode write command until the next page-mode write command is received. The write data buffer 32 continues to latch the data B supplied together with the previous page-mode write command B.

After one clock following the page-mode read command C, the command decoder 2 is supplied with the page-mode write command D, and the address signal D is supplied to the row address buffer 4 and the column address buffer 5. Then, the triple address latch&comparators 35 and 36 latch, in the second parts, the address signal B latched in the first parts when the previous page-mode write command B is received, and latch the address signal D in the first parts.

The following sequence is the same as that shown in FIG. 24, and a description thereof will be omitted.

By the sequences shown in FIGS. 24–26, the data is not read from the core circuit 29 but is read from the write data buffer 32, 33 or 37 in the case where the write command W is applied, and the write data written by the above write command W is immediately read from the same bank by the read command R. Hence, the process resulting from the read command R can be started before the write process requested by the write command is completed.

Thus, even if the read latency and the write latency become long in a case where the clock cycle is long, it will be possible to reduce the interval between the read command R and the write command W.

The above description is directed to the FCRAM. The circuit configuration of the periphery of memory cells of the FCRAM is the same as that of the SDRAM. Thus, the present invention includes the SDRAM.

In all of the aforementioned sequences, the write data latency and the read data latency are equal to each other. However, the write data latency and the read data latency may be different from each other.

Figure 27:
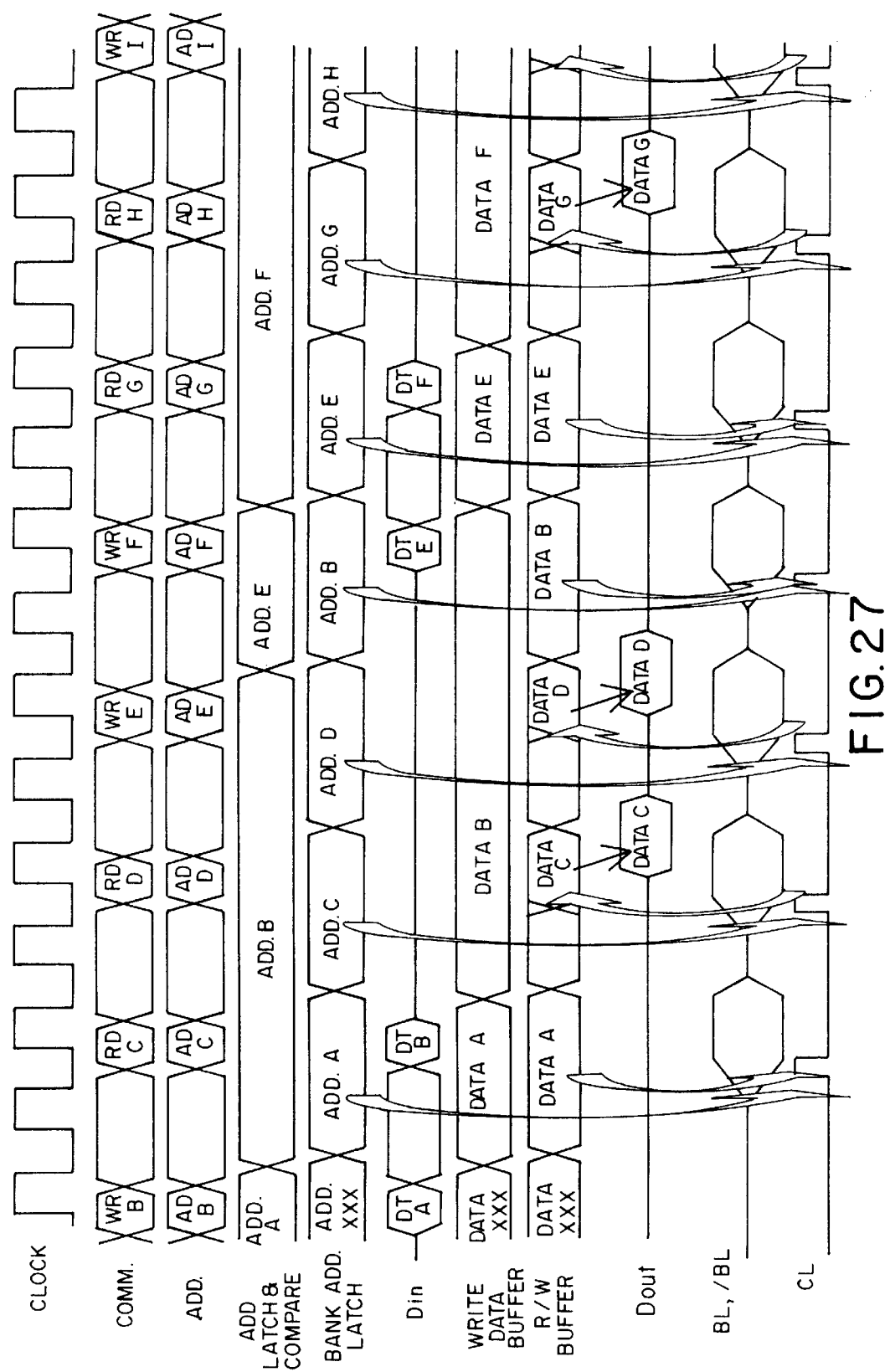
FIG. 27 is a timing chart of a sequence of successively executing write, read, read and write commands in the semiconductor memory device shown in FIG. 5, in which the write data latency and the read data latency are equal to each other.
Figure 28:
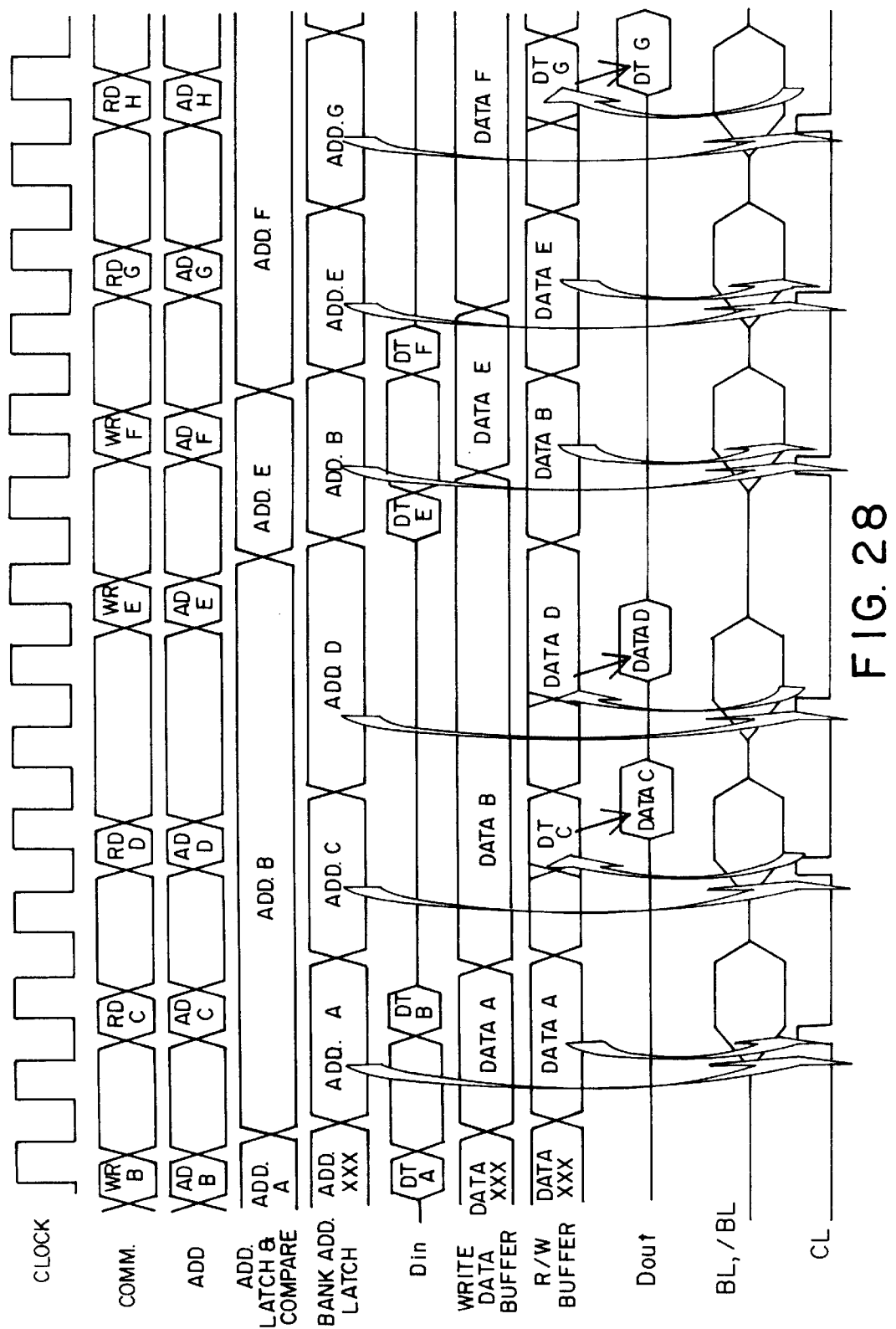
FIG. 28 is a timing chart of another sequence of successively executing write, read, read and write commands in the semiconductor memory device shown in FIG. 5 in which the write data latency differs from the read data latency.

FIG. 27 is a timing chart of a sequence of successively receiving write, read, read and write commands in the FCRAM shown in FIG. 5 in which the write data latency and the read data latency are equal to each other. The timing chart of FIG. 27 corresponds to a chart obtained by extending the timing chart of FIG. 7 along the time axis. FIG. 28 is a timing chart of a sequence of successively receiving write, read, read and write commands in the FCRAM shown in FIG. 5 in which the read data latency (CL) is equal to 2 and the write data latency (WL) is equal to 1 (WL=CL−1).

In FIG. 27, the write data latency and the read data latency are equal to 2. In FIG. 28, the write data latency is equal to 1, and the read data latency is equal to 2. The operation shown in FIG. 28 is the same as that shown in FIG. 27 except for the write data latency. Although the operation shown in FIG. 28 is slightly delayed as compared to that shown in FIG. 27, the setting of the write data latency and read data latency in the case of FIG. 28 results in advantages as will be described later.

Figure 29:
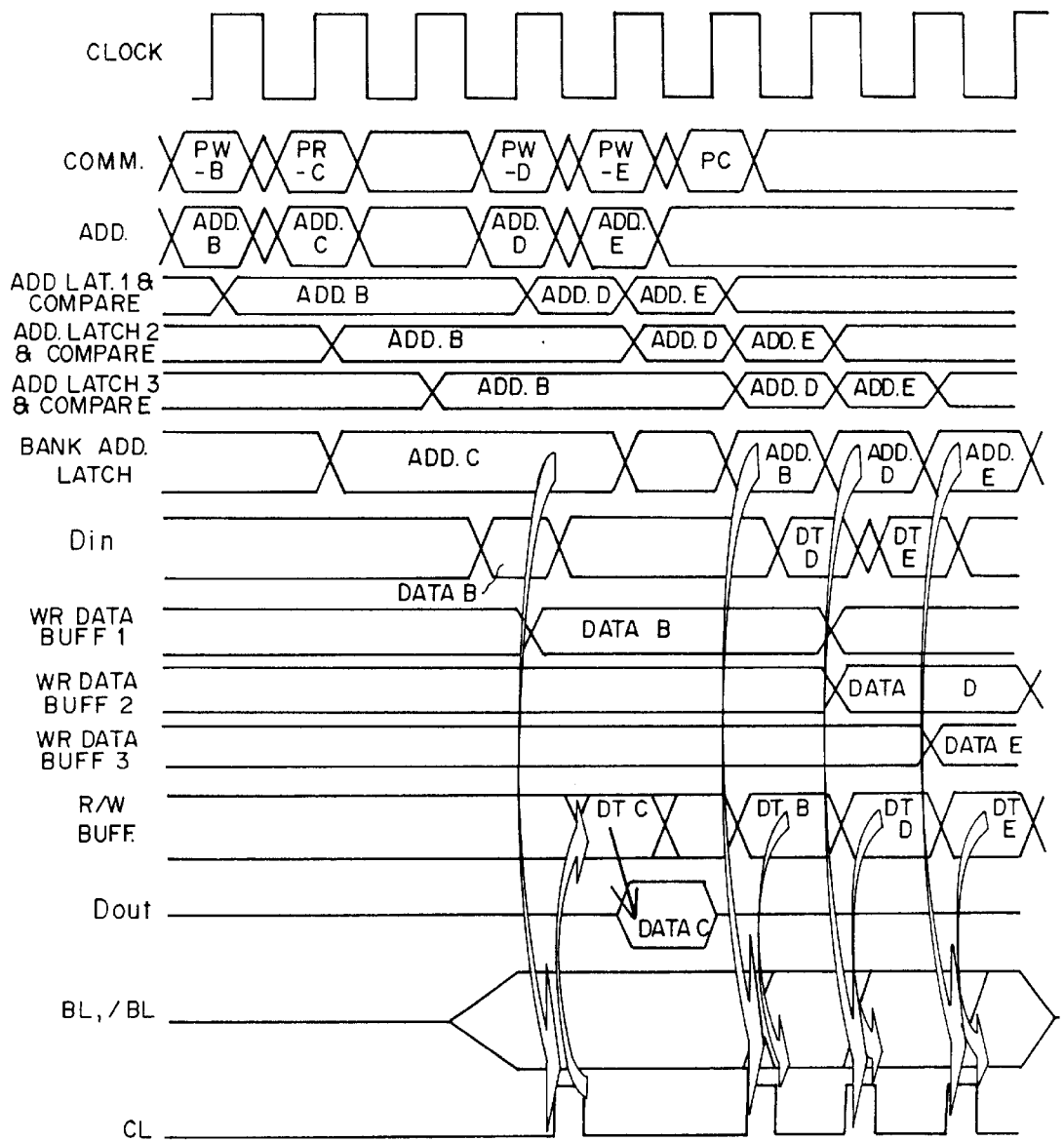
FIG. 29 is a timing chart of a sequence of successively executing a page-mode write command and a page-mode read command in the semiconductor memory device shown in FIG. 16 in which the write data latency and the read data latency are equal to each other.
Figure 30:
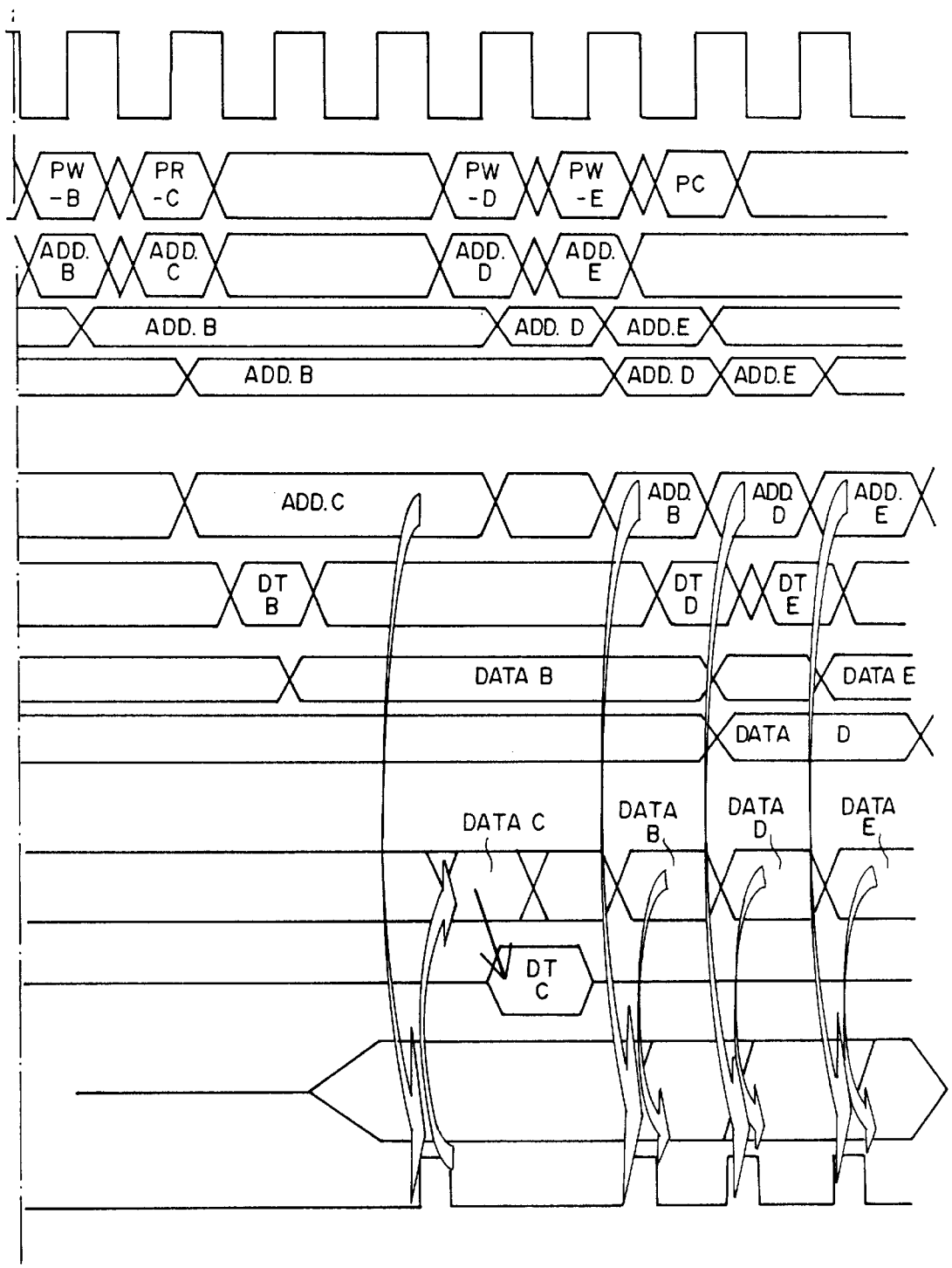
FIG. 30 is a timing chart of a sequence of successively executing the same sequence as shown in FIG. 29 in such a manner that the write data latency differs from the read data latency.

FIG. 29 is a timing chart of a sequence of successively receiving a page-mode write command and a page-mode read command in the FCRAM shown in FIG. 16, in which the write data latency and the read data latency are equal to 3. In FIG. 29, a symbol "PW" denotes a page-mode write command, and a symbol "PR" denotes a page-mode read command. The operation shown in FIG. 29 is almost the same as that shown in FIG. 25. FIG. 30 is a timing chart of the same sequence as shown in FIG. 29, in which the write data latency is equal to 2, and the read data latency is equal to 3. It can be seen from the comparison between FIGS. 29 and 30 that the operation shown in FIG. 29 performed in the FCRAM shown in FIG. 16 having the triple address latch&comparators 35 and 36 can be achieved by the FCRAM shown in FIG. 12 having the double address latch&comparators 30 and 31.

Figure 31:
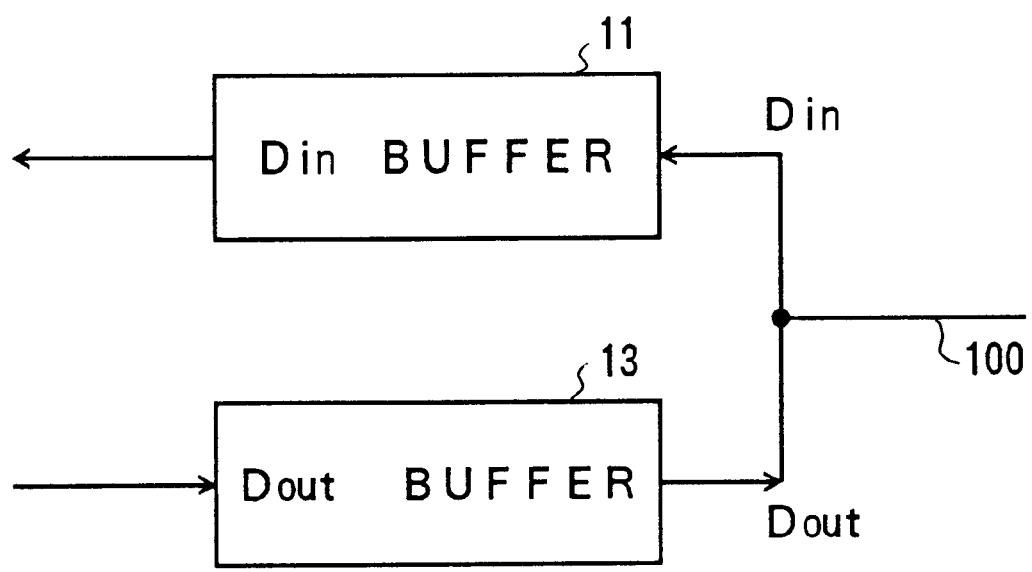
FIG. 31 is a block diagram of a common input/output interface that can be used in the semiconductor memory devices shown in FIGS. 5, 12 and 16.

The arrangement in which the write data latency and the read data latency are set to different values enhances the flexibility of the use of the bus connected to the data input and output buffers. In the case where the write data latency and the read data latency are equal to each other, input data and output data may simultaneously appear on the respective buses. For example, FIG. 19 shows input data E and output data D overlap each other. If there is a possibility that such situations as described above may occur, it is necessary to separately provide the input and output data buses respectively connected to the input and output buffers 11 and 13. In contrast, the arrangement in which the write data latency and the read data latency are set to different values makes it possible to unify the input and output data buses to provide a common data bus 100 connected in common to the input and output buffers 11 and 13, as shown in FIG. 31.

Figure 32:
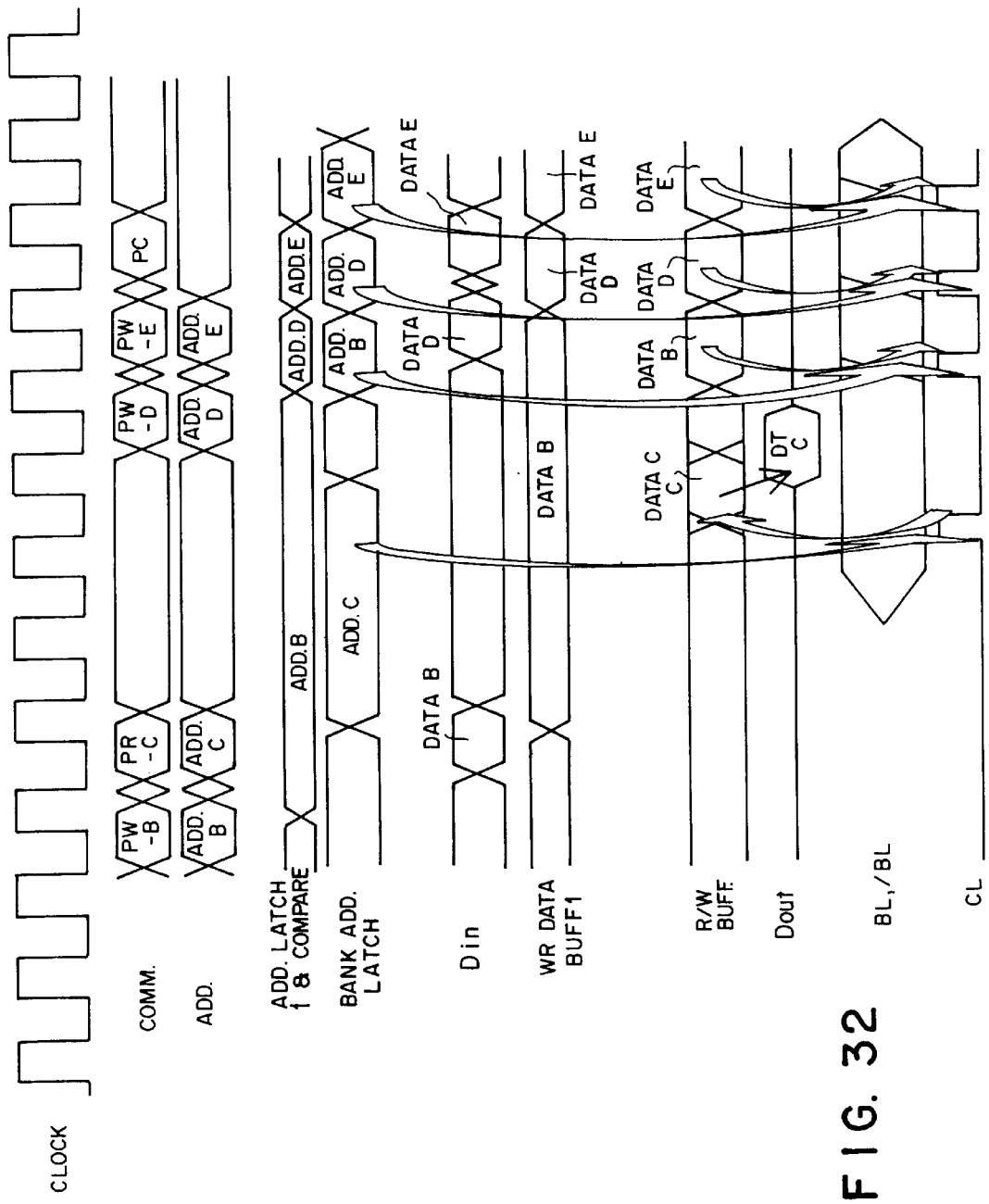
FIG. 32 is a timing chart of a sequence of successively executing a page-mode write command and a page-mode read command in the semiconductor memory device shown in FIG. 5 in which the write data latency is equal to 1 and the read data latency is equal to 3.

FIG. 32 is a timing chart of the same sequence as shown in FIGS. 29 and 30, in which the write data latency is equal to 1 and the read data latency is equal to 3. The above setting of the write and read data latencies makes it possible to achieve the same operation as shown in FIGS. 29 and 30 by the FCRAM shown in FIG. 5 having the address latch&comparators 6 and 7.

In the structures shown in FIGS. 5, 12 and 16, each of the banks is equipped with the respective write data buffers 28, 32, 33 and 37. Alternatively, the write data buffers 28, 32, 33 and 37 are commonly provided to the banks.

The present invention is not limited to the specifically disclosed embodiments, and variations and modifications may be made without departing from the scope of the present invention.

What is claimed is:

1. A semiconductor memory device operating in synchronism with a clock, comprising:

an address latch&comparator part latching a first address signal associated with a write command and comparing the first address signal with a second address signal associated with a read command; and a write data buffer part holding a data signal associated with said write command, the data signal held in the write data buffer part being read as a data signal requested by said read command when the first and second address signals coincide with each other.

2. The semiconductor memory device as claimed in claim 1, wherein a first interval between the write command and a next read command is the same as a second interval between the write command and a next write command.

3. The semiconductor memory device as claimed in claim 1, wherein a first interval between the write command and a next write command depends on an operation of a sense amplifier provided in the semiconductor memory device.

4. The semiconductor memory device as claimed in claim 1, wherein the address latch&comparator part continues to hold the address signal associated with said write command until a next write command is received.

5. The semiconductor memory device as claimed in claim 1, wherein the address latch&comparator part continues to hold the address signal associated with said write command until a read command addressed to a bank different from that addressed by said write command is received.

6. The semiconductor memory device as claimed in claim 1, wherein, when the address latch&comparator part detects that the first and second address signals coincide with each other, the data signal held in the write data buffer part is read as the data signal requested by said read command.

7. The semiconductor memory device as claimed in claim 1, wherein, when the data signal associated with the write command includes data to be masked, a part of the data signal except for the data to be masked is read from the write data buffer part.

8. The semiconductor memory device as claimed in claim 1, wherein the write command is a page-mode write command and the read command is a page-mode read command.

9. The semiconductor memory device as claimed in claim 1, wherein the address latch&comparator part continues to hold the address signal associated with said write command which is a page-mode write command until a next page-mode write command or a page-mode close command is received.

10. The semiconductor memory device as claimed in claim 1, further comprising:
a memory cell array;
a sense amplifier; and
bit lines coupled between the memory cell array and the sense amplifier.

11. The semiconductor memory device as claimed in claim 10, wherein the address latch&comparator part continues to hold the address signal associated with said write command until a next write command is received, and the data signal held in the write data buffer part is read by the address signal held in the address latch&comparator part.

12. The semiconductor memory device as claimed in claim 10, wherein the address latch&comparator part continues to hold the address signal associated with said write command until a read command addressed to a bank different from that addressed by said write command is received, and the data signal held in the write data buffer part is read by the address signal held in the address latch&comparator part.

13. The semiconductor memory device as claimed in claim 10, wherein the address latch&comparator part continues to hold the address signal associated with said write command which is a page-mode write command until a next page-mode write command or a page-mode close command is received, and the data signal held in the write data buffer part is read by the address signal held in the address latch&comparator part.

14. The semiconductor memory device as claimed in claim 1, wherein the semiconductor memory device has a write data latency different from a read data latency.

15. A semiconductor memory device operating in synchronism with a clock, comprising:
an address latch&comparator part latching first address signals associated with write commands and comparing the first address signals with a second address signal associated with a read command; and
a write data buffer part holding data signals respectively associated with said write commands,
one of the data signals held in the write data buffer part being read as a data signal requested by said read command when the second address signal coincides with one of the first address signals.

16. The semiconductor memory device as claimed in claim 15, wherein the write commands are page-mode write commands and the read command is a page-mode read command.

17. The semiconductor memory device as claimed in claim 15, wherein a first interval between the write command and a next read command is the same as a second interval between the write command and a next write command.

18. The semiconductor memory device as claimed in claim 15, wherein a first interval between the write command and a next write command depends on an operation of a sense amplifier provided in the semiconductor memory device.

19. The semiconductor memory device as claimed in claim 15, wherein the address latch&comparator part includes N first parts which latch the first address signals of the respective write commands previously received where N is an integer.

20. The semiconductor memory device as claimed in claim 19, wherein:
the write data buffer part comprises N second parts which hold the data signals associated with the respective write commands; and
one of the data signals respectively held in the N second parts is read as the data signal requested by said read command when the address signal of the read command coincides with one of the address signals held in the N first parts of the address latch&comparator part.

21. The semiconductor memory device as claimed in claim 15, further comprising:
a memory cell array;
a sense amplifier; and
bit lines coupled between the memory cell array and the sense amplifier.

22. The semiconductor memory device as claimed in claim 15, wherein the data signal associated with an oldest one of the write commands held in the write data buffer part is written into a memory cell array of the semiconductor memory device in accordance with a corresponding one of the first address signals latched in the address latch&comparator part.

23. The semiconductor memory device as claimed in claim 1, further comprising an interface common to data input and output operations.

24. The semiconductor memory device as claimed in claim 1, further comprising a separate interface separately provided to data input and output operations.

25. The semiconductor memory device as claimed in claim 15, further comprising an interface common to data input and output operations.

26. The semiconductor memory device as claimed in claim 15, further comprising a separate interface separately provided to data input and output operations.

27. The semiconductor memory device as claimed in claim 1, further comprising a plurality of banks, each including the respective, write data buffer part.

28. The semiconductor memory device as claimed in claim 15, further comprising a plurality of banks, each including the respective, write data buffer part.

* * * * *